(12) United States Patent
Liu

(10) Patent No.: US 10,784,863 B2
(45) Date of Patent: Sep. 22, 2020

(54) SELF-POWERED WIRELESS SWITCH AND APPLICATION THEREOF

(71) Applicant: YuanFang Liu, Shenzhen (CN)

(72) Inventor: YuanFang Liu, Shenzhen (CN)

( * ) Notice: Subject to any disclaimer, the term of this patent is extended or adjusted under 35 U.S.C. 154(b) by 196 days.

(21) Appl. No.: 15/577,756

(22) PCT Filed: Aug. 18, 2015

(86) PCT No.: PCT/CN2015/087311
§ 371 (c)(1),
(2) Date: Nov. 28, 2017

(87) PCT Pub. No.: WO2016/192209
PCT Pub. Date: Dec. 8, 2016

(65) Prior Publication Data
US 2018/0131371 A1   May 10, 2018

(30) Foreign Application Priority Data

May 29, 2015 (CN) .......................... 2015 1 0287591

(51) Int. Cl.
*H03K 17/94*   (2006.01)
*H02K 35/02*   (2006.01)
(Continued)

(52) U.S. Cl.
CPC ............. *H03K 17/94* (2013.01); *G08C 17/00* (2013.01); *H02K 5/04* (2013.01); *H02K 35/02* (2013.01)

(58) Field of Classification Search
CPC ......... H02K 35/02; H02K 5/04; H03K 17/094
(Continued)

(56) References Cited

U.S. PATENT DOCUMENTS

| 8,228,151 | B2 * | 7/2012 | Schmidt | ................. | H02K 35/04 |
| | | | | | 310/12.12 |
| 2008/0315595 | A1 * | 12/2008 | Bataille | .................. | H02K 35/02 |
| | | | | | 290/1 R |

(Continued)

FOREIGN PATENT DOCUMENTS

WO   WO 2015/027803   *   3/2015   ............... H02K 5/04

OTHER PUBLICATIONS

Machine translation for WO 2015027803 A1 Sep. 27, 2019.*

*Primary Examiner* — Hanh N Nguyen
(74) *Attorney, Agent, or Firm* — Raymond Y. Chan David and Raymond Patent Firm

(57) ABSTRACT

A self-powered wireless switch includes at least one micro generator and a control panel for transmitting wireless control signals. The micro generator includes a magnet assembly and a coil assembly which are arranged to be moved relatively to one another to generate an induced current within the coil assembly; the coil assembly including an iron core and a wire winding around the outside of the iron core to form a magnetic coil; the magnet assembly including a permanent magnet and magnet conductive plates arranged at two sides of the opposite magnetic poles of the permanent magnet. The self-powered wireless switch enables the magnetic assembly and the coil assembly to move relatively to one another and converts the mechanical energy to electricity, thereby achieving self-power generation and providing electricity to the control panel for transmission of the wireless control signals.

17 Claims, 41 Drawing Sheets

(51) Int. Cl.
*G08C 17/00* (2006.01)
*H02K 5/04* (2006.01)

(58) Field of Classification Search
USPC .............................. 310/12.01, 12.04, 12.19
See application file for complete search history.

(56) References Cited

U.S. PATENT DOCUMENTS

| | | | | |
|---|---|---|---|---|
| 2013/0093540 | A1* | 4/2013 | Ruff | E04B 1/21 335/4 |
| 2013/0285480 | A1* | 10/2013 | Ruff | H02K 7/1876 310/12.12 |
| 2015/0137626 | A1* | 5/2015 | Cheng | H02K 35/02 310/12.26 |

* cited by examiner

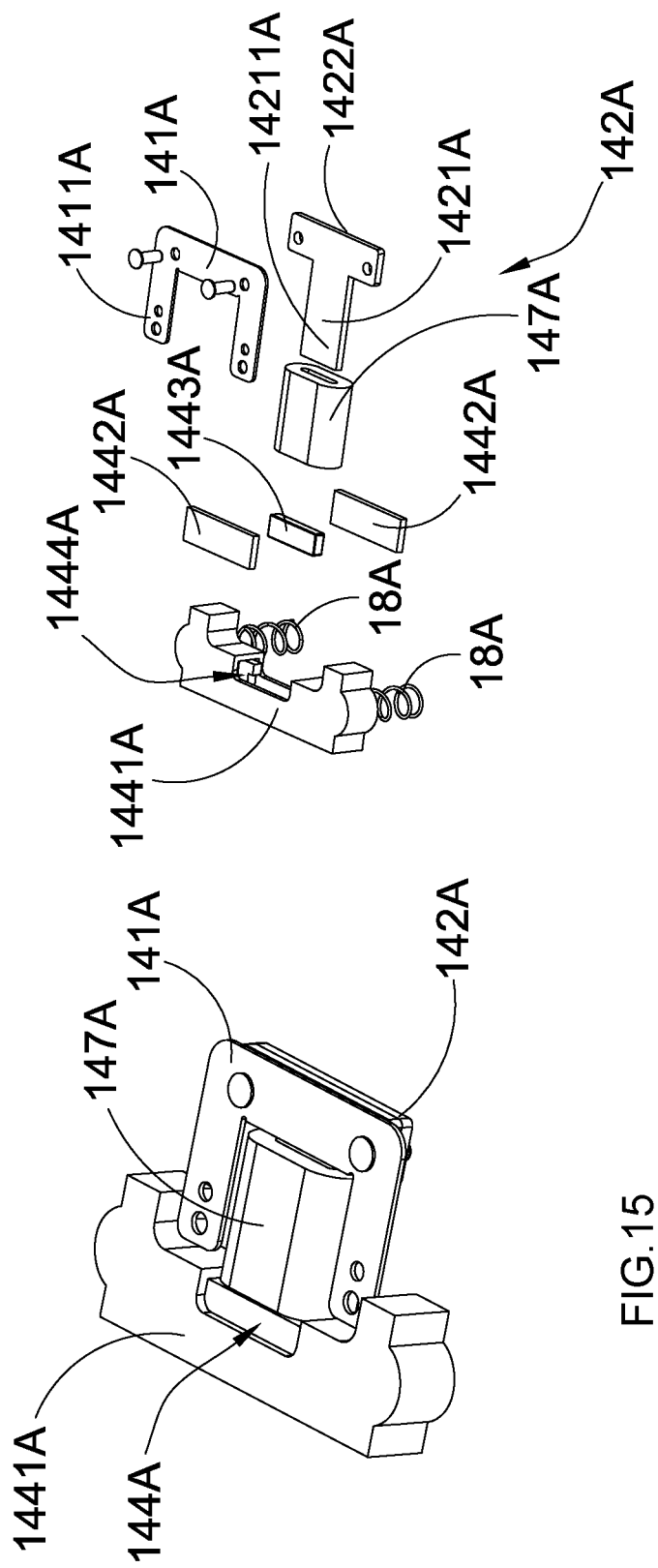

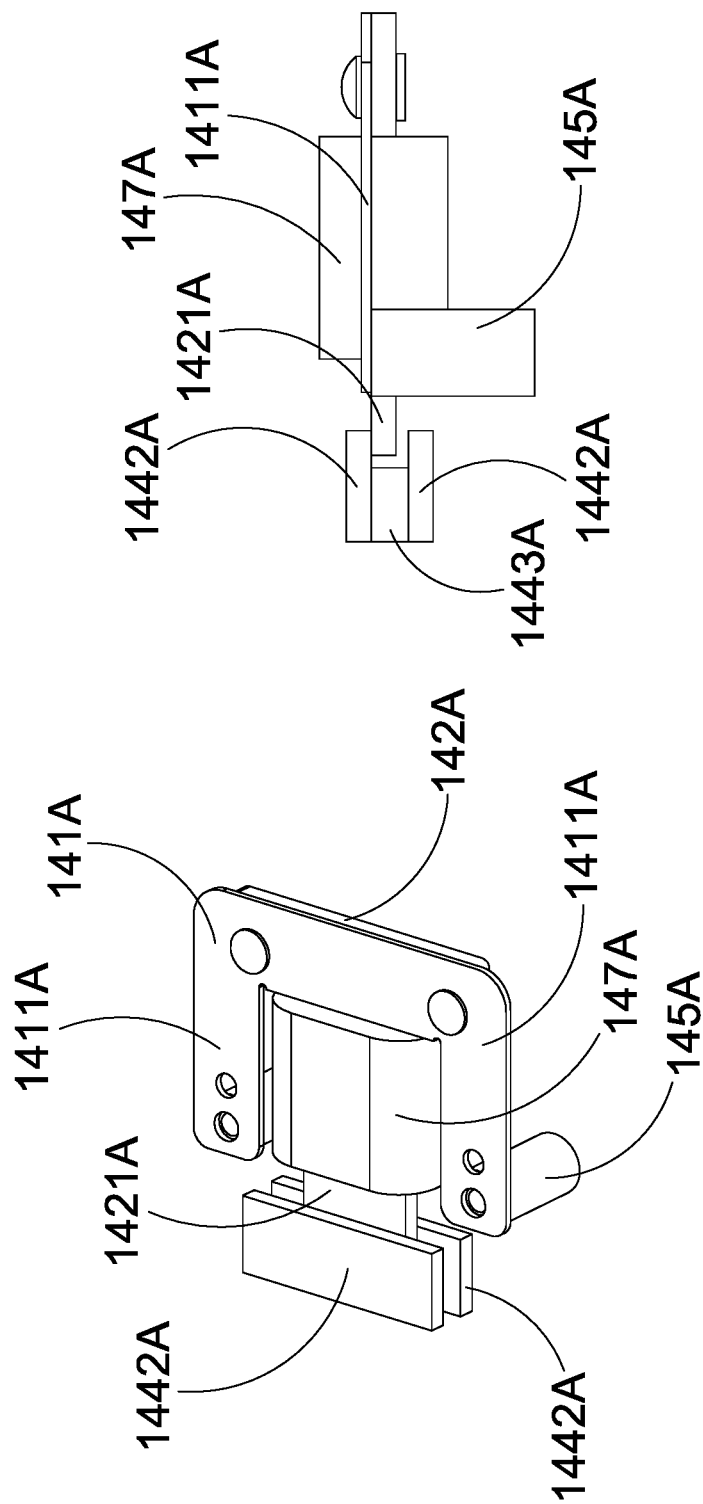

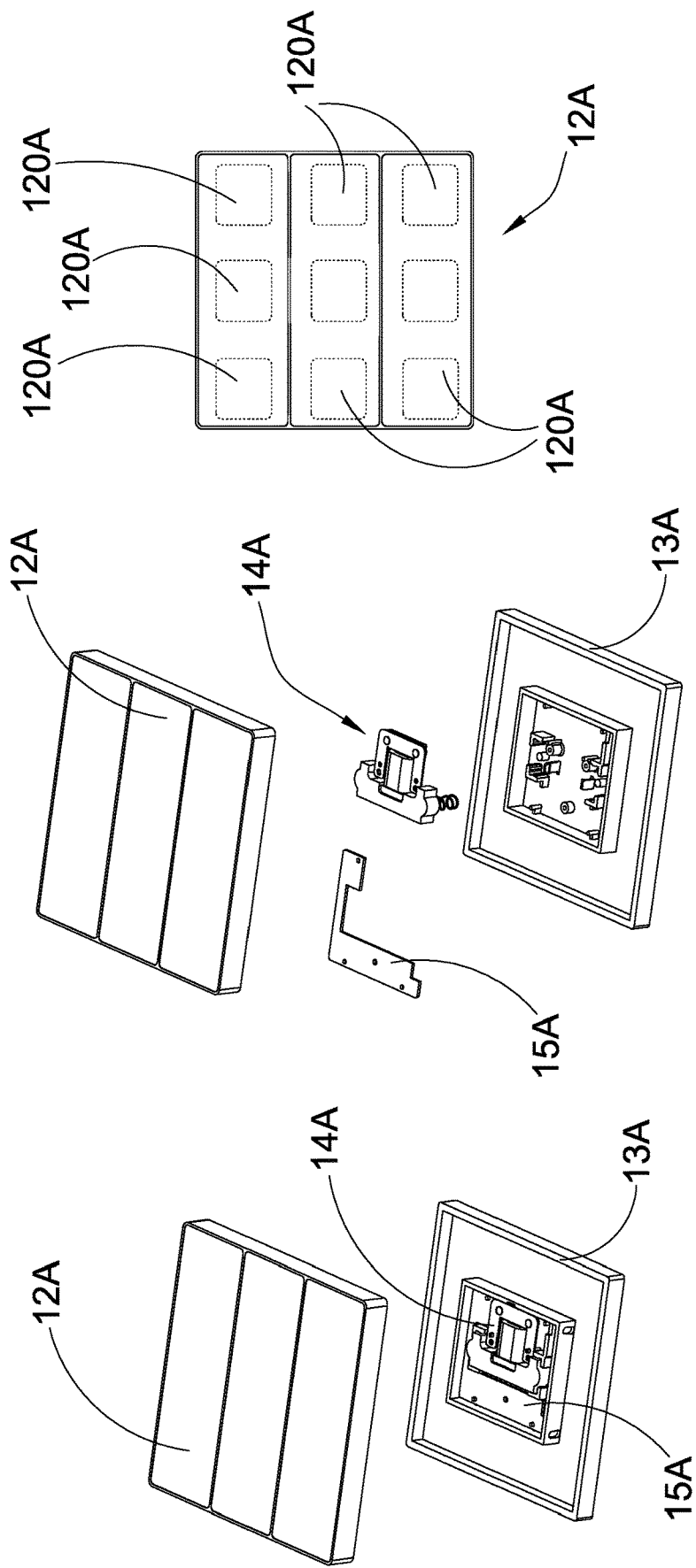

_US 10,784,863 B2_

SELF-POWERED WIRELESS SWITCH AND APPLICATION THEREOF

CROSS-REFERENCE TO RELATED APPLICATIONS

This is a non-provisional application that claims the benefit of priority under 35 U.S.C. § 371 to international application number PCT/CN2015/087311, international filing date Aug. 18, 2015, wherein the entire content of which is expressly incorporated herein by reference.

BACKGROUND OF THE PRESENT INVENTION

Field of Invention

The present invention relates to a wireless switch, and more particular to a self-powered wireless switch.

Description of Related Arts

With the advent of high technology, the electronic industry has experienced very significant growth that that wireless controllers are commonly utilized in different electronic controlling devices. Even though such wireless controllers bring us convenience, thousands of conventional wireless controllers will pollute our environment and waste our resources.

Firstly, the wireless controller must be powered by batteries as its power source. Therefore, the user must frequently replace the old batteries with new batteries after a period of time usage. The operating cost for the wireless controller will be significantly increased by the batteries. Since most of the batteries are disposable, the old batteries will pollute our environment. Accordingly, land pollution is aggravated because of the wasted electronic components, such that many countries issue strict environmental regulations for those electronic wastes.

Accordingly, most indoor illuminating devices generally comprise a wall controlling switch electrically connected to an illuminator via an electrical wire for controlling the illuminator in an on-and-off manner. In particular, the wiring configuration must be pre-designed in a floor plan of the building to illustrate the exact location of the controlling switch to run the electrical wire from the illuminator to the controlling switch. In addition, a switch box, PVC wire sleeve, and electric wires must be embedded into the wall by pre-forming a wire running groove in the wall. The installation not only takes times but also wastes lots of different materials. More importantly, it is impossible to re-locate the controlling switch. Otherwise, the wall must be damaged to form another wire running groove for the new electrical wire. Safety concerns are other issues that the switch box and the PVC wire sleeve must provide moisture prevention and explosion protection.

In order to solve the above problems, the indoor illuminating device incorporates with a wireless switch wirelessly connected to the illuminator for controlling the illuminator in an on-and-off manner. However, the existing wireless switch has several drawbacks. (1) The users are not used to recharge the wireless switch via an external power outlet, such as a wall outlet, for operating the illuminator. (2) It is a hassle to find the wireless switch as it is considered as a portable device to be stored at any location of the building. (3) When the wireless switch is designed to be affixed on the wall structure, the wireless switch must be powered by batteries. Therefore, the user must replace the batteries frequently after a period of time. In particular, the user must detach the wireless switch from the wall and disassemble the outer casing of the wireless switch for cleaning and replacing the batteries. Otherwise, the battery acid will leak out of the battery to pollute the environment and to shorten the service life span of the battery. As result, the wireless switch cannot be widely used due to the above drawbacks.

SUMMARY OF THE PRESENT INVENTION

The invention is advantageous in that it provides a self-powered wireless switch which is reliable, safe, and convenient with a remote switch, and can be widely used in everyday life.

Another object of the present invention is to provide a self-powered wireless switch, wherein when the switch panel of the self-powered panel is being pressed, the mechanical energy of the movement of the switch panel will transform into electrical energy by the micro generator for powering the control panel to work, such that the control panel further controls the electronic device in a wireless manner.

Another object of the present invention is to provide a self-powered wireless switch, wherein in the power-generation of the micro generator, the coil core of the micro generator is contacted with the magnet conductive panels having opposite magnetic poles in an alternating manner, such that the magnetic induction line penetrating through the coil core is oppositely changed and an induced current is generated via the magnetic coil of the coil core. The induced current is rectified to a voltage output, such that the mechanical energy is transformed into electrical energy in an magnetic induction manner for powering the control panel to operate.

Another object of the present invention is to provide a self-powered wireless switch, wherein in an embodiment, the switch panel is a suspended panel which is suspendedly supported at an non-operational state and when the switch panel is pressed to move and at the end of the pressing action, the switch panel is actuated to restore to its initial non-operational state because of the restoring function provided by the resilient structure of the self-powered wireless switch.

Another object of the present invention is to provide a self-powered wireless switch, wherein in an embodiment, the magnet assembly is coupled to a retractable resilient member, such that in one power-generation operation, the resilient member is deformed to restore to its original form, such that the magnet assembly and the switch panel restore to their original positions that the switch panel is suspendedly supported.

Another object of the present invention is to provide a self-powered wireless switch, wherein the coil core is coupled to the restorable resilient member, such that in one power-generation operation, the resilient member is deformed and restored to its original form to move the coil core and to contact the coil core with the magnet conductive panels having opposite magnetic poles in an alternating manner for complete the self-powering operation.

Another object of the present invention is to provide a self-powered wireless switch, wherein in an embodiment, the self-powered wireless switch is able to provide a self-powered wireless switch module assembly which can be secondary developed to incorporate with outer casing and switch panels in different appearance so as to create self-powered wireless switch with special characteristics.

Another object of the present invention is to provide a self-powered wireless switch, wherein in an embodiment, the self-powered switch module assembly comprises one or more swinging arms coupled to the cover panel of the switch panel. When the cover panel is pressed, the self-powered wireless switch is activated to start power-generation operation via the swinging arm, such that the self-powered wireless switch module assembly is able to be incorporated with different pressing cover panels.

Another object of the present invention is to provide a self-powered wireless switch, wherein in an embodiment, the swinging arm is coupled to the coil core via a resilient member, when the swinging arm is moved, the resilient member is being deformed and then restored to contact the coil core with the magnet conductive panels having opposite magnetic poles respectively for power generation.

Additional advantages and features of the invention will become apparent from the description which follows, and may be realized by means of the instrumentalities and combinations particular point out in the appended claims.

According to the present invention, the foregoing and other objects and advantages are attained by a self-powered wireless switch, comprising: at least a micro generator and a control panel operatively linked to the micro generator for generating a wireless control signal to an electronic device. The micro generator comprises a magnet assembly and a coil assembly which are arranged to be moved in relation to each other to generate an induced current by the coil assembly. The coil assembly comprises a coil core and a coil wire wound around the coil core to form a magnetic coil. The magnet assembly is arranged at one side of the coil assembly to align with the centerline of the coil assembly. The magnet assembly comprises a permanent magnet and two magnet conductive panels provided at two sides of the opposite magnetic poles of the permanent magnet respectively.

Accordingly, the self-powered wireless switch further comprises a supporting panel, wherein the micro generator is supported by the supporting panel. Two sliding panels are symmetrically and spacedly extended from the supporting panel, wherein each of the sliding panels has a sliding groove formed thereat. Two sides of the magnet assembly are engaged with the sliding grooves of the sliding panels in a slidably movable manner.

Preferably, one end of the coil core is extended out of the coil wire to define a protrusion portion, wherein the extension portion of the coil core is contacted with the magnet conductive panels.

Accordingly, two extension portions of the magnet conductive panels are extended out of the permanent magnet to define a magnetic cavity between the extension portions. The protrusion portion of the coil core is disposed within the magnetic cavity, wherein when the magnetic assembly is moved up-and-down, the protrusion portion of the coil core can be moved within the magnetic cavity to contact with inner sides of the extension portions of the magnet conductive panels in an alternating manner.

Accordingly, the magnet assembly further comprises an outer supportive frame having an interior cavity, wherein the permanent magnet and the magnet conductive panels are supported within the interior cavity of the outer supportive frame. The outer supportive frame further has two sliding members extended from two sides thereof to slidably engage with the sliding grooves of the sliding panels respectively.

Accordingly, the supporting panel further has a protruded platform, wherein a mid-portion of the switch panel is pivotally coupled at the protruded platform of the supporting panel, so as to pivotally couple the switch panel on the supporting panel. The magnet assembly is coupled at one end of the switch panel and the coil assembly is affixed at the supporting panel.

Accordingly, the switch panel further has two engaging arms extended from two sides thereof and two engaging clips integrally formed at two free ends of the engaging arms respectively. The engaging clips are detachably engaged with the outer supportive frame.

Accordingly, the switch panel has a panel cavity formed at a bottom side thereof, wherein the magnet assembly is coupled at the inner wall of the panel cavity of the switch panel.

Accordingly, a resilient element has one end coupled at the supporting panel and another end coupled at the coil core.

Accordingly, the coil core, having a W-shape, comprises a mid core arm and two side core arms, wherein the mid core arm is spacedly located between the two side core arms. The resilient element, having a U-shape, is overlapped on the coil core. The resilient arms of the resilient element are longer than the side core arms of the coil core. The resilient arms of the resilient element are coupled at the supporting panel.

The coil core has a mid core body where the wire coil are wound therearound, a first core arm, and a second core arm, wherein the first and second core arms are oppositely and alignedly extended from the mid core body. The first core arm is pivotally coupled at the supporting panel to enable the rotation of the coil core. The second core arm is extended within the magnetic cavity. The magnet assembly is affixed on the supporting panel.

The self-powered wireless switch further comprises an outer frame formed in a ring shape to couple at the peripheral portions of the supporting panel and the switch panels.

Accordingly, three micro generators are supported at upper and lower portions of the supporting panel in an alternating manner, wherein three switch panels are coupled to the micro generators respectively and are orderly coupled at the supporting panel side-by-side.

According to another aspect of the present invention, the present invention further provides a self-powered switch comprising a control panel adapted for generating a wireless control signal; a switch panel being actuated for generating a mechanical energy; and a micro generator operatively linked to the switch panel, wherein the micro generator comprises a magnet assembly and a coil assembly which are arranged to be moved in relation to each other to transform the mechanical energy into an electrical energy for powering the control panel so as to activate the control panel in a battery-less manner.

In one or more embodiment, the coil assembly comprises a coil core and a coil wound around the coil core to form a magnetic coil, wherein a protrusion portion of the coil core is extended to magnetically contact with the magnet assembly to generate an induced current via the magnetic coil.

In one or more embodiment, the magnet assembly comprises two magnet conductive panels and a permanent magnet sandwiched between the magnet conductive panels to form a magnetic cavity therebetween, wherein the protrusion portion of the coil core is extended within the magnetic cavity to magnetically contact with the magnet assembly.

In an embodiment, the coil assembly further comprises a resilient member coupled to the coil core, wherein when the coil core and the magnet assembly magnetically induced with each other, the resilient member provides an resilient force.

In an embodiment, the magnet assembly is coupled to the switch panel for transmitting the mechanical energy to the micro generator.

In an embodiment, the magnet assembly is coupled to the switch panel for transmitting the mechanical energy to the micro generator.

In an embodiment, the self-powered wireless switch further comprises a supporting panel, wherein the coil assembly is supported by the supporting panel and the switch panel is pivotally coupled at the supporting panel.

In an embodiment, the magnet assembly further comprises an outer supportive frame having an interior cavity, wherein the permanent magnet and the magnet conductive panels are supported within the inner cavity of the outer supportive frame.

In an embodiment, the magnet assembly further comprises two sliding panels symmetrically and spacedly extended from the supporting panel to form a sliding cavity between the sliding panels, wherein the outer supportive frame further has two sliding members extended from two sides thereof to slidably engage with the sliding grooves of the sliding panels of the sliding panel respectively, such that the outer supportive frame can be slid within the sliding cavity.

In an embodiment, the switch panel further comprises two engaging arms extended from two sides thereof and two engaging integrally formed at the two free ends thereof, wherein when the engaging clips are detachably engaged with the outer supportive frame, the magnet assembly is supported within the panel cavity of the switch panel at a position between the two engaging arms.

In an embodiment, the coil core, having a W-shape, comprises a mid core arm and two side core arms, wherein the magnetic coil is arranged at the mid core arm and the protrusion portion is defined on a free end of the mid core arm.

In an embodiment, the resilient member, having a U-shape, comprises two resilient arms being deformed to generate a resilient force to the coil core.

In an embodiment, the self-powered wireless switch further comprises a supporting panel and a resilient member coupled at the supporting panel to support the magnet assembly, wherein the coil assembly is supported at the supporting panel, the switch panel is movably coupled at the supporting panel to move the magnet assembly for transmitting the mechanical energy to the micro generator.

In an embodiment, the self-powered wireless switch further comprises a control module operatively linked to the control panel to generate different control commands, wherein the control module comprises an activator embodied into the switch panel, such that when the switch panel is pressed to activate one of the activators, the control panel generates the wireless control signal via the control command.

In an embodiment, the switch panel has one or more actuation areas formed on the outer surface thereof, wherein the activators are located at the actuation areas below the outer surface of the switch panel.

In an embodiment, the coil core, having a T-shape, comprises a core arm, wherein the magnetic coil is formed at the core arm and the protrusion portion is located at a free end of the core arm.

In an embodiment, the control panel comprises a signal generator for generating wireless control signal, operatively linked to the micro generator at a power storage thereof, and a rectifier operatively linked to the power storage for transforming the electrical energy into an usage energy for the signal generator.

According to another aspect of the present invention, the present invention provides a self-powered wireless switch comprising: at least a micro generator, a switch panel and a control panel. The micro generator comprises a magnet assembly, a coil core, a coil assembly, and a resilient member, wherein the magnet assembly comprises a permanent magnet and two magnet conductive panels arranged at the two opposite sides of the permanent magnet to form two opposite magnetic poles thereof, wherein the magnetic coil is wound around the coil core and the resilient member is coupled to the coil core. The switch panel is operatively linked to the micro generator. The coil core is contacted to one of the magnet conductive panels, the magnetic coil is linked to the control panel, wherein when the switch panel is pressed, the switch panel is arranged to move the magnet assembly and to contact with the another magnet conductive panel via the deformation and restoring of the resilient member, such that an induced current is generated in the magnetic coil for powering and activating the control panel to generate the wireless control signal.

In an embodiment of the present invention, each of the magnet conductive panels has a protrusion portion extended out of the permanent magnet to form a magnetic cavity between the two protrusion portion, wherein the coil core comprises a core arm, and a distal end of the core arm is disposed within the magnetic cavity and arranged to contact with the inner sides of the two magnet conductive panels in an alternating manner.

In an embodiment of the present invention, the coil core further comprises a coupling arm integrally extended from a proximate end of the coil core, wherein the coupling arm is coupled to the resilient member.

In an embodiment of the present invention, the coupling arm is transversely extended from the core arm to form the coil core in T-shape.

In an embodiment of the present invention, the magnetic coil is wound around the core arm, and the magnetic coil has 150-2000 turns of coil wire, wherein a diameter of the magnetic coil wire is 0.08 mm-0.3 mm.

In an embodiment of the present invention, the resilient member is coupled to the coil core in an overlapped manner.

In an embodiment of the present invention, the resilient member is coupled with the coil core to form the resilient member as an extension portion of the coil core so as to form an overall elongated structure.

In an embodiment of the present invention, the resilient member comprises a mid-portion, and two spaced-apart resilient arms to form a U-shape, wherein the mid portion of the resilient member is coupled to the coupling arm of the coil core, and the core arm of the coil core is located between the two resilient arms, such that the magnetic coil is located between the two resilient arms.

In an embodiment of the present invention, the length of the core arm of the coil core is greater than the length of each of the two resilient arms.

In an embodiment of the present invention, the switch panel comprises a base panel and a pusher arm provided at the bottom side of the base panel, wherein when the base panel is pressed, the pusher arm presses the magnet assembly to actuate the magnet assembly to move.

In an embodiment of the present invention, the base panel comprises a base panel body, wherein the pusher arm is integrally extended from the bottom side of the base panel body from a mid-portion thereof.

In an embodiment of the present invention, the magnet assembly further comprises a plastic outer supportive frame to receive the permanent magnet and the magnet conductive panels, wherein the pusher arm is biased against the outer supportive frame.

In an embodiment of the present invention, the self-powered wireless switch further comprises a supporting panel, wherein the switch panel is movably coupled at the supporting panel for generating mechanical energy, wherein the micro generator is arranged within the receiving cavity formed between the switch panel and the supporting panel.

In an embodiment of the present invention, the supporting panel further comprising a base panel body and a blocking portion extended from the base panel body, wherein the base panel of the switch panel further comprises an engaging portion extended from the bottom side of the base panel body, wherein the blocking portion is engaged with the engaging portion, such that the switch panel is able to be pivotally moved in relation to the supporting panel.

In an embodiment of the present invention, the blocking portion of the supporting panel has a blocking portion outwardly and protrudedly extended therefrom, wherein the engaging portion of the base panel of the switch panel has a engaging clip inwardly and protrudedly extended therefrom, wherein the engaging clip is engaged at the blocking protrusion, such that the engaging portion of the switch panel is moved at the outer side of the blocking portion.

In an embodiment of the present invention, In an embodiment of the present invention, the blocking portion of the supporting panel has a blocking portion outwardly and protrudedly extended therefrom, wherein the engaging portion of the base panel of the switch panel has a engaging clip inwardly and protrudedly extended therefrom, wherein the engaging clip is engaged at the blocking protrusion, such that the engaging portion of the switch panel is moved at the inner side of the blocking portion.

In an embodiment of the present invention, the blocking portion of the supporting panel has a plurality of positioning holes and a plurality of the positioning protrusion is formed at the engaging portion of the switch panel, wherein the positioning protrusions are located at the positioning holes and able to side at the positioning holes.

In an embodiment of the present invention, the blocking portion of the supporting panel has a plurality of positioning protrusions and a plurality of the positioning slots is formed at the engaging portion of the switch panel, wherein the positioning protrusions are located at the positioning holes and able to side at the positioning holes.

In an embodiment of the present invention, the self-powered wireless switch further comprises an elastic member, wherein the magnet assembly is supported at the elastic member, wherein when the switch panel is pressed, the magnet assembly is biased against the elastic member to deform the elastic member, and the elastic member restores to return the magnet assembly and the switch panel back to initial form when the user finishes the pressing action, such that the switch panel forms an suspended panel.

In an embodiment of the present invention, the self-powered wireless switch further comprises a resilient member supported between the magnet assembly and the supporting panel wherein the magnet assembly is supported by the resilient member, wherein when the switch panel is pressed, the magnet assembly is biased against the resilient member to deform the resilient member, and the resilient member restores to return the magnet assembly and the switch panel back to initial form when the user finishes the pressing action, such that the switch panel forms an suspended panel.

In an embodiment of the present invention, the magnet assembly further comprises a plastic outer supportive frame for receiving the permanent magnet and the magnet conductive panels, wherein the resilient member is embodied as a compression spring, and two ends thereof is coupled at the outer supportive frame and the supporting panel respectively.

In an embodiment of the present invention, the self-powered wireless switch further comprises a supporting panel, wherein the switch panel is movably mounted at the supporting panel for generating mechanical energy, wherein the micro generator is received within the receiving cavity formed between the switch panel and the supporting panel, wherein the supporting panel comprises a base panel body and a retaining post extended from the base panel body, wherein the two resilient arms of the resilient member is coupled to the retaining posts.

In an embodiment of the present invention, wherein in the non-operational state, the coil core is contacted with one of the magnet conductive panel at the bottom side of the magnet assembly, and when the switch panel is pressed, the resilient member is deformed and restored to move the coil core from the lower magnet conductive panel to contact with another magnet conductive panel at the top side of the magnet assembly.

In an embodiment of the present invention, the control panel comprises a MCU, operatively linked to a power storage, a rectifier and a signal generator of the control panel, wherein the power storage stores the electrical energy of the induced current generated by the magnetic coil to power the signal generator after being regulated by the rectifier, and the signal generator is arranged to transmit a wireless control signal.

In an embodiment of the present invention, the switch panel further comprises a cover panel arranged at the top side of the base panel, wherein at least a control module is located between the base panel and the cover panel and arranged to generate a pressing command operatively linked to the control panel, wherein when the cover panel is pressed, the circuit for generating the pressing command in the control module is activated, such that the control panel further finish transmitting the wireless control signal based on the pressing command.

In an embodiment of the present invention, the control module comprises one or more activators and a control circuit board, wherein the control circuit board has one or more set of contact electrodes and each set of contact electrodes comprises two untouched contact electrodes, wherein one or more actuation areas is formed on the cover panel corresponding to the activators, wherein when one of the actuation areas is pressed, the circuit between the two contact electrodes corresponding to the activator is switched on.

In an embodiment of the present invention, the cover panel can be made of flexible non-conductive material and the activators are made of conductive material.

In an embodiment of the present invention, the cove panel is made of flexible glass and the activators are made of conductive rubber material.

According to another aspect of the present invention, the present invention further provides a suspended switch panel for a switch, wherein the switch comprises a supporting panel and a resilient member, wherein the suspended switch panel is pivotally coupled at the supporting panel and at a non-operational state, the suspended switch panel is suspendedly and balancedly supported via the resilient supporting force provided by the resilient member, wherein when the suspended switch panel is pressed by a user, the resilient member is deformed and at the end of the pressing operation of the user, the resilient restores to move the suspended switch panel to the non-operational state via the restoring function provided by the resilient member.

In an embodiment of the present invention, the resilient member is embodied as a compression spring, wherein when the suspended switch panel is pressed by the user, the compression spring is compressed to store resilient potential energy, and when the user finishes the pressing operation, the compression resilient restores back to its original state, such that the suspended switch panel returns to its non-operational state.

In an embodiment of the present invention, the switch is a self-powered wireless switch which further comprises a micro generator, wherein the micro generator comprise a magnet assembly and a coil assembly which are capable of which are arranged to be moved in relation to the coil assembly, wherein the resilient member is mounted between the magnet assembly and the supporting panel.

In an embodiment of the present invention, the suspended switch panel is engaged with the supporting panel via a blocking mechanism formed by correspondingly engaging clips and blocking protrusions.

In an embodiment of the present invention, the suspended switch panel is slidably engaged with the supporting panel via the corresponding positioning protrusion and positioning holes.

In an embodiment of the present invention, the switch further comprises a control panel for generating wireless control signal, wherein the magnet assembly comprises a permanent magnet and two magnet conductive panels arranged at the two opposite sides of the permanent magnet to form two opposite magnetic poles thereof, wherein coil assembly further comprises a coil core and a magnetic coil winding around the coil core, wherein the micro generator further comprises a resilient member coupled to the coil core, wherein the coil core is contacted with one of the magnet conductive panels the and the magnetic coil is electrically linked to the control panel, wherein when the suspended switch panel is pressed, the suspended switch panel push the magnet assembly to move and to contact the coil core with another magnet conductive panel via the deformation and restoring of the resilient member, such that an induced current is generated in the magnetic coil for powering the control panel to electrically actuate the control panel to generate wireless control signal.

In an embodiment of the present invention, the suspended switch panel comprises a base panel and a pusher arm formed at the bottom side of the base panel, wherein when the base panel is being pressed, the pusher arm drive the magnet assembly to move.

In an embodiment of the present invention, the base panel comprises a base panel body, wherein the pusher arm is integrally extended from a bottom side of the base panel body at a mid-portion thereof.

In an embodiment of the present invention, the magnet assembly further comprises a plastic outer supportive frame for receiving the permanent magnet and the magnet conductive panels, wherein the pusher arm is biased against the outer supportive frame.

In an embodiment of the present invention, the resilient member is arranged between the outer supportive frame and the supporting panel.

According to another aspect of the present invention, the present invention provides a self-powered wireless switch comprising: at least a micro generator which comprises a magnet assembly, a coil core, a magnetic coil, a resilient member, and a swinging arm, wherein the magnet assembly comprises a permanent magnet and two magnet conductive panels arranged at the two opposite sides of the permanent magnet to form two opposite magnetic poles thereof, wherein the magnetic coil is wound around the coil core and the swinging arm is coupled to the resilient member; at least a switch panel operatively linked with the swinging arm; and a control panel, wherein the coil core is contacted with one of the magnet conductive panels the and the magnetic coil is electrically linked to the control panel, wherein when the suspended switch panel is pressed, the suspended switch panel push the magnet assembly to move and to contact the coil core with another magnet conductive panel via the deformation and restoring of the resilient member, such that an induced current is generated in the magnetic coil for powering the control panel to electrically actuate the control panel to generate wireless control signal.

In an embodiment of the present invention, each of the two magnet conductive panels of the magnet assembly has a protrusion portion extended out of the permanent magnet to form a magnetic cavity between the two protrusion portion, wherein the coil core comprises a core arm, and a distal end of the core arm is disposed within the magnetic cavity to contact with the inner sides of the two magnet conductive panels in an alternating manner.

In an embodiment of the present invention, the coil core further comprises a coupling arm integrally extended from a proximate end of the coil core, wherein the coupling arm is coupled to the resilient member.

In an embodiment of the present invention, the coupling arm is transversely extended from the core arm to form the coil core in T-shape.

In an embodiment of the present invention, the magnetic coil is wound around the core arm, and the magnetic coil has 150-2000 turns of coil wire, wherein a diameter of the magnetic coil wire is 0.08 mm-0.3 mm.

In an embodiment of the present invention, the resilient member is coupled to the coil core in an overlapped manner.

In an embodiment of the present invention, the resilient member is coupled with the coil core to form the resilient member as an extension portion of the coil core so as to form an overall elongated structure.

In an embodiment of the present invention, the resilient member comprises a mid resilient arm and two mounting arms extended from two ends of the mid resilient arm, wherein one of the mounting arms is coupled to the coil core and the other mounting arm is coupled to the swinging arm.

In an embodiment of the present invention, the two mounting arms are transversely extended from the mid resilient arms at the two ends thereof to form the resilient member in H-shape.

In an embodiment of the present invention, the self-powered wireless switch further comprises a supporting panel and a top cover, wherein the top cover comprises at least a cover member mounted at the supporting panel to form a housing to house the micro generator; wherein an opening is formed at one end of the housing for allowing the switch panel to be coupled with the swinging arm through the opening.

In an embodiment of the present invention, the switch panel comprises at least a base panel, wherein each base panel comprises a base panel body forming the pressing panel and an engaging portion extended from the bottom side of the base panel body, wherein the engaging portion are integrally formed with the swinging arm.

In an embodiment of the present invention, the switch panel comprises at least a base panel, wherein each base panel comprises a base panel body forming the pressing panel and an engaging portion extended from the bottom side of the base panel body, wherein the engaging portion is detachably coupled with the swinging arm.

In an embodiment of the present invention, the engaging portion of the switch panel comprises a positioning portion having a positioning groove, wherein one end of the resilient member away from the swinging arm is detachably located at the positioning portion.

In an embodiment of the present invention, a positioning groove is formed at the end of the resilient member away from the swinging arm, wherein one end portion of the engaging portion of the switch panel is located at the positioning groove.

In an embodiment of the present invention, the cover member comprises a retaining shaft protrudedly extended from the cover body at the two sides thereof, wherein the switch panel further comprises a mounting portion, having a mounting hole, extended from the base panel body at two sides thereof, wherein the retaining shaft is mounted at the mounting hole for allowing the base panel movably mounted at the cover member.

In an embodiment of the present invention, a mounting hole is formed at a mid-portion of the cover member at two sides thereof, wherein the switch panel further comprises a mounting portion having a retaining shaft, wherein the retaining shaft is mounted at the mounting hole for allowing the base panel movably mounted at the cover member.

In an embodiment of the present invention, the coil core further comprises a core cover, wherein the core cover is sleeved at the core arm of the coil core, wherein the supporting panel comprises a base panel body and at least two posts spacedly extended from the base panel body, wherein the core cover is movably mounted between each of the two posts.

In an embodiment of the present invention, each post has a retention slot, and the core panel further comprises a retention shaft, wherein the retention shaft is slidably engaged at the retention slot.

In an embodiment of the present invention, the magnet assembly further comprises an outer supportive frame, wherein the outer supportive frame is arranged to receive the magnet assembly, and the outer supportive frame is mounted at the supporting panel.

In an embodiment of the present invention, the self-powered wireless switch further comprises a coil frame sleeved at the core arm of the coil core, wherein the core arm is pivotally coupled at the coil frame and the magnetic coil is wound around the coil frame.

In an embodiment of the present invention, the coil frame and the outer supportive frame of the magnet assembly is coupled with each other or integrally formed with each other.

In an embodiment of the present invention, the supporting panel further comprises a base panel body and a pivot portion protrudedly extended from the base panel body, wherein the pivot portion is located between each two posts and arranged to support the core cover, wherein the coil core is pivotally moved with respect to the pivot portion to contact the two magnet conductive panels in an alternating manner.

In an embodiment of the present invention, the control panel comprises a MCU, operatively linked to a power storage, a rectifier and a signal generator of the control panel, wherein the power storage stores the electrical energy of the induced current generated by the magnetic coil to power the signal generator after being regulated by the rectifier, and the signal generator is arranged to transmit a wireless control signal.

According to another aspect of the present invention, the present invention further provides a self-powered wireless switch module assembly adapted for detachably incorporating with a switch panel to form a self-powered wireless switch, wherein the self-powered wireless switch module assembly further comprises at least a micro generator, a housing, and a control panel. The micro generator comprises a magnet assembly, a coil core, a magnetic coil, a resilient member, and a swinging arm, wherein the magnet assembly comprises a permanent magnet and two magnet conductive panels arranged at the two opposite sides of the permanent magnet to form two opposite magnetic poles thereof, wherein the magnetic coil is wound around the coil core and the swinging arm is coupled to the resilient member. The housing is arranged to house the micro generator, wherein the housing has at least an opening formed at one end of the housing to expose the swinging arm, wherein the switch panel is adapted for being detachably coupled with the swinging arm. The coil core is contacted with one of the magnet conductive panels the and the magnetic coil is electrically linked to the control panel, wherein when the suspended switch panel is pressed, the suspended switch panel push the magnet assembly to move and to contact the coil core with another magnet conductive panel via the deformation and restoring of the resilient member, such that an induced current is generated in the magnetic coil for powering the control panel to electrically actuate the control panel to generate a wireless control signal.

In an embodiment of the present invention, the housing further comprises a supporting panel and a top cover mounted at the supporting panel, wherein the opening is formed at one end side of the top cover.

In an embodiment of the present invention, the switch panel comprises at least a base panel, wherein each base panel comprises a base panel body forming the pressing panel and an engaging portion extended from the bottom side of the base panel body, wherein the engaging portion is detachably couple with the swinging arm.

In an embodiment of the present invention, the engaging portion of the switch panel comprises a positioning portion having a positioning groove, wherein one end of the resilient member away from the swinging arm is detachably located at the positioning portion.

In an embodiment of the present invention, a positioning groove is formed at the end of the resilient member away from the swinging, wherein one end portion of the engaging portion of the switch panel is located at the positioning groove.

In an embodiment of the present invention, the cover member comprises a retaining shaft protrudedly extended from the cover body at the two sides thereof, wherein the switch panel further comprises a mounting portion, having a mounting hole, extended from the base panel body at two sides thereof, wherein the retaining shaft is mounted at the mounting hole for allowing the base panel movably mounted at the cover member.

In an embodiment of the present invention, a mounting hole is formed at a mid-portion of the cover member at two sides thereof, wherein the switch panel further comprises a mounting portion having a retaining shaft, wherein the retaining shaft is mounted at the mounting hole for allowing the base panel movably mounted at the cover member.

In an embodiment of the present invention, each of the two magnet conductive panels of the magnet assembly has a protrusion portion extended out of the permanent magnet to form a magnetic cavity between the two protrusion portion, wherein the coil core comprises a core arm, and a distal end of the core arm is disposed within the magnetic cavity to contact with the inner sides of the two magnet conductive panels in an alternating manner.

In an embodiment of the present invention, the coil core has a T-shape, the resilient member has a H-shape, wherein the resilient member is arranged between the coil core and the swinging arm.

In an embodiment of the present invention, the supporting panel further comprises a base panel body and a pivot portion protrudedly extended from the base panel body, wherein the coil core is pivotally moved with respect to the pivot portion to contact the two magnet conductive panels in an alternating manner.

In an embodiment of the present invention, the supporting panel further comprises two posts located at the pivot portion and extended from the base panel body, wherein the coil core further comprises a core cover, wherein the core cover is slidably retained between the two posts.

According to another aspect of the present invention, the present invention provides a self-powered wireless switch comprising at least a micro generator, at least a switch panel, and a control panel. The micro generator comprises a magnet assembly, a coil core, a magnetic coil, a resilient member, and a swinging arm and a pivot arrangement, wherein the magnet assembly comprises a permanent magnet and two magnet conductive panels arranged at the two opposite sides of the permanent magnet to form two opposite magnetic poles thereof, wherein the magnetic coil is wound around the coil core and the swinging arm is coupled to the resilient member, wherein an opening is formed at the pivot arrangement for allowing the coil core to pass through so as to contact with one of the magnet conductive panels, wherein the pivot arrangement provides two swinging pivot point for the coil core at two sides of the opening The switch panel is operatively linked with the swinging arm. The coil core is contacted with one of the magnet conductive panels the and the magnetic coil is electrically linked to the control panel, wherein when the suspended switch panel is pressed, the suspended switch panel push the magnet assembly to move and to contact the coil core with another magnet conductive panel via the deformation and restoring of the resilient member, such that an induced current is generated in the magnetic coil for powering the control panel to electrically actuate the control panel to generate wireless control signal.

In an embodiment of the present invention, the pivot arrangement comprises a first pivot member and a second pivot member spacedly arranged between the first pivot member to form the opening therebetween, wherein the first and second pivot members are located at the opposite sides of the coil core to provide two swinging pivot point.

In an embodiment of the present invention, the pivot arrangement comprises a first and a second magnet conductive arms transversely extended from the first and second pivot members respectively, wherein the magnet assembly is arranged between the first and second magnet conductive arms.

In an embodiment of the present invention, the pivot arrangement comprises a first and a second magnet conductive arm transversely extended from the first and second pivot members respectively, wherein the two magnet conductive panels are integrally formed with the first and second magnet conductive arms.

In an embodiment of the present invention, the first pivot member and the first magnet conductive arm form a first pivot unit made of iron core material, and the second pivot member and the second magnet conductive arm form a second pivot unit made of iron core material, wherein the first and the second magnet conductive arms further provide a function of magnet conduction.

According to another aspect of the present invention, the present invention provides a method for controlling an electronic device via a self-powered wireless switch, wherein the self-powered switch comprises a micro generator comprising a magnet assembly and a coil assembly, wherein the magnet assembly comprises a permanent magnet and a first and second magnet conductive panel, having opposite magnetic poles, located at the two sides of the permanent magnet, wherein the coil assembly comprises a coil core, a magnetic coil wound at the core arm of the coil core, and a resilient member affixed to the coil core, wherein the method comprises the following steps:

(a) in responsive to a pressing action applied on the base panel of the switch panel by the user, actuating the base panel to move the pusher arm, wherein the pusher arm actuates the magnet assembly to move and the coil core is moved by the first magnet conductive panel via a magnetic attraction force formed therebetween, such that the resilient member is bent and deformed to store the resilient potential energy and generate an opposite resilient force.

(b) when the rebounding force is greater than the magnetic attraction force between the upper first magnet conductive panel and the coil core, restoring the resilient member to its original form to actuate the coil core to detach from the first magnet conductive panel and to contact with the lower second magnet conductive panel, such that the magnetic induction line penetrating through the coil core is oppositely changed and the magnetic coil generates an induced current correspondingly; and (c) transmitting a control signal by the wireless signal generator of the control panel powered by the induced current after being stored and regulated, to further control the pre-programmed operation of the electronic device.

In an embodiment of the present invention, in the step (a) of actuating the magnet assembly to move, the method further comprises a step of acting on the resilient member by the magnet assembly to deform the resilient member, such that when the user finishes pressing the switch panel, the resilient member restores to its original position to drive the magnet assembly and the switch panel back to its non-operational state In an embodiment of the present invention, in the step (a), the resilient member is embodied as a compression spring, wherein magnet assembly presses the resilient member to compress the resilient member for storing resilient potential energy, such that when the user finishes pressing the switch panel, the resilient member restores to its original position to drive the magnet assembly and the switch panel back to its non-operational state.

In an embodiment of the present invention, the step (a) further comprises the steps of actuating the magnet assembly to move by the pusher arm integrally extended from a mid-portion of the bottom side of the base panel, or acting on the pusher arm coupled to the magnet assembly by the base panel to move the magnet assembly.

In an embodiment of the present invention, in the non-operational state, the distal end of the core arm of the coil core is contacted with the lower first magnet conductive panel, wherein the method further comprises the step of oppositely changing the magnetic induction line penetrating through the coil core, when the resilient member is restored from the deformed state thereof, and the magnet assembly is further being pressed to move the second magnet conductive panel at a position where the first magnet conductive panel is located in the non-operational state, such that the distal end of the core arm of the coil core is contacted with the second magnet conductive panel.

In an embodiment of the present invention, the step (a) further comprise a step of pivotally moving the base panel with respective to a pivot point of the blocking protrusion at the other side of the base panel, in responsive to the user's pressing action on the peripheral edge of the blocking protrusion located at one side of the base panel of the switch panel.

In an embodiment of the present invention, the step (a) further comprises a step of, in responsive to the user's pressing action at a mid-portion of the base panel, actuating the pusher arm to move via the base panel and the engaging clips at two side of the base panel to move away from the blocking protrusion.

In an embodiment of the present invention, the step (a) further comprises a step of generating the pressing command, wherein the cover panel actuates the activators to move to contact with the two spaced electrodes of the control circuit board for generating pressing command, such that the circuit is switch on via the conductors of the activators to generate pressing command.

In an embodiment of the present invention, in the step (c), the signal generator transmits the wireless control signal to the corresponding electronic device, so as to control the pre-programmed operations of the electronic device.

In an embodiment of the present invention, in the step (c), the signal generator transmit a wireless control signal to a smart CPU, wherein the smart CPU further control the pre-programmed operations of one or more corresponding electronic device.

In an embodiment of the present invention, in the step (c), the pre-programmed operations comprise of the operations of switching on and off the electronic device.

In an embodiment of the present invention, in the step (c), the pre-programmed operations comprise of the operations of setting and adjusting the parameters of the electronic device.

In an embodiment of the present invention, the electronic device is selected from one or more of an illuminator, an air conditioner, an electric fan, an electronic display device, an intelligent curtain, an intelligent door, an audio device, an electronic security device, an electronic call ambulance device and an electronic doorbell. It is appreciated that the above-listed electronic devices are examples, wherein the self-powered wireless switch can be applied in other electronic device requiring a switch in actual applications.

According to another aspect of the present invention, the present invention provides a self-powering method, wherein the method comprises the steps of:

(i) in responsive to the pressing action applied on the base panel of the switch panel by the user, actuating the base panel to move the pusher arm, wherein the pusher arm actuates the magnet assembly to move and the coil core is moved by the first magnet conductive panel via the magnetic attraction force formed therebetween, such that the resilient member is bent and deformed to store the resilient potential energy and generate an opposite resilient force; and (ii) when the rebounding force is greater than the magnetic attraction force between the upper first magnet conductive panel and the coil core, restoring the resilient member to its original form to actuate the coil core to detach from the first magnet conductive panel and to contact with the lower second magnet conductive panel, such that the magnetic induction line penetrating through the coil core is oppositely changed and the magnetic coil generates an induced current correspondingly, such that the mechanical energy generated by the switch panel is transformed into electrical energy.

In an embodiment of the present invention, the step (i) of actuating the magnet assembly to move further comprises the a step of acting on the resilient member by the magnet assembly to deform the resilient member, such that when the user finishes pressing the switch panel, the resilient member restores to its original position to drive the magnet assembly and the switch panel back to its non-operational state.

According to another aspect of the present invention, a method for controlling the electronic device via a self-powered wireless switch is illustrated, wherein the self-powered wireless switch comprises the self-powered wireless switch module assembly and one or more switch panels. The self-powered wireless switch module assembly comprises a micro generator which comprises a magnet assembly and coil assembly. The magnet assembly comprises a permanent magnet and a first and second magnet conductive panel, having opposite magnetic poles, located at the two sides of the permanent magnet. The coil assembly comprises a coil core, a magnetic coil wound around the periphery of the core arm of coil core, a resilient member affixed to the coil core, and a swinging arm affixed to the resilient member, wherein the switch panel comprises a positioning portion coupled with the swinging arm, wherein The controlling method comprises the following steps of:

(A) in responsive to the pressing action to move the base panel of the switch panel away from the top surface of the positioning portion, the movement of the positioning portion drives the swinging arm to move, such that the resilient element is deformed to generate a resilient force;

(B) when the rebounding force is greater than the magnetic attraction force between the upper first magnet conductive panel and the coil core, the resilient member restores to its original form and actuate the coil core to detach from the first magnet conductive panel and to contact with the lower second magnet conductive panel, such that the magnetic induction line penetrating through the coil core is oppositely changed and the magnetic coil generates an induced current correspondingly;

(C) transmitting a control signal by the wireless signal generator of the control panel powered by the induced current after being stored and regulated, to further control the pre-programmed operation of the electronic device;

(D) in responsive to the pressing action to move the base panel of the switch panel away from the top surface at one side adjacent to the positioning portion thereof, the movement of the positioning portion drive the swinging arm to move, such that the resilient element is bent to generate a resilient force;

(E) when the opposite resilient force is greater than the magnetic attraction force between the lower second magnet conductive panel and the coil core, the resilient member restores to its original form and actuate the coil core to detach from the second magnet conductive panel and to contact with the upper first magnet conductive panel, such that the magnetic induction line penetrating through the coil core is oppositely changed and the magnetic coil generates an induced current correspondingly; and (F) transmitting a control signal by the wireless signal generator of the control panel powered by the induced current after being stored and regulated, to further control another pre-programmed operation of the electronic device.

In an embodiment, the steps from step A to step C and step D to step E can control the on-and-off of the electronic device respectively.

In an embodiment, at the initial non-operational state, the distal end of the core arm of the coil core is contacted with the upper first magnet conductive panel. In the step B, when the resilient member is restored to its initial form from the state of being deformed towards the bottom side thereof, the distal end of the core arm of the coil core is contacted with the lower second magnet conductive panel, such that the magnetic induction line penetrating through the coil core is oppositely changed. In the step E, when the resilient member is restored to its initial form from the state of being deformed towards the upper side thereof, the distal end of the core arm of the coil core is contacted with the upper first magnet conductive panel, such that the magnetic induction line penetrating through the coil core is oppositely changed.

In an embodiment of the present invention, in the process of the selectively contacting the resilient member with the magnet conductive panels, the method further comprise the steps of rotating the coil core rotated with respect to the bottom panel protruded extended from the supporting panel at the pivot portion thereof, so as to rapidly and alternatively contact with the opposite-poled magnet conductive panels in a leverage manner, such that the magnetic coil could generate the induced current in a short period of time.

In an embodiment, the method further comprise a step of, in responsive to the pressing operation to the base panel of the switch panel, rotating the base panel of the switch panel with respect to the cover member of the self-powered wireless switch module assembly at the retaining shaft at the two sides thereof, so as to drive the positioning portion tile and lower reciprocatingly.

In an embodiment of the present invention, in the method, the signal generator transmits the wireless control signal to the corresponding electronic device, so as to control the pre-programmed operations of the electronic device.

In an embodiment of the present invention, in the method, the signal generator transmit a wireless control signal to a smart CPU, wherein the smart CPU further control the pre-programmed operations of one or more corresponding electronic device.

According to another aspect of the present invention, the present invention further provides a self-powering method, wherein the method comprises the following steps:

(I) in responsive to the pressing action on a top surface of the base panel of the switch panel at a position which is away from a positioning portion, the movement of the positioning portion drives the swinging arm to move, such that the resilient element is deformed to generate a resilient force;

(II) when the rebounding force is greater than the magnetic attraction force between the upper first magnet conductive panel and the coil core, the resilient member restores to its original form and actuate the coil core to detach from the first magnet conductive panel and to contact with the lower second magnet conductive panel, such that the magnetic induction line penetrating through the coil core is oppositely changed and the magnetic coil generates an induced current correspondingly for perform one actuation of power generation;

(III) in responsive to the pressing action on the top surface of the base panel of the switch panel at a position which is adjacent to the positioning portion, the movement of the positioning portion drives the swinging arm to move, such that the resilient element is deformed to generate a rebounding force; and (IV) when the rebounding force is greater than the magnetic attraction force between the upper first magnet conductive panel and the coil core, the resilient member restores to its original form and actuate the coil core to detach from the second magnet conductive panel and to contact with the upper first magnet conductive panel, such that the magnetic induction line penetrating through the coil core is oppositely changed and the magnetic coil generates an induced current correspondingly for perform one actuation of power generation to perform another actuation of power generation.

In an embodiment, the positing portion of the switch panel is detachably coupled with the swinging arm via the positioning portion and positioning slots thereof respectively.

In an embodiment, in the process of the selectively contacting the resilient member with the magnet conductive panels, the method further comprise the steps of rotating the coil core rotated with respect to pivot portion protruded extended from the supporting panel at the base panel body thereof, so as to rapidly and alternatively contact with the opposite-poled magnet conductive panels in a leverage manner.

According to another aspect of the present invention, a method for controlling the electronic device via the self-powered wireless switch is illustrated, wherein the self-powered wireless switch comprises the self-powered wireless switch module assembly and one or more switch panels. The self-powered wireless switch module assembly comprises a micro generator which comprises a magnet assembly and coil assembly. The magnet assembly comprises a permanent magnet and a first and second magnet conductive panel, having opposite magnetic poles, located at the two sides of the permanent magnet. The coil assembly comprises a coil core, a magnetic coil wound around the periphery of the core arm of coil core, a resilient member affixed to the coil core, a swinging arm affixed to the resilient member, and a pivot arrangement arranged around the magnet assembly and the magnetic coil, wherein the core arm penetrates the opening formed between the first and second pivot members spacedly arranged with each other. The switch panel comprises a positioning portion coupled with the swinging arm. The controlling method comprises the following steps of:

(α) in responsive to the pressing action on the top surface of the base panel of the switch panel at a position away from the positioning portion, the movement of the positioning portion drives the swinging arm to move, such that the resilient element is deformed to generate a rebounding force;

(β) when the rebounding force is greater than the magnetic attraction force between the upper first magnet conductive panel and the coil core, the resilient member restores to its original form and actuate the coil core to pivotally move with respective to first pivot member as the swinging pivot thereof in a leverage manner, such that the coil core is detached from the first magnet conductive panel and to contact with the lower second magnet conductive panel, wherein the magnetic induction line penetrating through the coil core is oppositely changed and the magnetic coil generates an induced current correspondingly;

(γ) transmitting a control signal by the wireless signal generator of the control panel powered by the induced current after being stored and regulated, to further control the pre-programmed operation of the electronic device;

(δ) in responsive to the pressing action on the top surface of the base panel of the switch panel at a position adjacent to the positioning portion thereof, the movement of the positioning portion drive the swinging arm to move, such that the resilient element is bent to generate a resilient force; and (ζ) transmitting a control signal by the wireless signal generator of the control panel powered by the induced current after being stored and regulated, to further control another pre-programmed operation of the electronic device.

According to another aspect of the present invention, the present invention further provides a self-powering method, wherein the method comprises the following steps:

in responsive to the pressing action on the top surface of the base panel of the switch panel at a position away from positioning portion, the movement of the positioning portion drives the swinging arm to move, such that the resilient element is deformed to generate a rebounding force;

when the rebounding force is greater than the magnetic attraction force between the upper first magnet conductive panel and the coil core, the resilient member restores to its original form and actuate the coil core to pivotally move with respective to first pivot member as the swinging pivot thereof in a leverage manner, such that the coil core is detached from the first magnet conductive panel and to contact with the lower second magnet conductive panel, wherein the magnetic induction line penetrating through the coil core is oppositely changed and the magnetic coil generates an induced current correspondingly;

in responsive to the pressing action on the top surface of the base panel of the switch panel at a position adjacent to the positioning portion thereof, the movement of the positioning portion drive the swinging arm to move, such that the resilient element is bent to generate a rebounding force; and when the rebounding force is greater than the magnetic attraction force between the second magnet conductive panel and the coil core, the resilient member restores to its original form and actuate the coil core to pivotally move with respective to first pivot member as the swinging pivot thereof in a leverage manner, such that the coil core is detached from the second magnet conductive panel and to contact with the upper first magnet conductive panel, wherein the magnetic induction line penetrating through the coil core is oppositely changed and the magnetic coil generates an induced current correspondingly for perform another actuation of power generation.

In an embodiment of the present invention, the method further comprises a step of conducting the magnet via the first and second magnet conductive arms of the first and second pivot member. Preferably, the first and second magnet conductive arms are located at opposite side of the magnet assembly and spacedly arranged with the two magnet conductive panels. Or the first and second magnet conductive arms are integrally formed with the two magnet conductive panels.

Comparing to the existing switch, the present invention provides the self-powered wireless switch to generate an induced current by an actuation of the switch panel to create a movement between the magnet assembly and the coil assembly. Therefore, the self-powered wireless switch can convert the mechanical energy from the switch panel to the electrical energy by the micro generator as a power supply for the control panel to transmit the wireless control signal. The present invention is reliable, safe, and convenient with a remote switch. The present invention is a battery-less self-powered unit, such that the present invention does not require any battery replacement to minimize the pollution from the battery. The present invention does not require any wall wiring structure or wire protective sleeve to minimize the material cost related to the installation. The time for installation of the present invention can be significantly shortened to reduce the installation cost thereof. The operation of the present invention is the same as that of the conventional wire type switch via the switch panel. The present invention can be widely used in everyday life.

Still further objects and advantages will become apparent from a consideration of the ensuing description and drawings.

These and other objectives, features, and advantages of the present invention will become apparent from the following detailed description, the accompanying drawings, and the appended claims.

BRIEF DESCRIPTION OF THE DRAWINGS

FIG. 15 is a perspective view of a micro generator of the self-powered wireless switch according to above third embodiment of the present invention.

FIG. 16 is an exploded perspective view of the micro generator of the self-powered wireless switch according to above third embodiment of the present invention.

FIG. 17 is a perspective view of the micro generator of the self-powered wireless switch according to above third embodiment of the present invention, illustrating the relationship between the coil assembly and the magnet assembly.

FIG. 18 is a side view of the micro generator of the self-powered wireless switch according to above third embodiment of the present invention, illustrating the relationship between the coil assembly and the magnet assembly.

FIG. 24 is an exploded perspective view of the self-powered wireless switch according to above third embodiment of the present invention, illustrating the switch panel forming a cover and the supporting panel forming a casing.

FIG. 25 is an exploded perspective view of the self-powered wireless switch according to above third embodiment of the present invention.

FIG. 26 illustrates a plurality of actuation areas formed on the outer surface of the switch panel according to above third embodiment of the present invention.

DETAILED DESCRIPTION OF THE PREFERRED EMBODIMENT

Figure 1:
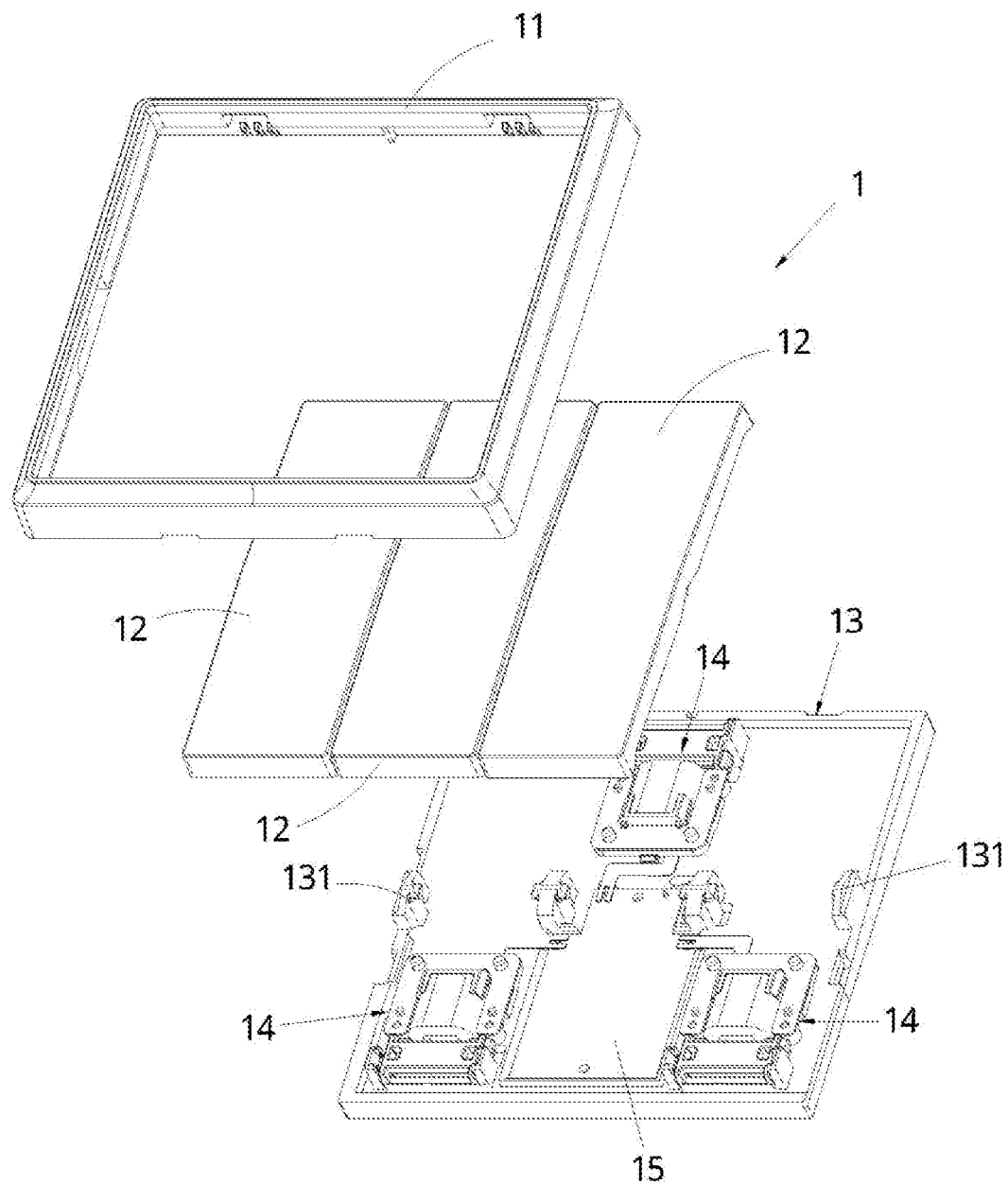
FIG. 1 is an exploded perspective view of a self-powered wireless switch according to a preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Referring to FIGS. 1 to 11 of the drawings, a self-powered wireless switch 1 according to a preferred embodiment of the present invention is illustrated, wherein the self-powered wireless switch 1 is adapted to incorporate with any electronic device. In particular, the self-powered wireless switch 1 is a self-powered unit for controlling the electronic device in an on-and-off manner. For example, the self-powered wireless switch 1 according to the preferred embodiment is arranged to control an illuminator in an on-and-off manner. It is appreciated that the self-powered wireless switch 1 can switch on and off other electronic devices such as television, refrigerator, and electric fan.

As shown in FIGS. 1 to 4, the self-powered wireless switch 1 comprises a supporting panel 13 serving as a base panel, at least a micro generator 14 supported on the supporting panel 13, a control panel 15, and a switch panel 12. The control panel 15 is a signal transmitter for transmitting a wireless control signal. In other words, when the control panel 15 is activated, the control panel 15 will generate and transmit the wireless control signal to the electronic device in order to control the electronic device, such as switch on the electronic device or switch off the electronic device.

The micro generator 14 comprises a magnet assembly 144 supported in a movable manner and a coil assembly coupled at the supporting panel. The magnet assembly 14 comprises a permanent magnet 1443 and two magnet conductive panels 1442, wherein the magnet conductive panels 1442 are located at two opposite poles (N-S) of the permanent magnet 1443 at two sides thereof respectively. In other words, the magnet conductive panels 1442 are magnetized by the permanent magnet 1443 to form two opposite magnetic poled panels respectively. The coil assembly comprises a coil core 142, such as an iron core, and a coil wire wound around the coil core 142 to form a magnetic coil 147, wherein the coil wire is electrically linked to the control panel 15. According to the Faraday's Law of Induction, when the line of the magnetic force of the coil core 142 is changed to generate an electromotive force, an induced current is generated by the magnetic coil 147 via the coil wire.

Figure 2:
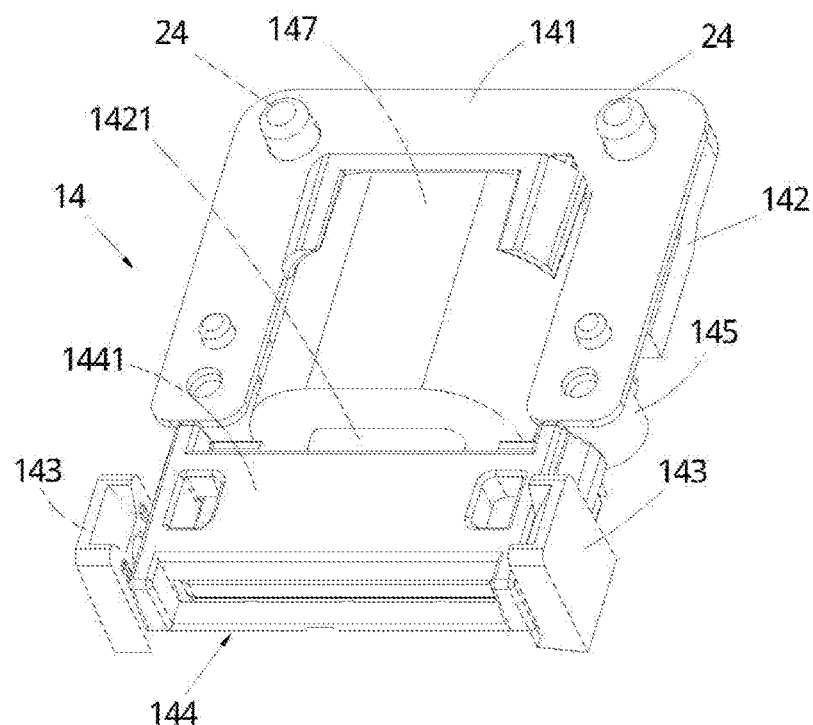
FIG. 2 is a perspective view of a micro generator of the self-powered wireless switch according to the above preferred embodiment of the present invention.
Figure 3:
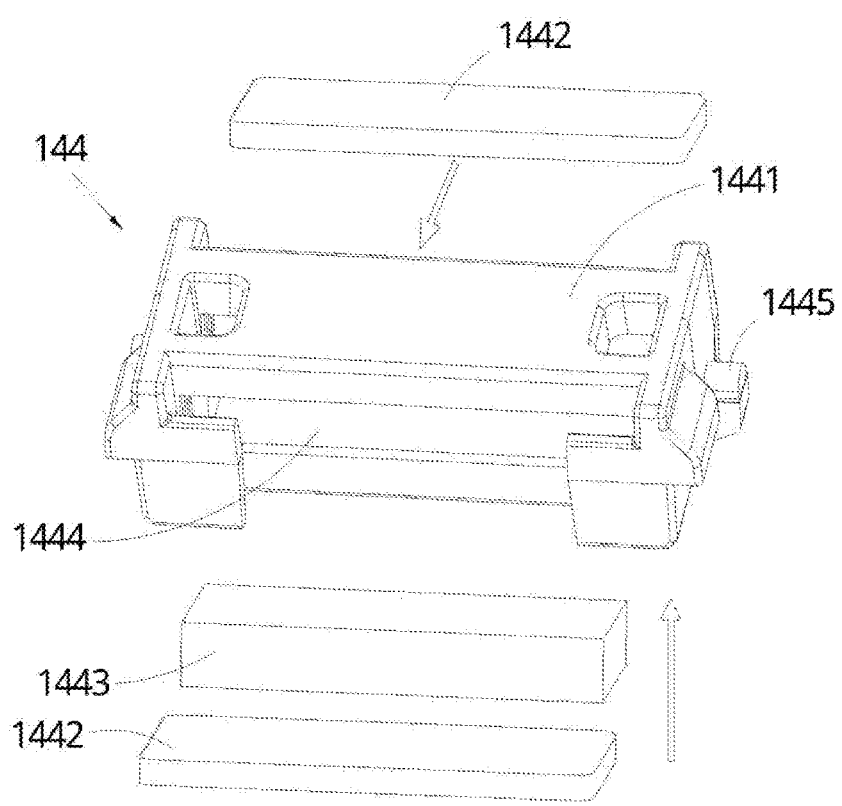
FIG. 3 is an exploded perspective view of a magnet assembly of the self-powered wireless switch according to the above preferred embodiment of the present invention.
Figure 4:
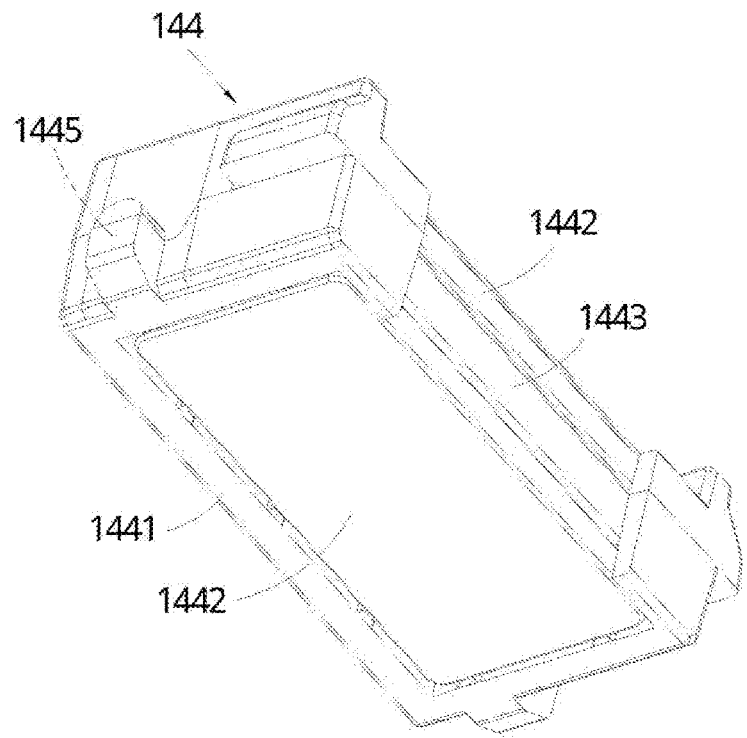
FIG. 4 is a perspective view of the magnet assembly of the self-powered wireless switch according to the above preferred embodiment of the present invention.
Figure 7:
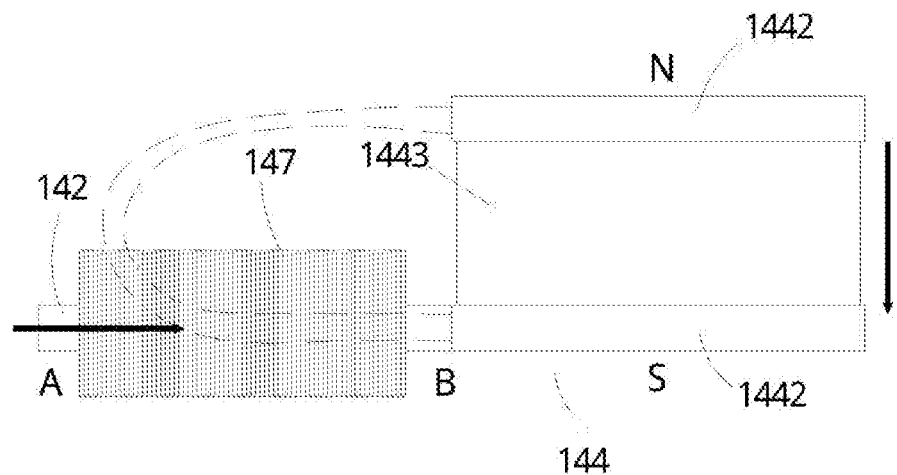
FIG. 7 illustrates the magnet induction between the magnet assembly and the coil assembly when the magnet assembly is moved downward according to the above preferred embodiment of the present invention.
Figure 8:
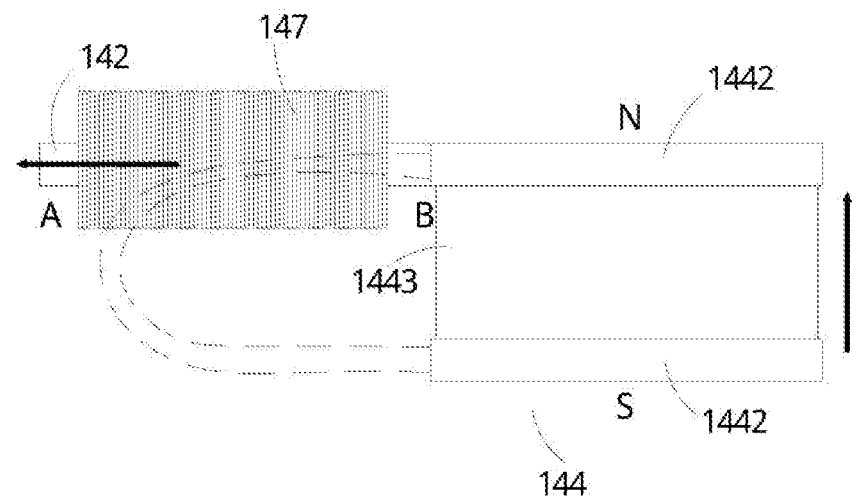
FIG. 8 illustrates the magnet induction between the magnet assembly and the coil assembly when the magnet assembly is moved upward according to the above preferred embodiment of the present invention.

As shown in FIGS. 2, 7, and 8, the magnet assembly 144 is located at a first side (right side) of the coil core 142, wherein a face (left face) of one of the magnet conductive panels 1442 is contacted with a face (right face) of the coil core 142. In particular, the magnet assembly 144 is movable in relation to the coil core 142, such as an up and down sliding movement. The magnet assembly 144 is arranged at one side of the coil assembly facing the centerline of the magnetic coil 147, such that the coil core 142 perpendicularly faces toward the magnet assembly 144. It is worth mentioning that the coil core 142 can faces toward the magnet assembly 144 at any angle in order to magnetically induce with the coil core 142 and to change the line of the magnetic force of the coil core 142 for generating the induced current.

According to the preferred embodiment, the micro generator 14 further comprises two sliding panels 143 symmetrically and spacedly extended from the supporting panel 13 to form a sliding cavity between the sliding panels 143, wherein each of the sliding panels 143 has a sliding groove formed thereat, such that the sliding grooves of the sliding panels 143 face toward each other. Two sides of the magnet assembly 144 are engaged with the sliding grooves of the sliding panels 143 in a slidably movable manner, such that the magnet assembly 144 is movably supported at the sliding cavity. Accordingly, the sliding displacement of the magnet assembly 144 is restricted by the length of the sliding groove, so as to limit the up-and-down sliding movement of the magnet assembly 144. In other words, the magnet assembly 144 is retained by the sliding panels 143 to ensure the coil core 142 to perpendicularly face toward the magnet assembly 144.

Accordingly, the magnet assembly 144 further comprises an outer supportive frame 1441 having an interior cavity 1444, wherein the permanent magnet 1443 and the magnet conductive panels 1442 are supported within the interior cavity 1444 of the outer supportive frame 1441. Therefore, the permanent magnet 1443 can be securely retained between the two magnet conductive panels 1442 to prevent any unwanted movement between the permanent magnet 1443 and each of the magnet conductive panels 1442. The outer supportive frame 1441 further has two sliding members 1445 extended from two sides thereof to slidably engage with the sliding grooves of the sliding panels 143 respectively, such that the magnet assembly 144 can be slid at the sliding grooves of the sliding panels 143 in an up-and-down movable manner.

Figure 5:
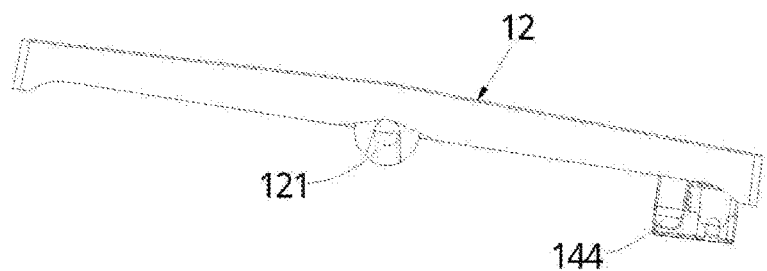
FIG. 5 is a perspective view of the switch panel of the self-powered wireless switch according to the above preferred embodiment of the present invention, illustrating the magnet assembly coupled at the switch panel.
Figure 6:
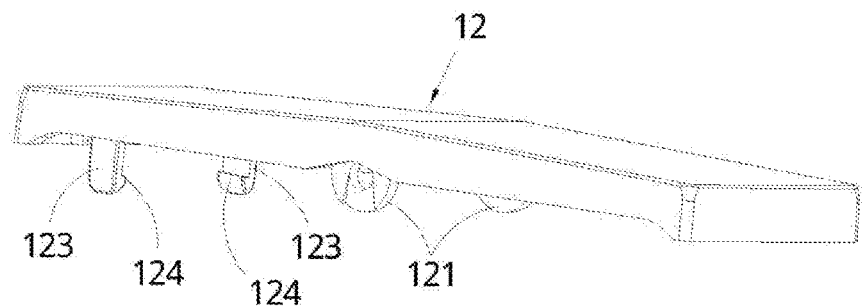
FIG. 6 is a perspective view of the switch panel of the self-powered wireless switch according to the above preferred embodiment of the present invention.

As shown in FIGS. 1, 5, and 6, the supporting panel 13 further has a protruded platform 131, wherein a mid-portion of the switch panel 12 is pivotally coupled at the protruded platform 131 of the supporting panel 13, so as to pivotally couple the switch panel 12 on the supporting panel 13. The switch panel 12 has a panel cavity formed at a bottom side thereof, wherein a pivot arm 121 is extended from the panel cavity of the switch panel 12 at the mid-portion thereof to pivotally couple with the protruded platform 131, such that the switch panel 12 forms a seesaw panel on the supporting panel 13. A first end (right end) of the switch panel 12 is coupled to the magnet assembly 144, wherein when an opposed second end of the switch panel 12 is actuated, the first end thereof is pivotally moved to drive the magnet assembly 144 to reciprocatingly move up-and-down. Therefore, the permanent magnet 1443 and the magnet conductive panels 1442 are moved at the same time, such that the magnet conductive panels 1442 are aligned with the coil core 142 in an alternating manner, as shown in FIGS. 7 and 8. In other words, one of the magnet conductive panels 1442 will align with the coil core 142 when the magnet assembly 144 is moved upward while another magnet conductive panel 1442 will align with the coil core 142 when the magnet assembly 144 is moved downward. Since the magnet conductive panels 1442 have two opposite poles respectively, i.e. one magnet conductive panel 1442 has a N pole and another one has a S pole, the movement of the magnet assembly 144 will magnetically induce with the coil core 142 to change the line of the magnetic force of the coil core 142 so as to generate the induced current by the magnetic coil 147. The current generated by the magnetic coil 147 will guide to flow to the control panel 15 as a power supply thereof in order to ensure the control panel 15 to be powered to transmit the wireless control signal for controlling the electronic device. It is worth mentioning that the magnet assembly 144 is coupled at the first end of the switch panel 12 at a position that the magnet assembly 144 is supported within the panel cavity of the switch panel 12. In particular, the magnet assembly 144 is coupled at the inner wall of the panel cavity of the switch panel 12 to securely retain the magnet assembly 144 in position. Accordingly, the switch panel 12 further has two engaging arms 123 extended from two sides thereof and two engaging clips 124 integrally formed at two free ends of the engaging arms 123 respectively. The magnet assembly 144 is supported within the panel cavity of the switch panel 12 at a position between the two engaging arms 123, wherein the engaging clips 124 are detachably engaged with the outer supportive frame 1441, so as to prevent the magnet assembly 144 being detached from the switch panel 12 due to the movement of the magnet assembly 144.

Figure 10:
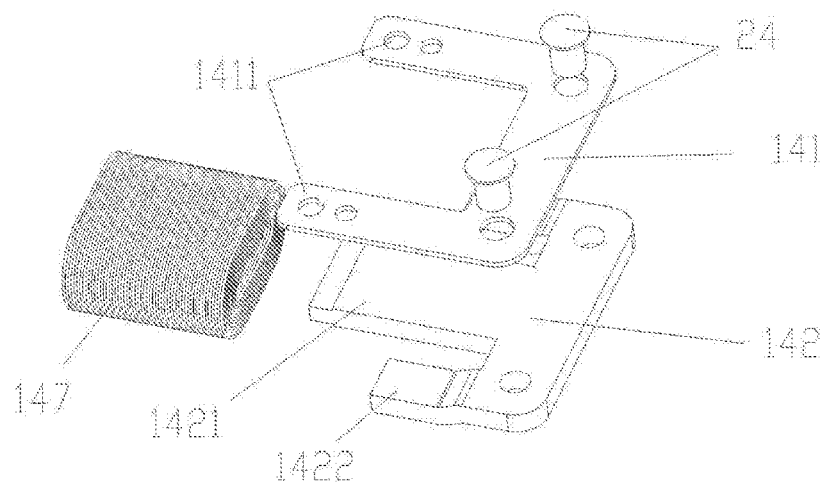
FIG. 10 is an exploded perspective view of the coil assembly of the self-powered wireless switch according to the above preferred embodiment of the present invention.

As shown in FIGS. 2 and 10, the coil assembly further comprises a resilient element 141, wherein one end of the resilient element 141 is affixed to the supporting panel 13 while another opposed end of the resilient element 141 is coupled to a second side of the coil core 142, such that the opposed first side of the coil core 142 faces toward the magnet assembly 144. Accordingly, the resilient element 141 having a U-shape is supported in a suspending manner, wherein a free end portion of the resilient element 141 is coupled with the second side of the coil core 142, such that the first side of the coil core 142 is suspendedly supported toward the magnet assembly 144. As shown in FIG. 7, when the magnet assembly 144 is moved downwardly, a magnetic attracting force between the magnet assembly 144 and the coil core 142 will generate to pull the coil core 142 downward so as to bend the resilient element 141 downward for restoring a resilient force thereof. When the magnet assembly 144 is kept moving downwardly, the resilient force of the resilient element 141 will transform as a reaction force to the coil core 142. When the reaction force of the resilient element 141 is greater than the magnetic attracting force, the resilient element 141 will rapidly bend upwardly to its original form to rapidly move the coil core 142 upward, so as to rapidly change the line of the magnetic force of the coil core 142. In other words, the magnetic coil 147 will generate a large amount of the induced current. Likewise, as shown in FIG. 8, when the magnet assembly 144 is moved upwardly, the magnetic attracting force between the magnet assembly 144 and the coil core 142 will generate to pull the coil core 142 upward so as to bend the resilient element 141 upward for restoring the resilient force thereof. When the magnet assembly 144 is kept moving upwardly, the resilient force of the resilient element 141 will transform as the reaction force to the coil core 142. When the reaction force of the resilient element 141 is greater than the magnetic attracting force, the resilient element 141 will rapidly bend downwardly to its original form to rapidly move the coil core 142 downward, so as to rapidly change the line of the magnetic force of the coil core 142. In other words, the magnetic coil 147 will generate a large amount of the induced current.

Accordingly, the magnet conductive panels 1442 are directly contacted with the coil core 142, wherein the magnet conductive panels 1442 are magnetically attracted to the coil core 142 when the magnet conductive panels 1442 are moved up and down. In other words, through the magnetic attraction, the coil core 142 is driven to move up and down corresponding to the movement of the magnet conductive panels 1442. Therefore, the resilient element 141 is bent correspondingly. Once the reaction force of the resilient element 141 is greater than the magnetic attracting force, the reaction force of the resilient element 141 will break the magnetic attraction between the magnet conductive panels 1442 and the coil core 142. Accordingly, the U-shaped resilient element 142 defines a mid-portion and forms a resilient platform to couple with the coil core 142, and two resilient arms extended from the mid-portion, such that when the resilient arms are bent, the mid-portion of the resilient element 142 can be rapidly rebounded to move the coil core 142 back to its original position, so as to prevent a distortion of the coil core 142.

As shown in FIGS. 2 and 10, the coil core 142, having a W-shape, comprises a mid core arm 1421 and two side core arms 1422, wherein the mid core arm 1421 is spacedly located between the two side core arms 1422. The coil wire is wound around the mid core arm 1421 to form the magnetic coil 147 and to define a protrusion portion of the coil core 142 at a free end of the mid core arm 1421. The coil core 142 is overlapped on the resilient element 141 at a position that the mid-portion of the resilient element 142 is affixed to a portion of the coil core 142 above the side core arms 1422. It is appreciated that the shape of the resilient element 141 can be modified as long as the resilient element will provide enough resilient force to the coil core 142 so as to ensure the coil core 142 to return back to its position in response to the movement of the magnet assembly 144. According to the preferred embodiment, the coil core 142 is overlapped on and affixed to the resilient element 141 via a rivet 24. It is appreciated that other fasteners can be used for affixing the coil core 142 to the resilient element 141. Accordingly, the resilient arms 1411 of the resilient element 141 are longer than the side core arms of the coil core 142, wherein the resilient arms 1411 of the resilient element 141 are affixed to two retention posts 145 integrally protruded from the supporting panel 13, such that the mid core arm 1421 of the coil core 142 is perpendicular to the magnet assembly 144. Accordingly, the magnetic coil 147 has at least 300 turns of coil wire. The induced voltage generated is proportional to the number of turns which the flux penetrates. Accordingly, every actuation of the switch panel 12 will cause the micro generator 14 to generate voltage. In each actuation of the switch panel 12, the generation time of the micro generator 14 is about 1.5 ms, the voltage generated by the micro generator 14 is about 9V-15V, and the current generated by the micro generator 14 is about 30 mA. It is worth mentioning that the number of turns of the magnetic coil 147, the size of the magnetic coil 147, and the strength of the magnetic field will be the factors to generate different voltage and current output.

Figure 11:
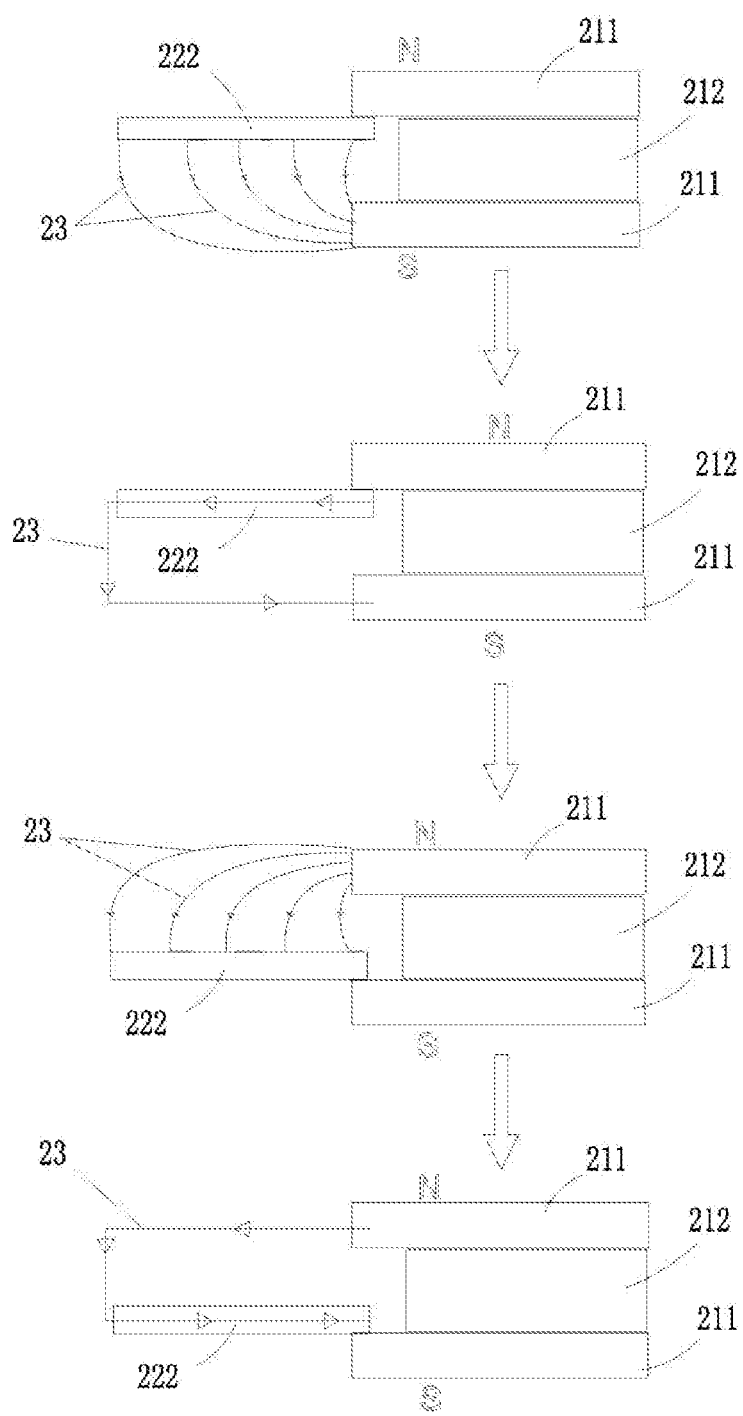
FIG. 11 illustrates the operation of the self-powered wireless switch to generate an induced current according to the above preferred embodiment of the present invention.

FIG. 11 illustrates an alternative mode of the magnet assembly which comprises a permanent magnet 212 and two magnet conductive panels 211 to sandwich the permanent magnet 212 therebetween, wherein the length of the permanent magnet 212 is shorter than the length of each of the magnet conductive panels 211, such that when the magnet conductive panels 211 are overlapped coupled at two sides of the permanent magnet 212 respectively, two extension portions of the magnet conductive panels 211 are extended out of the permanent magnet 212 to define a magnetic cavity between the extension portions. One side portion (right side portion) of the coil core 222 as the protrusion portion thereof is disposed within the magnetic cavity, wherein when the magnetic assembly is moved up-and-down, the protrusion portion of the coil core 222 can be moved within the magnetic cavity to contact with inner sides of the extension portions of the magnet conductive panels 211 in an alternating manner, so as to magnetize with the magnet conductive panels 211.

According to the preferred embodiment, during the movement of the magnet assembly 144 with respect to the coil assembly, the magnet conductive panels 1442 are magnetically attracted to the coil core 142 when the coil core 142 is facing toward the magnet conductive panels 1442. It is appreciated that a gap can be formed between the magnet conductive panels 1442 and the coil core 142 as long as the coil core 142 is magnetized to generate the current.

As shown in FIG. 1, three micro generators 14 are spacedly supported on the supporting panel 13, wherein three switch panels 12 are pivotally coupled at the supporting panel 13 corresponding to the three micro generators 14 respectively. In particular, the three switch panels 12 are orderly coupled at the supporting panel 13 side-by-side to operate the three micro generators 14 respectively. In other words, the self-powered wireless switch 1 of the present invention provides a plurality of switch panels 12 in one switch unit, such that the switch panels 12 can be selectively actuated to operate the corresponding micro generators 14, so as to control different electronic devices. The number of micro generators 14 can be selectively configured according to need of the electronic devices. Two or more micro generators 14 can be electrically linked to one control panel 15 via different circuits thereof. In other words, a number of diode rectifiers in the control panel 15 can be increased to form a power source partition of each micro generator 14, such that each switch panel 12 is actuated to individually operate the corresponding micro generator 14 so as to prevent the interference between the micro generators 14.

As shown in FIG. 1, the self-powered wireless switch 1 further comprises an outer frame 11 formed in a ring shape to couple at the peripheral portions of the supporting panel 12 and the switch panels 12. Therefore, the switch panels 12 can be securely coupled at the supporting panel 12 to protect the micro generators 14 and the control panel 15. In order to install the self-powered wireless switch 1, the outer frame 11 and the switch panel 12 can be detached from the supporting panel 12, such that the supporting panel 12 can be affixed on a wall surface via screws. Then, the outer frame 11 and the switch panel 12 can be mounted on the supporting panel 12 to complete the wall installation of the present invention. Preferably, the supporting panel 12 and the switch panel 12 are formed in rectangular shape, wherein the outer frame 11 is also formed in rectangular shape. It is appreciated that the supporting panel 12 and the switch panel 12 can be formed in other shape, wherein the shape of the outer frame 11 is also formed correspondingly.

It is worth mentioning that the switch panel 12 is an example to serve as an actuator to move the magnet assembly 144 up and down. Other actuators which can perform the same function can be used in the present invention. For example, the magnet assembly 144 can be directly moved manually. Since the micro generator 14 is the fundamental unit to be moved corresponding to the coil assembly, other actuators, including the switch panel 12, can be modified to achieve the same result of the magnet assembly 144.

Accordingly, the supporting panel 13 of the self-powered wireless switch 1 can be coupled on a wood surface, a glass surface, marble surface, or tile surface via an attaching means such as glue. As it is mentioned above, the supporting panel 13 can be affixed on any surface via the screws. Therefore, the installation of the present invention does not require any pre-formed groove on the wall to minimize the noise and to prevent any pollution during conventional installation process. The operation of the present invention is the same as the conventional wire-type switch through the actuation of the switch panel, such that the present invention is considered as an environmental friendly product for residual and commercial use.

Accordingly, the operational principle of the present invention is shown as follows:

The coil core 142 sleeved in the magnetic coil 147 provides two functions of magnetization and change of magnet flux. As shown in FIG. 7, assuming that the lower magnet conductive panel 1442 has a S pole and the upper magnet conductive panel 1442 has a N pole. Initially, the side of the coil core 142 is magnetically attracted to the lower magnet conductive panel 1442. Once the coil core 142 is magnetized, the S pole length of the lower magnet conductive panel 1442 will be further extended to the coil core 142. In other words, the magnetic field will penetrate through the magnetic coil 147 and the line of magnetic force will form as N-S, i.e. through the coil core 142 from point A to point B (enter from the left side of the coil core 142 and exit at the right side of the coil core 142). As shown in FIG. 8, when the switch panel 12 is pivotally actuated to drive the magnet assembly 144 to move downward, the relative displacement between the magnet assembly 144 and the coil core 142 is changed. The coil core 142 is moved from the lower magnet conductive panel 1442 to the upper magnet conductive panel 1442, such that the side of the coil core 142 is magnetically attracted to the upper magnet conductive panel 1442. At the same time, the coil core 142 is magnetized that the N pole length of the upper magnet conductive panel 1442 will be further extended to the coil core 142. As a result, the magnetic field will penetrate through the magnetic coil 147 and the line of magnetic force will form as N-S, i.e. through the coil core 142 from point B to point A (enter from the right side of the coil core 142 and exit at the left side of the coil core 142).

Figure 9:
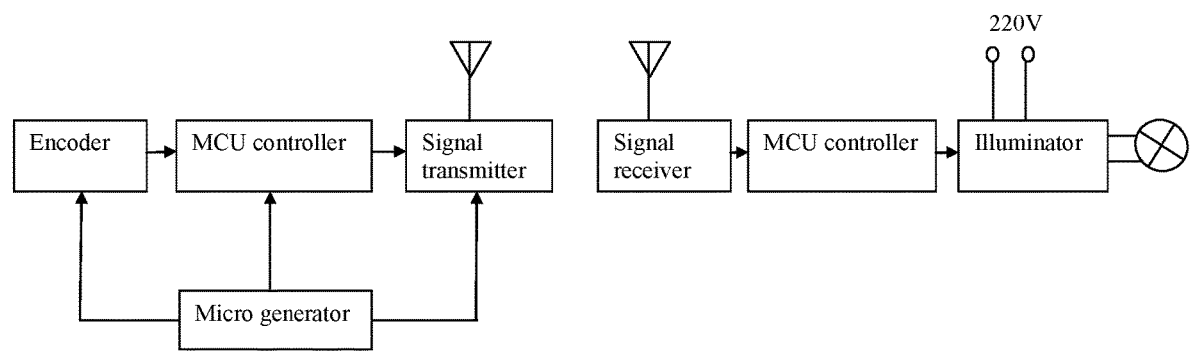
FIG. 9 is a block diagram of the self-powered wireless switch to the electronic device according to the above preferred embodiment of the present invention.

As shown in FIG. 11, the line of magnetic force is changed between the magnet assembly and the coil core 222 during the movement of the magnet assembly. As a result, the line of magnet force 23 (the magnetic induction line) of the coil core 222 is changed oppositely. According to the Faraday's Law of Induction, when the induced current is generated by the magnetic coil, the voltage is generated correspondingly. It is worth mentioning that the alternating current generated by the coil will be transformed into a direct current through a rectifier, such that the DC current will guide to flow to the control panel as the power source thereof. The control panel 15 comprises a diode rectifier and a wireless signal generator, wherein the wire from the micro generator, the diode rectifier and the wireless signal generator are electrically linked together in order. In other words, the AC current generated by the magnetic coil 147 is guided to pass to the diode rectifier. The positive-negative poles of the current generated by the magnetic coil 147 at one actuation of the switch panel 12 are opposite to that of the current generated by the magnetic coil 147 at the previous actuation of the switch panel 12. The diode rectifier will rectify the current from the magnetic coil 147 to ensure the proper current to pass to the wireless signal generator. Therefore, the wireless signal generator is powered up for generating the wireless control signal to control the desired electronic device. As shown in FIG. 9, the wireless control signal can be a coded control signal, such that when the electronic device receives the wireless control signal, a relay switch of the electronic device is activated to control the on-and-off of the electronic device.

As shown in FIG. 1, the switch panel 12 can be pivotally moved at two ends thereof to move the magnetic assembly 144 up and down, so as to transform a mechanical energy into an electrical energy for supplying electrical power to the control panel. It forms the self-powered unit to generate the wireless control signal. The self-powered control switch 1 of the present invention is reliable comparing with the conventional wire-type control switch. It is safe to use because there is no power line electrically linked to the self-powered control switch 1 of the present invention. In addition, the self-powered control switch 1 of the present invention is a battery-less unit, such that no battery is required to be installed thereinto so as to minimize the operation cost of the self-powered control switch 1 of the present invention and to reduce the environmental pollution. It is worth mentioning that no electrical wiring is required for connecting the switch to the electronic device, such that the material cost, such as wires and PVC wire sleeves, can be significantly reduced. The installation process will also be simplified and shortened and the location of the control switch can be selectively adjusted. The user is able to switch on and off the electronic device through the actuation of the switch panel 12 as the actuation of the conventional switch.

Figure 12:
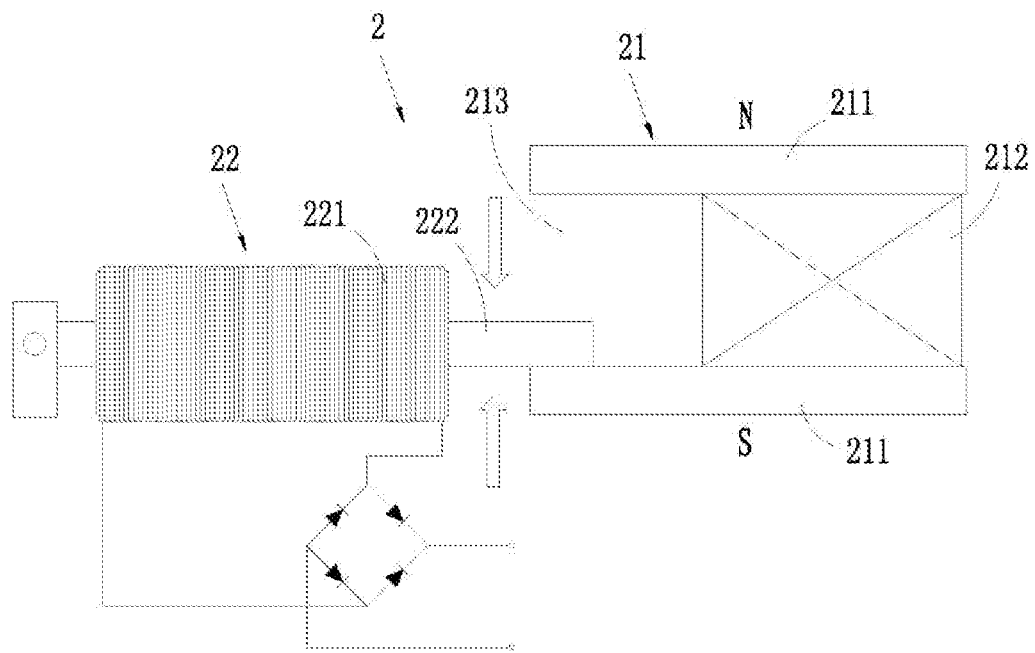
FIG. 12 illustrates the operation of the self-powered wireless switch to generate an induced current according to a second preferred embodiment of the present invention.
Figure 13:
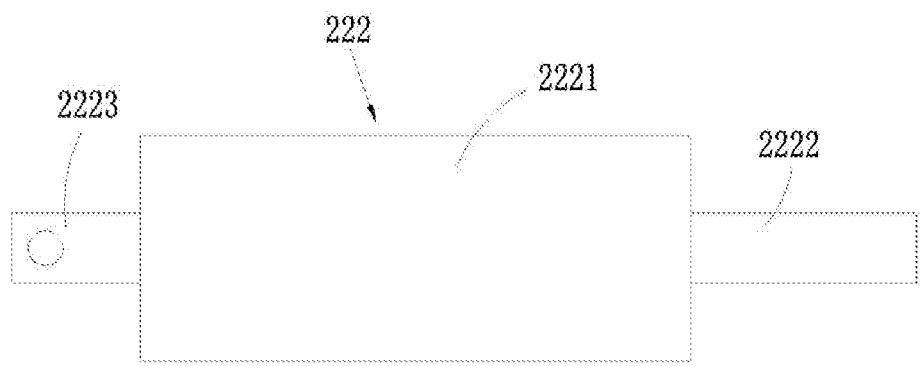
FIG. 13 is a side view of a coil core of the self-powered wireless switch according to the second preferred embodiment of the present invention.

As shown in FIGS. 12 and 13, a self-powered control switch 2 according to a second embodiment illustrates an alternative mode of the first embodiment of the present invention, wherein the structural configuration of the self-powered control switch 2 is the same as that of the first embodiment, except the following:

In the self-powered control switch 2, the magnetic assembly 21 is affixed to the supporting panel 13, wherein the magnetic assembly 21 is located at one side (right side) of the coil core 222 of the coil assembly 22. The magnet conductive panels 211 are overlapped coupled at two sides of the permanent magnet 212 respectively, wherein the length of the permanent magnet 212 is shorter than the length of each of the magnet conductive panels 211, such that two extension portions of the magnet conductive panels 211 are extended out of the permanent magnet 212 to define a magnetic cavity 213 between the extension portions. One side portion (right side portion) coil core 222 is disposed within the magnetic cavity 213. The coil core 222 has a mid core body 2221 where the wire coil 221 are wound therearound, a first core arm 2223 (left core arm), and a second core arm 2222 (right core arm), wherein the first and second core arms 2223, 2222 are oppositely and alignedly extended from the mid core body 2221. The first core arm 2223 is pivotally coupled at the supporting panel 13. The second core arm 2222 is extended within the magnetic cavity 213. The coil core 222 can be moved at the first core arm 2223 to contact the second core arm 2222 with the inner sides of the extension portions of the magnet conductive panels 211 in an alternating manner. The first core arm 2223 and the second core arm 2222 are integrally extended from the mid core body 2221 to form an integrated elongated body. It is appreciated that the mid core body 2221, the first core arm 2223, and the second core arm 2222 can be three individual components and coupled with each other.

Accordingly, the wire coil 221 of the coil core 222 is driven to move when the first core arm 2223 of the coil core 222 is rotated about a pivot point thereof. Therefore, when the second core arm 2222 of the coil core 222 is moved upward to contact with the inner side of the extension portion of the upper magnet conductive panel 211 and is then moved downward to contact with the inner side of the extension portion of the lower magnet conductive panel 211. As shown in FIG. 11, the line of magnet force 23 of the coil core 222 is changed, such that the coil 222 will generate the induced current as mentioned above.

Figure 14:
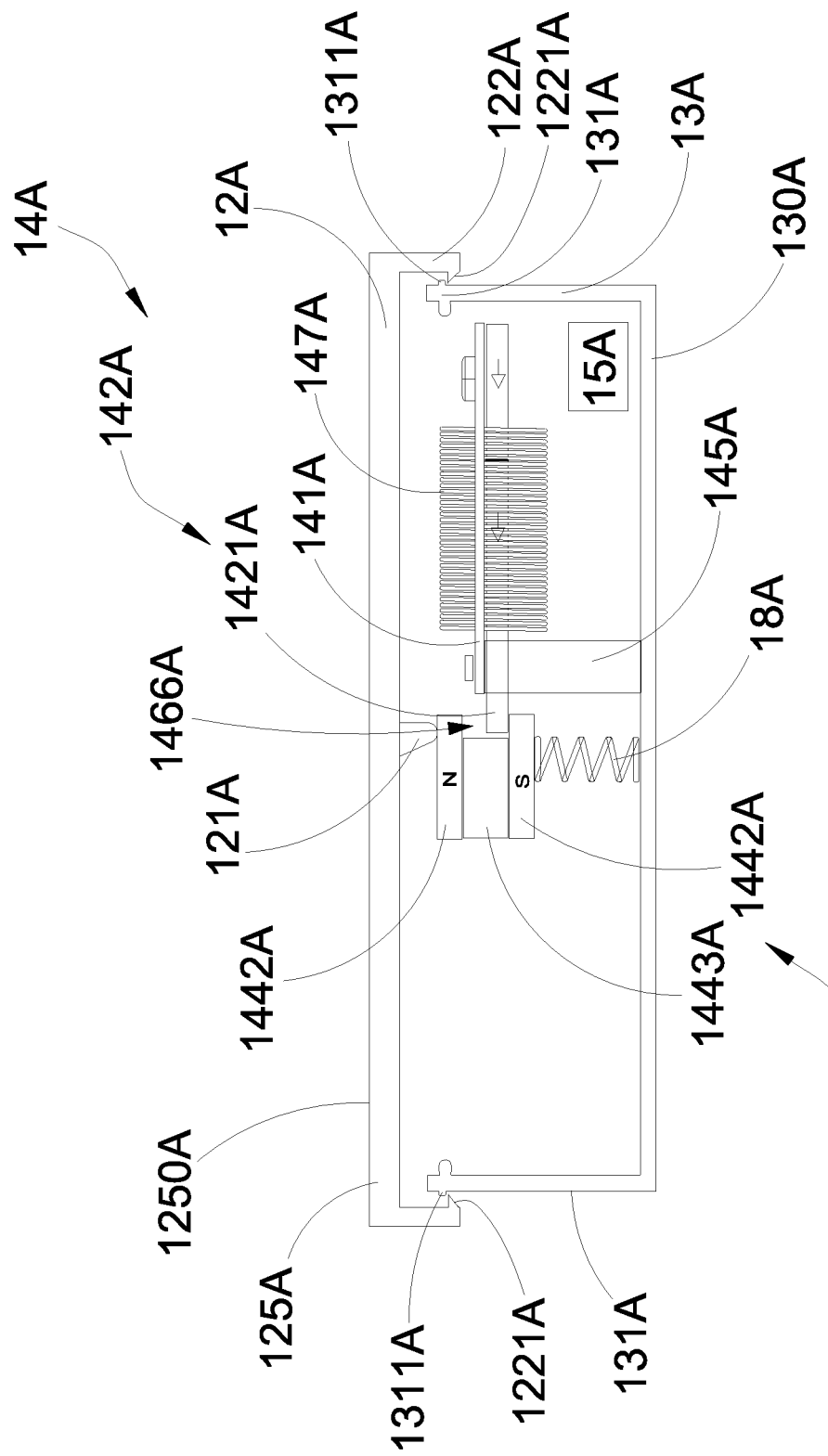
FIG. 14 is sectional view of a self-powered wireless switch according to a third embodiment of the present invention.

As shown in FIGS. 14, 24, and 25, a self-powered wireless switch according to a third embodiment illustrates an alternative mode of the above first and second embodiments of the present invention. The self-powered wireless switch according to the third embodiment has the same structural configuration of the above first and second embodiments.

The self-powered wireless switch comprises a control panel 15A for transmitting a wireless control signal to an electronic device, a switch panel 12A being actuated for generating a mechanical energy, and at least one micro generator 14A operatively linked to control panel 15A, wherein the micro generator 14A is arranged for transforming the mechanical energy to an electrical energy, so as to power the control panel 15A in a battery-less manner.

The self-powered wireless switch further comprises a supporting panel 13A, wherein at least one switch panel 12A is movably coupled at the supporting panel 13A. The supporting panel 13A serves as a base housing to house the micro generator 14A and the control panel 15A. Accordingly, the switch panel 12A is actuated to generate the mechanical energy.

As shown in FIGS. 15 to 17, the micro generator 14A comprises a magnet assembly 144A and a coil assembly which are arranged to be moved in relation to each other. The magnet assembly 14A comprises a permanent magnet 1443A and two magnet conductive panels 1442A, wherein the magnet conductive panels 1442 are located at two opposite poles (N-S) of the permanent magnet 1443A at two sides thereof respectively. In other words, the magnet conductive panels 1442A are magnetized by the permanent magnet 1443A to form two opposite magnetic poled panels respectively.

The coil assembly comprises a coil core 142A, such as an iron core, and a coil wire wound around the coil core 142A, and forms a magnetic coil 147A, wherein the coil wire is electrically linked to the control panel 15A. According to the Faraday's Law of Induction, when the line of the magnetic force of the coil core 142A is changed to generate an electromotive force, an induced current is generated by the magnetic coil 147A via the coil wire.

The coil core 142A, having a T-shape, comprises a core arm 1421A, wherein the coil wire is wound around the core arm 1421A to form the magnetic coil 147A and to form a protrusion portion extended out of the magnetic coil 147A. The protrusion portion is defined at a free end of the core arm 1421A.

Accordingly, the magnet assembly 144A further comprises an outer supportive frame 1441A having an interior cavity 1444A, wherein the permanent magnet 1443A and the magnet conductive panels 1442A are supported within the interior cavity 1444A of the outer supportive frame 1441A. Therefore, the permanent magnet 1443A can be securely retained between the two magnet conductive panels 1442A to prevent any unwanted movement between the permanent magnet 1443A and each of the magnet conductive panels 1442A. The outer supportive frame 1441A can be made of plastic material.

Figure 19:
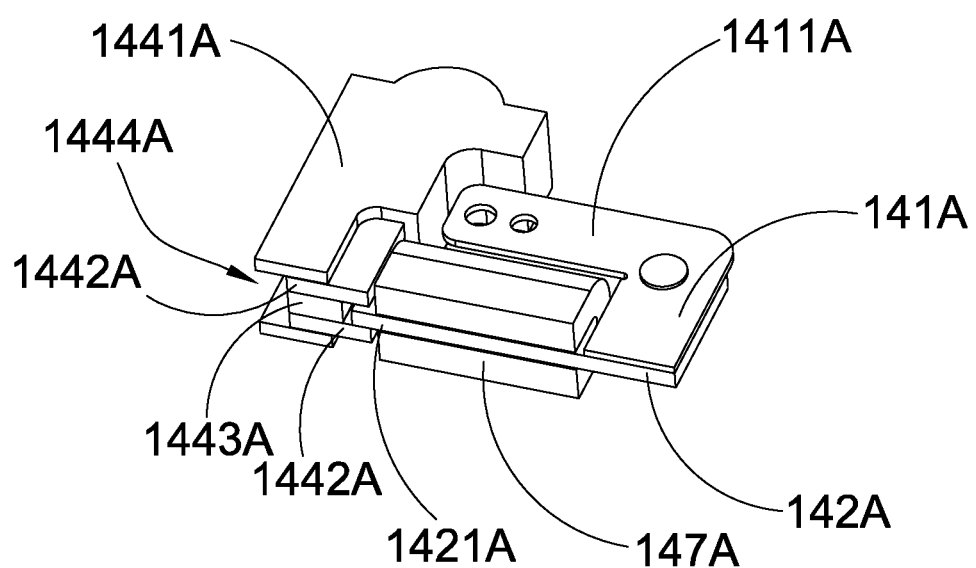
FIG. 19 is a sectional perspective view of the micro generator of the self-powered wireless switch according to above third embodiment of the present invention, illustrating the relationship between the coil assembly and the magnet assembly.

As shown in FIGS. 18 and 19, the magnet conductive panels 1442A to sandwich the permanent magnet 1443A therebetween, wherein the length of the permanent magnet 1443A is shorter than the length of each of the magnet conductive panels 1442A, such that when the magnet conductive panels 1442A are overlapped coupled at two sides of the permanent magnet 1443A respectively, two extension portions of the magnet conductive panels 1442A are extended out of the permanent magnet 1443A to define a magnetic cavity between the extension portions. A protrusion portion of the coil core 142A as the protrusion portion thereof is disposed within the magnetic cavity, wherein when the magnetic assembly 144A is moved up-and-down, the protrusion portion of the coil core 142A can be moved within the magnetic cavity to contact with inner sides of the extension portions of the magnet conductive panels 1442A in an alternating manner, so as to magnetize with the magnet conductive panels 1442A.

The coil assembly further comprises a resilient element 141A having a first portion affixed to the supporting panel 13A and a second portion coupled to a second side of the coil core 142A, such that the coil core 142 is supported by the resilient element 141A toward the magnet assembly 144A. Accordingly, the resilient element 141A having a U-shape is supported in a suspending manner, wherein the resilient element 141A has two resilient arms extended from the mid-portion. Accordingly, the mid-portion of the resilient element 141A is overlapped on and is coupled at the coil core 142A via a rivet 24A, such that the core arm 1421A of the coil core 142A is located between the resilient arms of the resilient element 141A when the resilient element 141A is overlapped on and is coupled at the coil core 142A. In particular, the length of the core arm 1421A of the coil core 142A is longer than the length of each of the resilient arms of the resilient element 141A. Accordingly, the protrusion portion of the coil core 142A is suspendedly supported toward the magnet assembly 144A. The resilient arms 1411A of the resilient element 141A are affixed to two retention posts 145A protruded from the supporting panel 13A.

The micro generator 14A further comprises an elastic element 18A supported at the supporting panel 13A to bias against the magnet assembly 144A. As shown in FIGS. 14 and 16, the elastic element 18A comprises a compression spring having a lower end affixed to the supporting panel 13A and an upper end affixed to the outer supportive frame 1441A. Preferably, two elastic elements 18A are spacedly coupled at two side portions of the outer supportive frame 1441A to move the magnet assembly 144A in a balancing manner. As shown in FIG. 14, the magnetic assembly 144A is pushed upward by the elastic element 18A at a position that the protrusion portion of the coil core 142A is contacted with the extension portion of the lower magnet conductive panel 1442A.

Figure 20A:
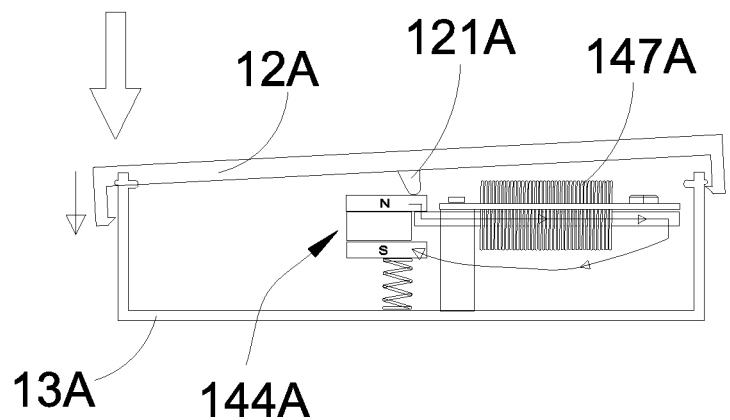
FIGS. 20A to 20C illustrate different actuations of the switch panel of the self-powered wireless switch according to above third embodiment of the present invention.
Figure 20B:
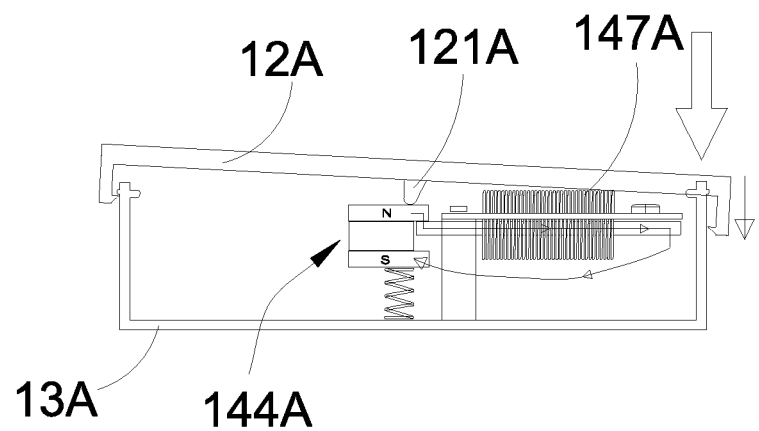
Figure 20C:
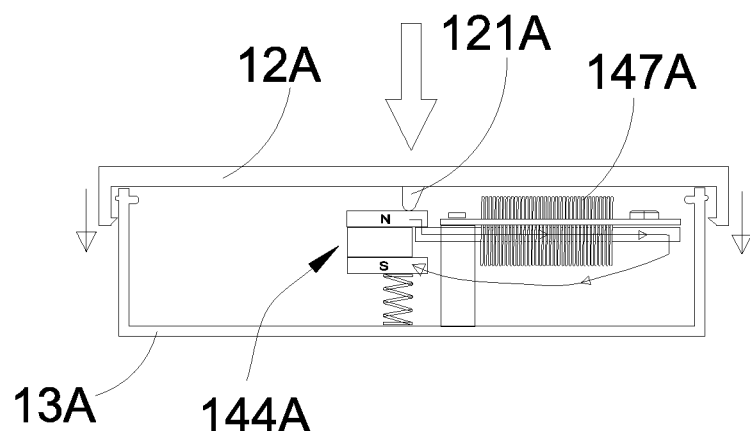
Figure 21:
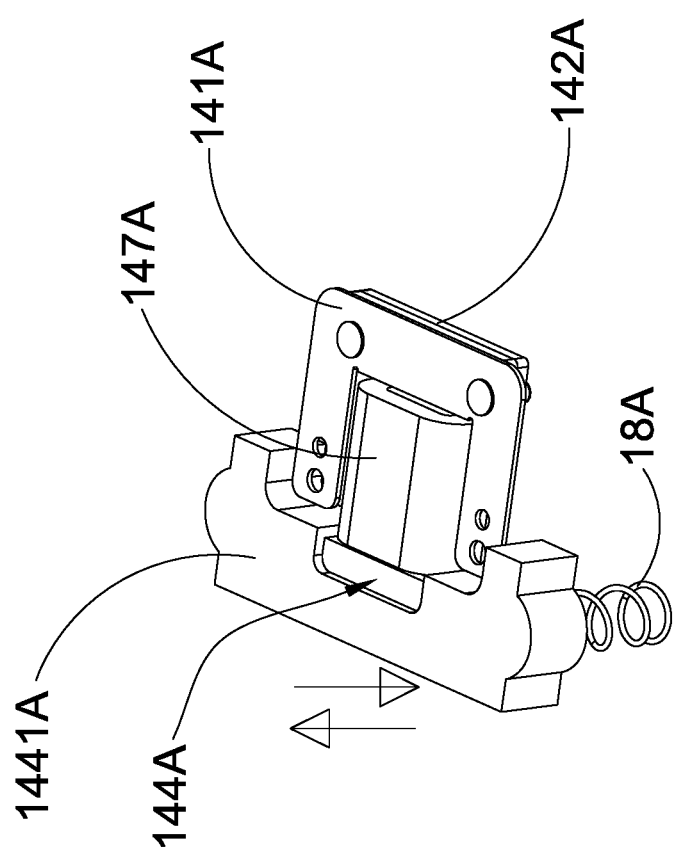
FIG. 21 is a perspective view of the micro generator of the self-powered wireless switch according to above third embodiment of the present invention, illustrating the elastic member.

As shown in FIG. 14, the switch panel 12A forms a cover suspendedly supported on the supporting panel 13A to enclose the micro generator 14A therebetween. Accordingly, the supporting panel 13A has a blocking peripheral edge 131A, wherein the switch panel 12A has an engaging peripheral edge 122A movably coupled at the blocking peripheral edge 131A of the supporting panel 13A to prevent the switch panel 12A being detached from the supporting panel 13A. The switch panel 12A further comprises a pusher arm 121A extended from an inner side to bias against the magnet assembly 144A. In particular, the pusher arm 121A is integrally protruded from a center of switch panel 12A. Therefore, the user is able to push the switch panel 12A at any point to move the magnet assembly 144A downward via the pusher arm 121A. When the switch panel 12A is pressed at the left side thereof, as shown in FIG. 20A, the magnet assembly 144A is pushed down by the pusher arm 121A to compress the elastic element 18A. When the switch panel 12A is pressed at the right side thereof, as shown in FIG. 20B, the magnet assembly 144A is pushed down by the pusher arm 121A to compress the elastic element 18A. Likewise, when the switch panel 12A is pressed at the middle thereof, as shown in FIG. 20C, the magnet assembly 144A is pushed down by the pusher arm 121A to compress the elastic element 18A. As shown in FIG. 26, a plurality of actuation areas 120A on the outer surface of the switch panel 12A, such that the user is able to press on the switch panel 12A at one of the actuation areas 120A to generate the mechanical force to the magnet assembly 144A.

Figure 22:
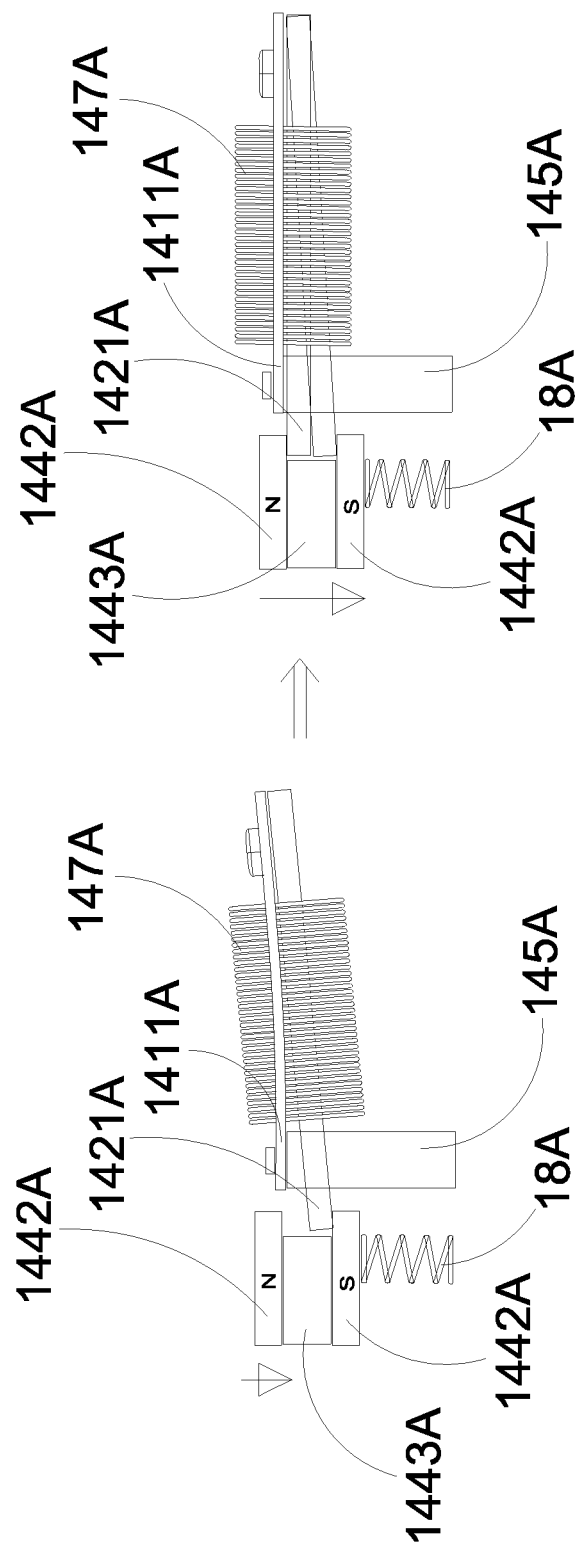
FIG. 22 illustrates the movement of the magnet assembly in relation to the coil assembly according to above third embodiment of the present invention.
Figure 23:
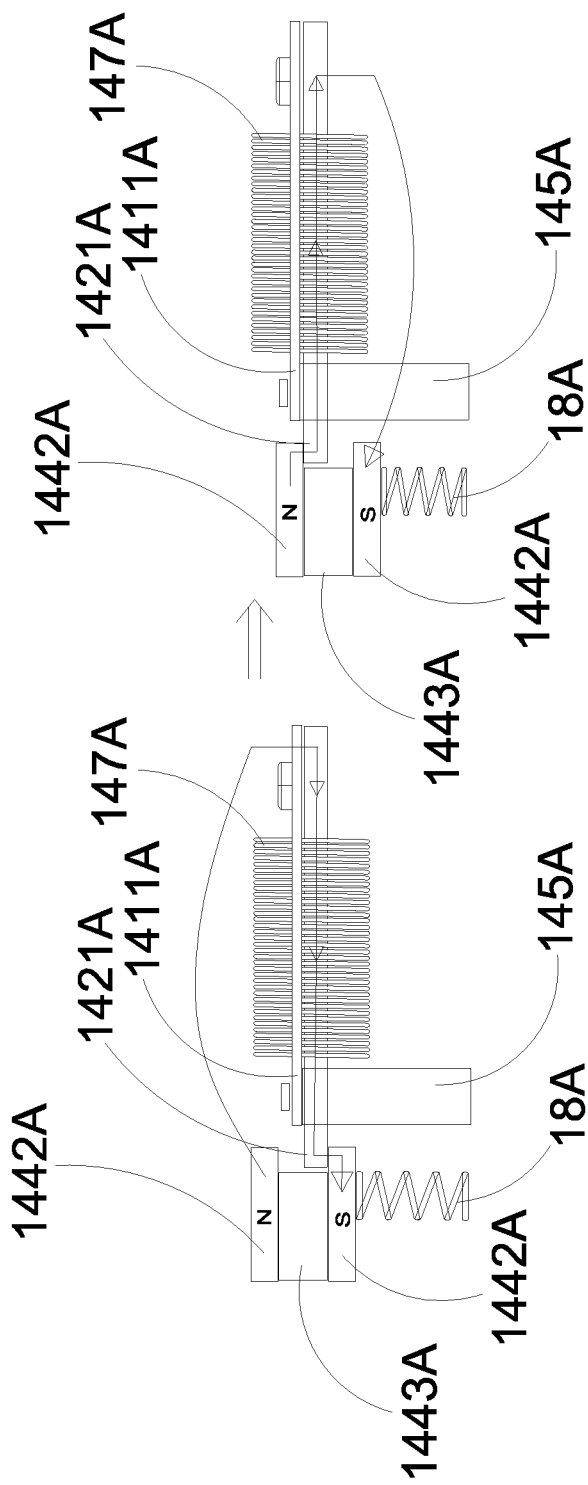
FIG. 23 illustrates the change of magnetic induction line between the magnet assembly and coil assembly according to above third embodiment of the present invention.

As shown in FIG. 22, when the magnet assembly 144A is moved downwardly, a magnetic attracting force between the magnet assembly 144A and the coil core 142A will generate to pull the coil core 142A downward so as to bend the resilient arms of the resilient element 141A downward for restoring a resilient force thereof. When the magnet assembly 144A is kept moving downwardly, the resilient force of the resilient element 141A will transform as a reaction force to the coil core 142A. When the reaction force of the resilient element 141A is greater than the magnetic attracting force, the resilient element 141A will rapidly bend upwardly to its original form to rapidly move the coil core 142A upward, so as to rapidly change the line of the magnetic force of the coil core 142A. In other words, the magnetic coil 147A will generate a large amount of the induced current. Likewise, when the magnet assembly 144A is moved upwardly, the magnetic attracting force between the magnet assembly 144A and the coil core 142A will generate to pull the coil core 142A upward so as to bend the resilient arms of the resilient element 141A upward for restoring the resilient force thereof. When the magnet assembly 144A is kept moving upwardly, the resilient force of the resilient element 141A will transform as the reaction force to the coil core 142A. When the reaction force of the resilient element 141A is greater than the magnetic attracting force, the resilient element 141A will rapidly bend downwardly to its original form to rapidly move the coil core 142A downward, so as to rapidly change the line of the magnetic force of the coil core 142A. In other words, the magnetic coil 147A will generate a large amount of the induced current. Accordingly, the magnetic induction line is changed oppositely as shown in FIG. 23 during the movement of the magnetic assembly 144A.

Figure 27:
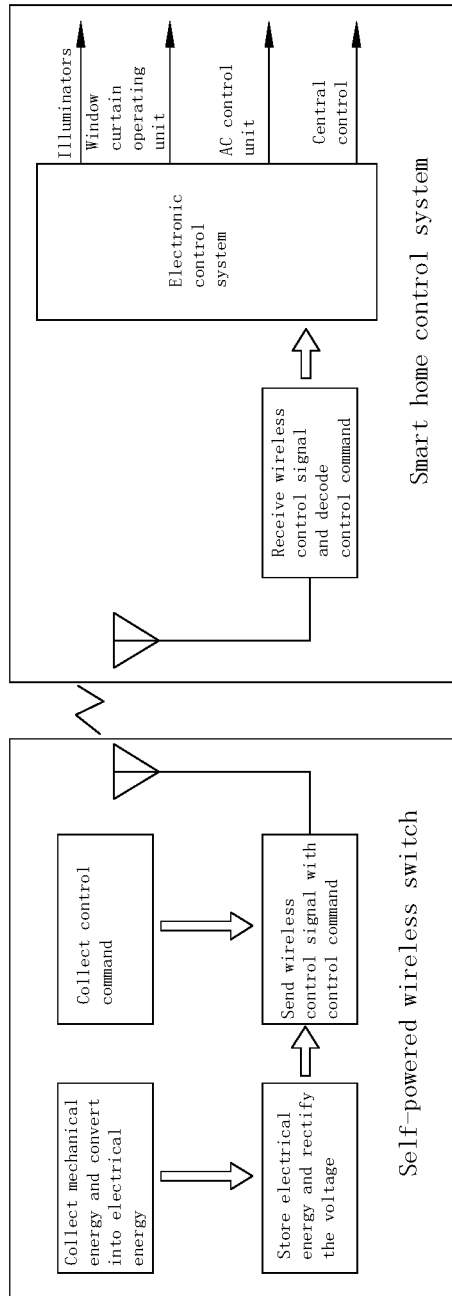
FIG. 27 illustrates the self-powered wireless switch incorporated with an electronic control system to form a smart home control system according to above third embodiment of the present invention.

As shown in FIG. 27, the structural configuration of the present invention is illustrated to incorporate with an electronic control system, wherein the self-powered wireless switch of the present invention is arranged to collect the mechanical energy from the switch panel 12A and to convert the mechanical energy into the electrical energy by the micro generator 14A. Then, the electrical energy generated by the micro generator 14A will transform into usage electrical energy via a rectifier as the power supply for the control panel 15A. At the same time, the control panel 15A will also receive a control command from a control module 19A, such that the control panel 15A will send out the wireless control signal in response to the control command to the electronic control system. Accordingly, the electronic control system can be a smart home control system to operatively link to different electronic devices, such as illuminators, window curtain operating unit, an AC control unit, and an indication unit, via a central control.

In addition, when the electronic control system receives the wireless control signal from the self-powered wireless switch, the electronic control system will decode the wireless control signal in response to the control command, such that the wireless control signal is then transferred to the central control to selectively operate one of the electronic devices.

Figure 29:
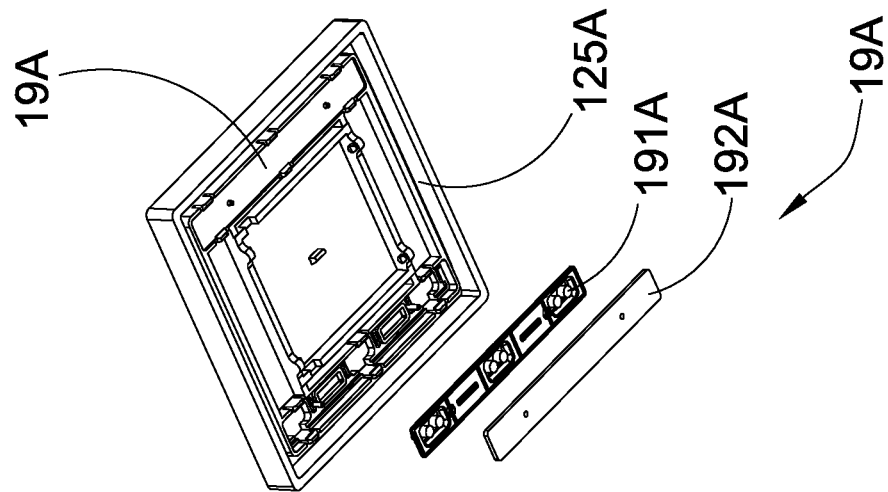
FIG. 29 is an exploded perspective view of the control module incorporated with the switch panel according to above third embodiment of the present invention.
Figure 28:
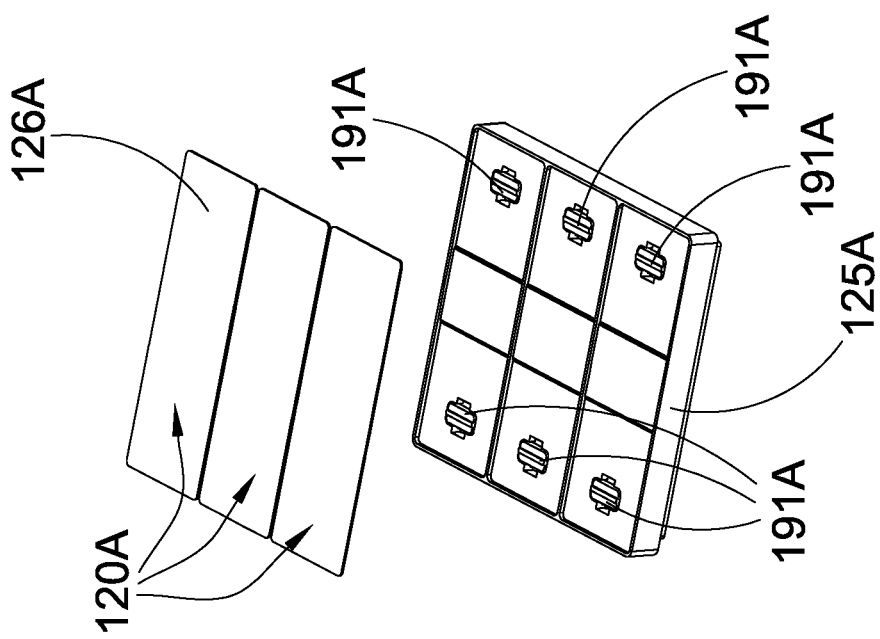
FIG. 28 illustrates the control module embedded with the switch panel according to above third embodiment of the present invention.
Figure 30:
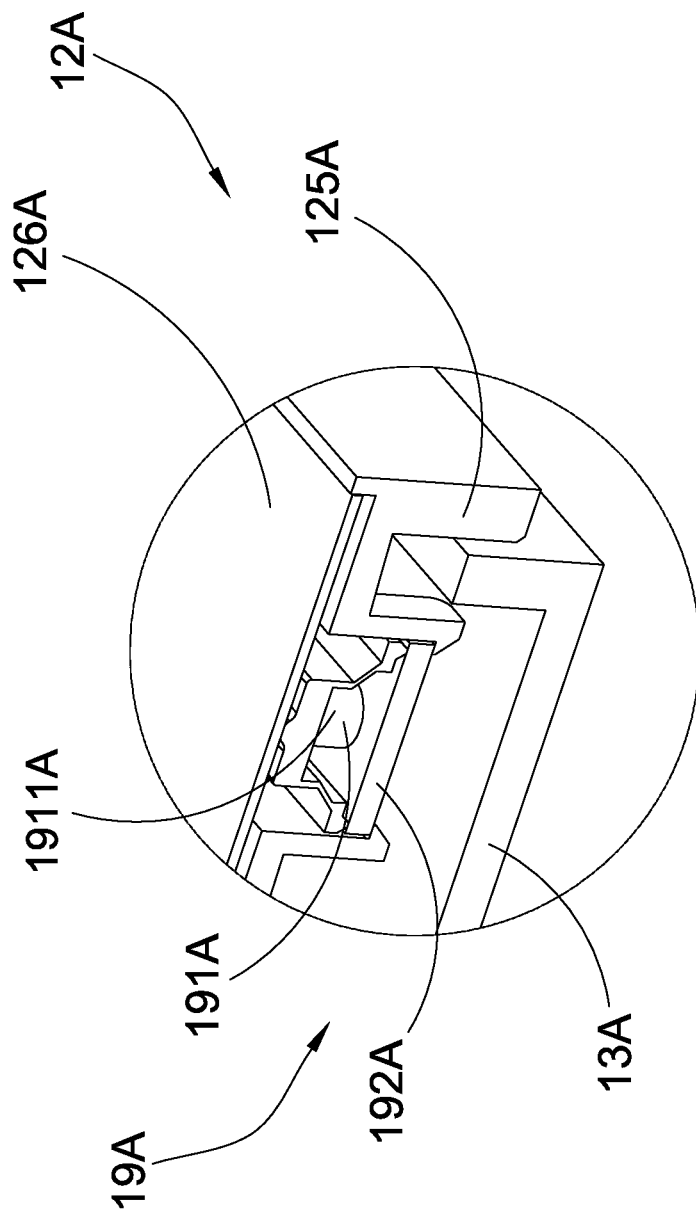
FIG. 30 is a sectional view of the control module incorporated with the switch panel according to above third embodiment of the present invention.

According to the preferred embodiment, in order to control different electronic devices via the self-powered wireless switch, the control module 19A comprises a plurality of activators 191A embedded into the switch panel 12A at the actuation areas 120A respectively. Therefore, when a pressing force is applied on one of the actuation areas 120A, the corresponding activator 191A is actuated. Preferably, the activator 191A comprises a conductor covered with a rubber cover. Accordingly, the control module 19A further comprises a control circuit board 192A, such as PCB, mounted under the switch panel 12A to electrically connect the activators 191A with the control panel 15A, such that when one of the activator 191A is actuated, the corresponding control command will send to the control panel 15A. As shown in FIGS. 28 to 30, the switch panel 12A comprises a base panel 125A where the activators 191A are spacedly supported thereon, and a cover panel 126A spacedly supported on the base panel 125A to enclose the activators 191A. It is worth mentioning that a gap is formed between the base panel 125A and the cover panel 126A to enable the depression of the cover panel 126A to actuate the activator 191A. Preferably, the gap is about 0.6 mm. Accordingly, the cover panel 126A can be made of soft material such as flexible glass or plastic, wherein the actuation areas 120A are formed on the cover panel 126A. The thickness of the cover panel 126A is about 0.5 mm. The cover panel 126A can be slightly deformed when the pressing force is applied thereon.

Figure 31B:
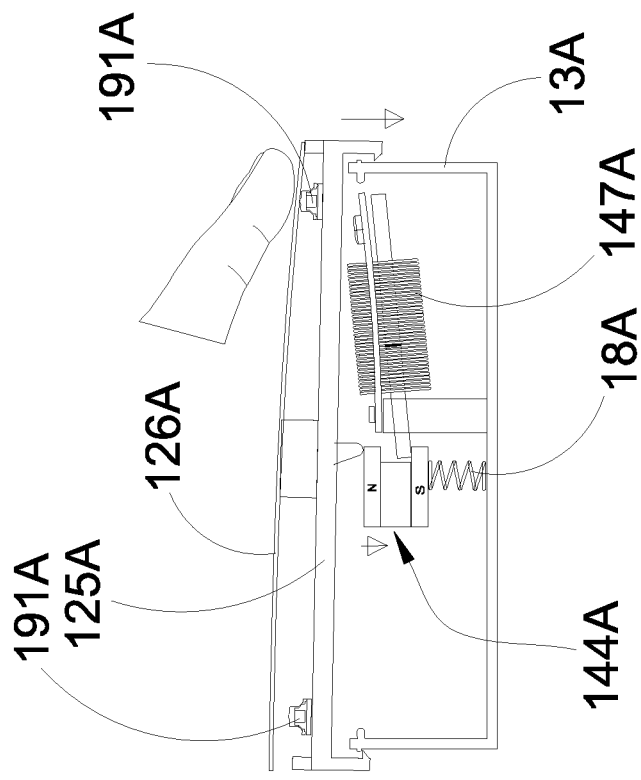
FIGS. 31A to 31B illustrate the operation of the self-powered wireless switch according to above third embodiment of the present invention, illustrating the generation of wireless control signal and control command at the same time.
Figure 31A:
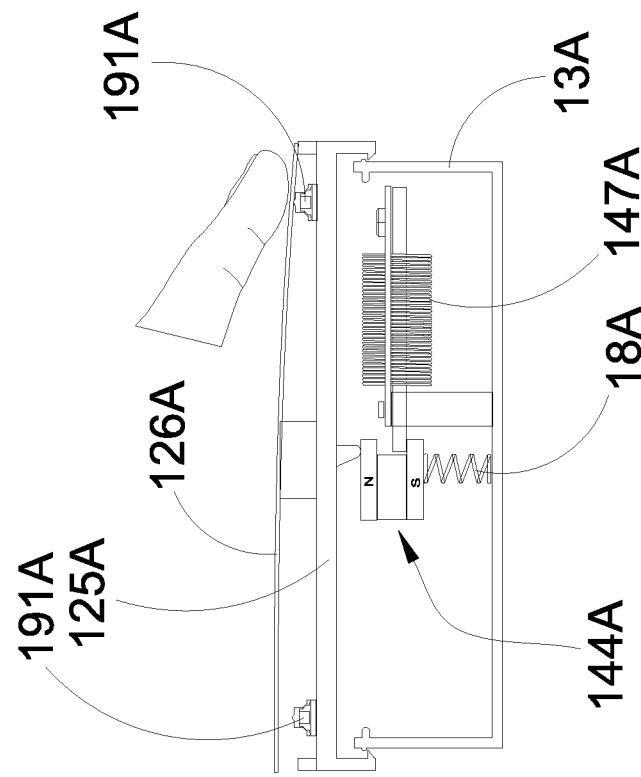

FIGS. 31A to 31B illustrate the operation of the present invention, wherein when the user's finger presses on a desired actuation area 120A of the cover panel 126A, as shown in FIG. 31A, the cover panel 126A is slightly bent to actuate the corresponding activator 191A. When the user's finger keeps pressing on the cover panel 126A, the base panel 125A is driven to move downward in order to move the magnet assembly 144A downwardly, as shown in FIG. 31B. At the same time, the magnetic attracting force between the magnet assembly 144A and the coil core 142A will generate to pull the coil core 142A downward so as to bend the resilient arms of the resilient element 141A downward. Once the base panel 125A is kept pressing until the downward movement of the base panel 125 is blocked by the supporting panel 13A, as shown in FIG. 31B, the resilient force of the resilient element 141A will transform as the reaction force to the coil core 142A. When the reaction force of the resilient element 141A is greater than the magnetic attracting force, the resilient element 141A will rapidly bend upwardly to its original form to rapidly move the coil core 142A upward, so as to rapidly change the line of the magnetic force of the coil core 142A, as shown in FIG. 31B. As a result, the magnetic coil 147A will generate a large amount of the induced current. The time for the reaction force of the resilient element 141A bounding back is about 0.002 second. It is worth mentioning that the induced current will regulated to the control panel 15A, such that the control module 19A is also powered by the regulated current. Since the corresponding activator 191A is kept pressing by the user's finger, the control module 19A will generate a corresponding control command to the control panel 15A. Therefore, the control panel 15A will send out the wireless control signal in response to the control command to the electronic control system. Accordingly, the magnetic coil 147 has about 300-1500 turns of coil wire and the energy output is about 200-800 uj.

According to the preferred embodiment, the control panel 15A comprises a signal generator 151A for generating the wireless control signal, an energy storage 152A operatively linked to the micro generator 14A for storing the electrical energy generated by the micro generator 14A and a rectifier 153A operatively linked to the energy storage 152A for rectifying the electrical energy stored in the energy storage 152A to the usable energy for the signal generator 151A.

Figure 32:
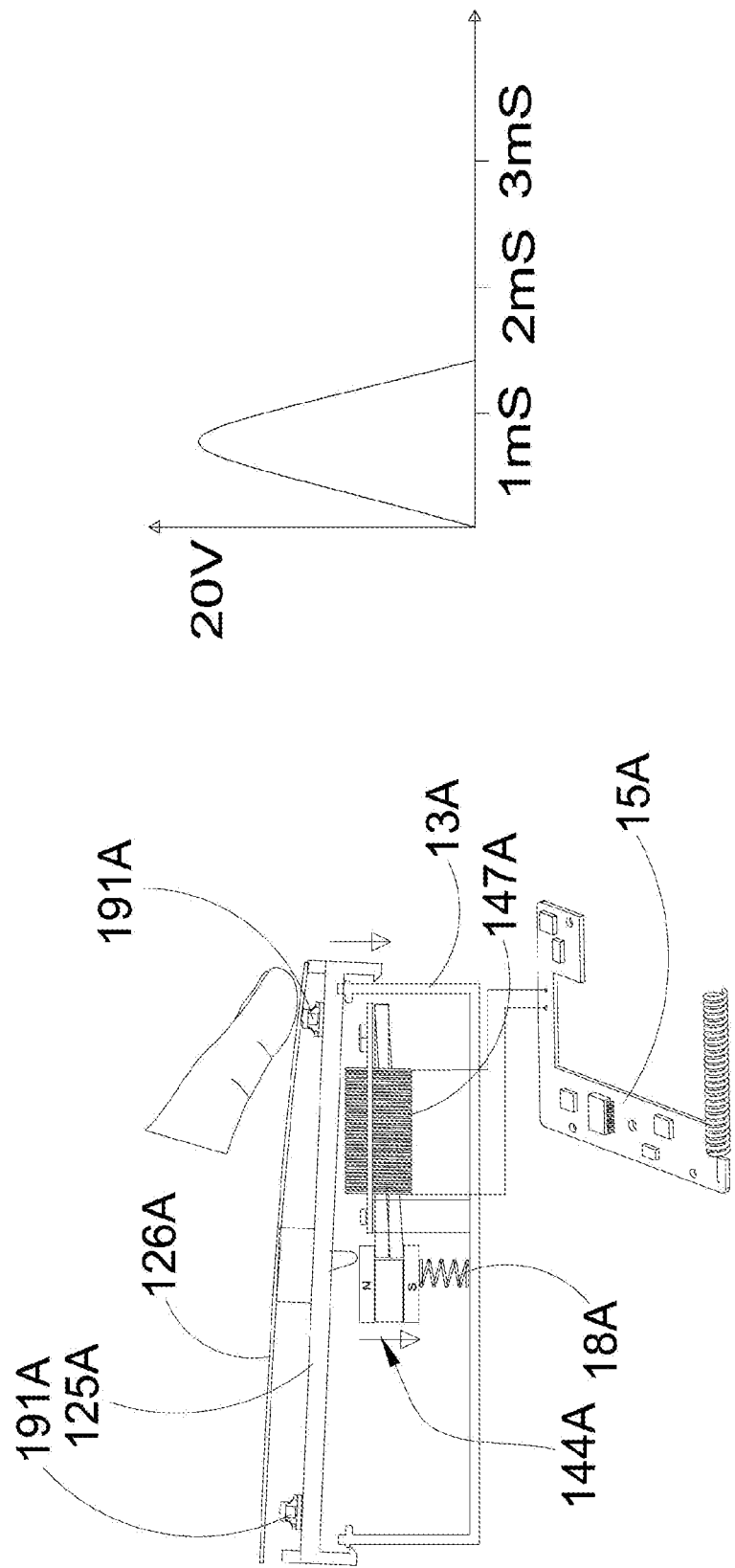
FIG. 32 is a diagram illustrating the voltage output of the micro generator of the self-powered wireless switch according to above third embodiment of the present invention.

FIG. 32 illustrates the voltage generated by the micro generator 14A. Since the voltage generated by the micro generator 14A is relatively high within a short period of time, i.e. 0.002 seconds, the peak of the voltage will be about 20V. Since the voltage workable range for the control panel 15A is about 1.8V-5V, the high voltage generated by the micro generator 14A cannot be directed to the control panel 15A. Therefore, after the voltage generated by the micro generator 14A, the control panel 15A will store the energy and regulate the voltage to control the voltage amplitude being less than 2V with an operational time larger than 6 ms for normal operation.

Figure 33:
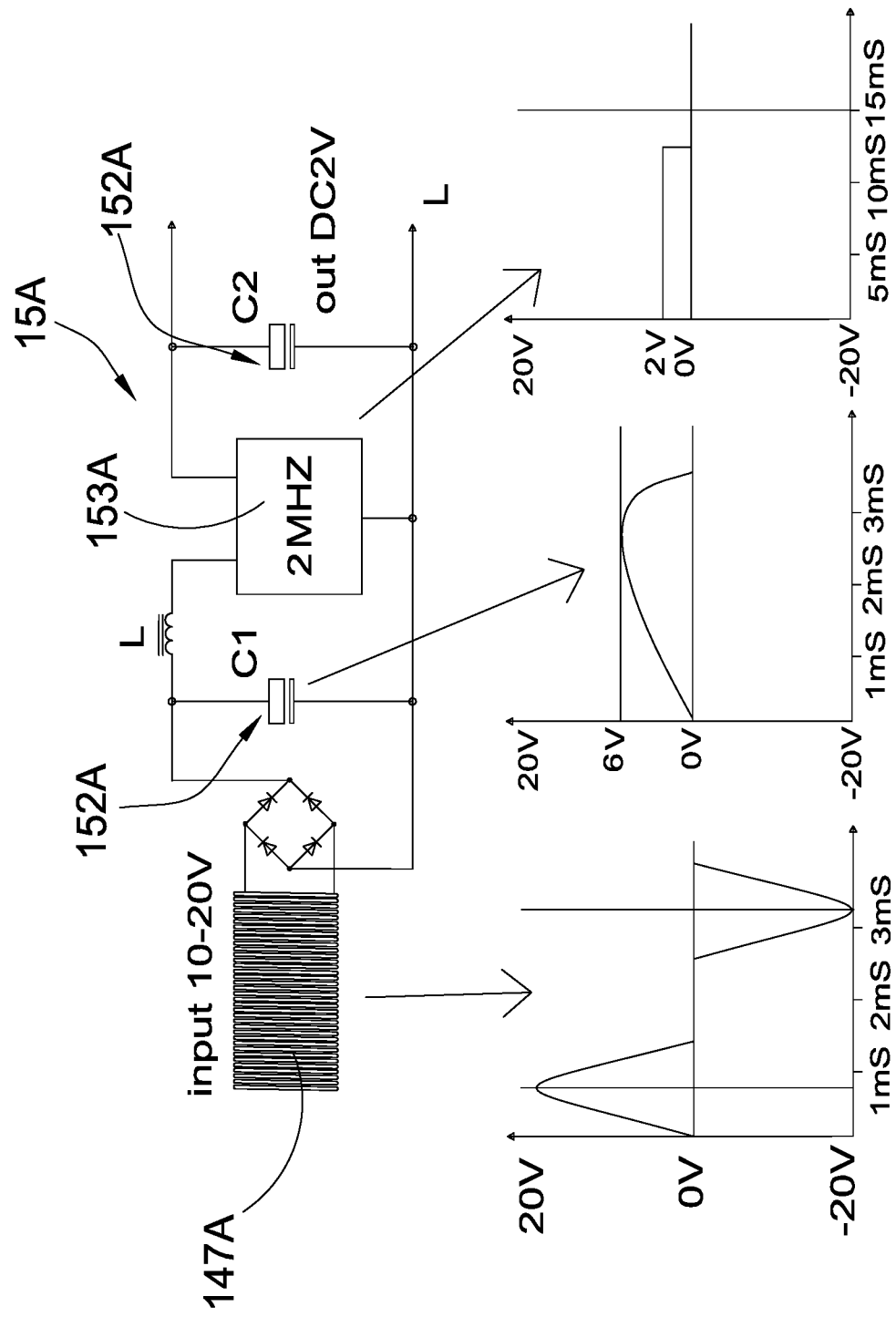
FIG. 33 illustrates the modification of the voltage output of the micro generator by the control panel according to above third embodiment of the present invention.

As shown in FIG. 33, the energy storage 152A comprises a first capacitor C1 and a second capacitor C2, and the rectifier 153A is a 2 MHz rectifier being operated to repeatedly charge and discharge the energy storage 152A via an inductor L to prolong the operation time to 12 ms. Therefore, the voltage output at the second capacitor C2 is about 2V.

Figures 34, 35:
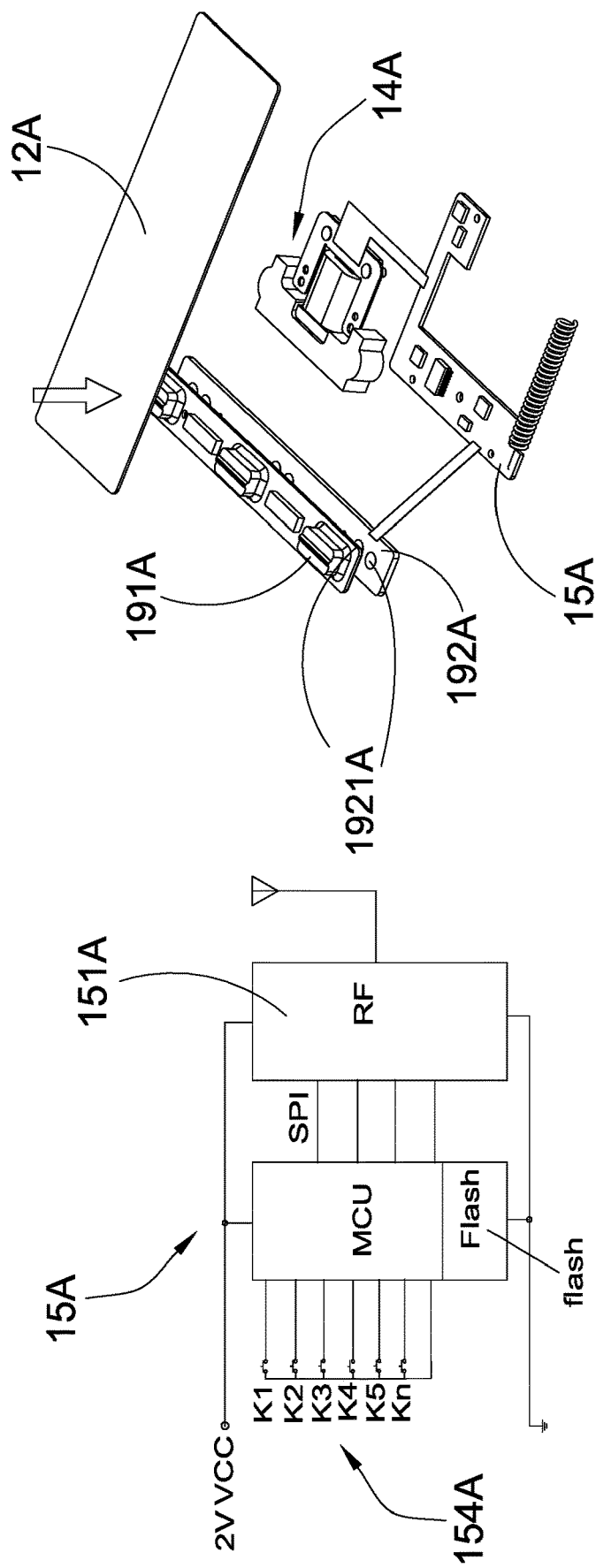
FIG. 34 is a block diagram of the control panel according to above third embodiment of the present invention.
FIG. 35 is an exploded perspective view of the self-powered wireless switch according to above third embodiment of the present invention, illustrating the relationship among the switch panel, the control module, the micro generator, and the control panel.

In order to receive the control command from the control module 19A, as shown in FIGS. 34 and 35, the control panel 15A further comprises a command collecting terminal 154A operatively linked to the control module 19A with the activators 191A, and a microcontroller unit (MCU) with a flash storage to operatively link to the command collecting terminal 154A. Accordingly, executable programs are installed into the flash storage. The signal generator 151A, according to the preferred embodiment, is a RF signal generator operatively linked to the MCU for generating the wireless control signal with the control command in RF form.

Accordingly, the above preferred embodiment of the present invention provides a method for assembling the self-powered wireless switch, wherein the method comprises the steps of assembling the control panel 15A for transmitting the wireless control signal, assembling the micro generator 14A for performing the self-powering operation and assembling the switch panel 12A for being pressed by the user to activate the self-powering operation.

In particular, the step of assembling the control panel 15A for transmitting wireless control signal further comprises steps of operatively linking the signal generator 151A to the MCU with the command receiving terminal 154A, operatively linking the power storage 152A and the rectifier 153A and further being operatively linked to the MCU, and further operatively linking the control panel 15A to the command receiving terminal 154A in the following step, wherein the control circuit board 192A provides a plurality of sets of contact electrodes 1921A.

The steps of assembling the micro generator 14A for performing the self-powering operation further comprise the following steps. Assembling the magnet assembly 144A: providing the magnet conductive panels 1442A on the two opposite sides of the permanent magnet 1443A respectively enabling the magnet conductive panel 1442A having different magnetic poles, and further disposing the permanent magnet 1443A and the magnet conductive panels 1442A within an outer supportive frame 1441A to form the magnet assembly 144A, wherein the two magnet conductive panels 1442A have protrusion portions extended out of the permanent magnet 1443A so as to form a magnetic cavity 1446A between the protrusion portions, wherein the outer supportive frame 1441A can preferably be embodied as a plastic cover 1441A enclosing the outside of the permanent magnet 1443A and the magnet conductive panels 1442A and having an opening to expose the magnetic cavity 1446A.

In the steps of coupling the magnet assembly 144A at the supporting panel 13A, couple one end of the one or more retractable resilient member 18A at the supporting panel 13A and couple the other end to the magnet assembly 144A, wherein the resilient member 18A in this preferred embodiment can be embodied as a compression spring and the opposite ends thereof are coupled to the supporting panel 13A and the plastic cover 1441A of the magnet assembly 144A respectively. Of course, it is easy to be understood for those skilled in the art that the resilient member 18As may also comprise other resilient component able to restore its original form, such as a compression spring comprising a spiral spring body and two compression feet extended from the two ends of the spiral spring body.

In the steps of assembling the coil assembly, wind the magnetic coil 147A around the core arm of the T-shaped coil core 142A, wherein the distal end 14211A of the core arm is not wound by the magnetic coil 147A, and dispose the magnet assembly 144A within the magnetic cavity 1446A. Mount the two resilient arms 1411A extended from a mid-portion 1412A of the U-shaped resilient element 141A on the retention posts extended from the supporting panel 13A and transversely extend the mid-portion 1412A of the U-shaped resilient element 141A and the T-shaped coil core 142A to the coupling arms 1422A of the core arm. As shown in FIGS. 15 and 16, the resilient element 141A can be embodied as a U-shaped elastic sheet and the resilient element 141A and the coil core 142A are arranged in an overlapped manner to locate the core arm at a position between the two resilient arms 1411A, wherein the magnetic coil 147A is correspondingly located between the two resilient arms 1411A. The length of the core arm can be longer than the resilient arm 1411A, such that the distal end 14211A thereof is adapted for being disposed within the magnetic cavity 1446A to contact the opposite poles of the magnet conductive panels 1442A respectively. It is worth mentioning that in this preferred embodiment, when the self-powered switch is on a non-operating state, the distal end 14211A of the core arm is disposed within the magnetic cavity 1446A and contacted with the lower magnet conductive panel 1442A.

In the steps of assembling the switch panel 12A, movably install the base panel 125A of the switch panel 12A on the supporting panel 13A at the blocking peripheral edge 131A thereof. In particular, the supporting panel 13A can be embodied as a bottom shell comprising a base panel body 1250A and the blocking peripheral edge 131A transversely extended from the base panel body 1250A, and a blocking protrusion 1311A further protrudedly extended from the outer side of the blocking peripheral edge 131A. The base panel 125A comprises a base panel body 1250A and an engaging portion 122A transversely extended from the base panel body 1250A and the engaging portion 122A further comprises a hooking member 1221A protrudedly extended to the inner side thereof. In the example shown in FIG. 14, the hooking member 1221A of the engaging portion 122A is engaged with the blocking protrusion 1311A of the blocking peripheral edge 131A to prevent the base panel 125A being detached from the supporting panel 13A. Further, the base panel 125A body 1250A of the base panel 125A further comprises a pusher arm 121A protrudedly extended from a mid-portion 1412A of the bottom side thereof, wherein the pusher arm 121A can be integrally formed with the base panel 125A body 1250A or installed in the magnet assembly 144A to be coupled with the outer supportive frame 1441A. When the base panel 125A is movably assembled with the supporting panel 13A, the base panel 125A and the supporting panel 13A form a receiving cavity to receive the micro generator 14A, and the pusher arm 121A is biased against the magnet assembly 144A, such that the resilient member 18A is adapted for supporting the magnet assembly 144A and the base panel 125A. As such, the switch panel 12A of the base panel 125A is a suspended depressing panel, wherein when at the non-working state, the switch panel 12A is suspendedly supported via the resilient member 18A and after the depressing operation of the user is finished, the elasticity of resilient member 18A functions to restore the switch panel 12A back to its initial non-working state.

In the following step of configuring command collecting structure, the switch panel 12A further provides a cover panel 126A installed on the base panel 125A, wherein the cover panel 126A, preferably, can be made of flexible glass and embodied as actuation panel having a plurality of effective actuation area 120A, that is, the above actuation areas 120A. In particular, install the control circuit board 192A and the corresponding activators 191A on the top of the base panel 125A, and then close the cover panel 126A, such that the control module 19A with the control circuit board 192A and the corresponding activator 191A is located between the cover panel 126A and the base panel 125A. As shown in the FIGS. 28, and 29 and FIGS. 31A to 31B, in the preferred embodiment, three cover panel 126As formed by three flexible glass sheet and one six-pressing-key board formed by six sets of contact electrodes 1921A provided by the control circuit board 192A is illustrated. The control keys can be corresponding to the off-and-on command of a same or different electronic device, or other operation commands such as setting the brightness of an illuminator, setting the temperature and adjusting the levels of an air conditioning. Those skilled in the art will understand that a pressing panel of the control circuit board 192A with any number of pressing keys and corresponding number of the activators 191A can be arranged according to a specific requirement. Preferably, the cover panel 126A can be affixed to the base panel 125A by a double-sided adhesive or other adhesive material. When the control circuit panel and the activators 191A are located between the base panel 125A and the cover panel 126A, the activators 191A are not contacted with the electrodes of the control circuit board 192A. It is worth mentioning that the base panel 125A of one switch panel 12A can correspond to a plurality of the actuation areas 120A of the keys of the pressing panel, such that the base panel 125A can be actuated by pressing any one of the actuation areas 120A to further activate the micro generator 14A to perform power generating operation.

It is easily understood that the above assembly method serves only as an example, which would not limit the scope of the present invention. The description of the assembly method is for illustrating the structure of the wireless switch of the present invention in detail, and the aforementioned specific structure are only served as an example, wherein some steps of the assembling method are not in arranged a specific order of precedence.

Accordingly, the present invention further provides a method for controlling an electronic device via the self-powered switch, wherein the self-powered switch comprises a micro generator 14A which comprises a magnet assembly 144A and a coil assembly. The magnet assembly 144A comprises a permanent magnet 1443A and a first and second magnet conductive panel located at the opposite magnetic poles at the two sides thereof. The coil assembly comprises a coil core 142A, a magnetic coil 147A wound around a core arm of the coil core 142A, and a resilient member 18A coupled to the coil core 142A. The method comprising the following steps.

(a) In responsive to the user's pressing action to the base panel 125A of the switch panel 12A, the pusher arm 121A is actuated by the base panel 125A to actuate the magnet assembly 144A to move, and at the same time, the first magnet conductive panel of the magnet assembly 144A drives the coil core 142A to move via the magnetic attraction force, such the coil core 142A is bent to store potential energy and generate an reversed rebounding force.

(b) Restore the coil core 142A to its original form to detach the coil core 142A from the first magnetic conductive panel and to contact with the second magnet conductive panel of the magnet assembly 144A, such that the magnetic induction line penetrating the coil core 142A is oppositely changed and an induced current is generated in the magnetic coil 147A correspondingly, when the rebounding force of the coil core 142A is greater than the magnetic attraction force between the coil core 142A and the first magnetic conductive panel.

(c) Transmit a control signal by the wireless signal generator 151A of the control panel 15A powered by the induced current after being stored and regulated, to further control the pre-programmed operations of the electronic device.

In the step (a) of actuating the magnet assembly 144A to move, the method further comprises a step of depressing the resilient member 18A by the magnet assembly 144A to deform the resilient member 18A, such that when the user finishes the depression action, the resilient member 18A restores to drive the magnet assembly 144A and the switch panel 12A back to its original non-operational state. In particular, when the resilient member 18A is embodied as a compression spring, the magnet assembly 144A depresses the resilient member 18A so as to compress the resilient member 18A for storing elastic potential energy and when the user finishes the depression action, the resilient member 18A stretches and restores for driving the magnet assembly 144A and the switch panel 12A back to its original non-operational state. Therefore, the magnet assembly 144A and the switch panel 12A is equipped with a restoring function and the switch panel 12A is embodied as a suspending panel, wherein when at non-operational state, the resilient member 18A provides an elastic supporting function via the magnet assembly 144A, and when an depression actuation is finished, the resilient member 18A enables the switch panel 12A back to its balanced suspending state via the elasticity thereof.

In particular, the step (a) further comprises a step of driving the magnet assembly 144A to move via the pusher arm 121A integrally extended from the base panel 125A at a mid-portion 1412A on the bottom side thereof, or driving the magnet assembly 144A to move by acting on the pusher arm 121A coupled with the magnet assembly 144A via the base panel 125A.

The first and second magnet conductive panels 1442A have opposite magnetic poles, i.e. the first magnet conductive panel has the N pole and the second magnet conductive panel has the S pole; or, the first magnet conductive panel has the S pole and the second magnet conductive panel has the N pole.

In this preferred embodiment of the present invention, when at non-operational state, the distal end 14211A of the core arm of the coil core 142A is contacted with the lower first magnet conductive panel, and when the resilient elements restores from its deformed state, and the magnet assembly 144A is kept being depressed to move the second magnetic panel to a position adjacent to the first magnet conductive panel at non-operational state, the distal end 14211A of the core arm of the coil core 142A is contacted with the second magnet conductive panel of the magnet assembly 144A, such that the magnetic induction line penetrating the coil core 142A is changed oppositely.

In addition, in the step (a), the user can depress the base panel 125A of the switch panel 12A at any point of a top surface thereof. For example, the base panel 125A, in responsive to the depression actuation on the peripheral edge of the blocking protrusion 1311A located on one side of the base panel 125A of the switch panel 12A, is moved in a lever-like manner with respect to the blocking protrusion 1311A on the other side thereof as a pivot point, such that the depression action on the peripheral edge can be effortless saving about 50% effort. The base panel 125A, in responsive to the depression actuation on the base panel 125A of the switch panel 12A at a mid-portion 1412A thereof, drives the pusher arm 121A to move, such that the hooking member 1221As on the two sides are actuated to move away from the blocking protrusion 1311A.

In this embodiment of the present invention, the above application method further comprises the step of collecting commands corresponding to the pressing keys. In particular, in the step (a), the cover panel 126A actuates the activator 191A to move to contact with the control circuit board 192A for generating pressing commands at the corresponding two spaced electrodes thereof, so as to power the activator 191A by contacting the conductor of the activator 191A with the electrodes to generate pressing command, wherein the command is further transmitted to the control panel 15A to control the pre-programmed operations of the electronic devices.

Further, in responsive to the cover panel 126A of the switch panel 12A being kept depressing by the user, the base panel 125A is actuated to move so as to activate the power generation operation of the micro generator 14A. Preferably, the cover panel 126A of the switch panel 12A is embodied as pressing panel and can be made of flexible glass for easy operation.

In addition, the control signal generated by the wireless signal generator 151A of the control panel 15A can be directly sent to the corresponding electric device, or can be sent to a smart central control unit, wherein the CPU further control the pre-programmed operations of the electronic device such as the operations of switching on or off of the electronic device, or the selection of the levels.

Figure 36:
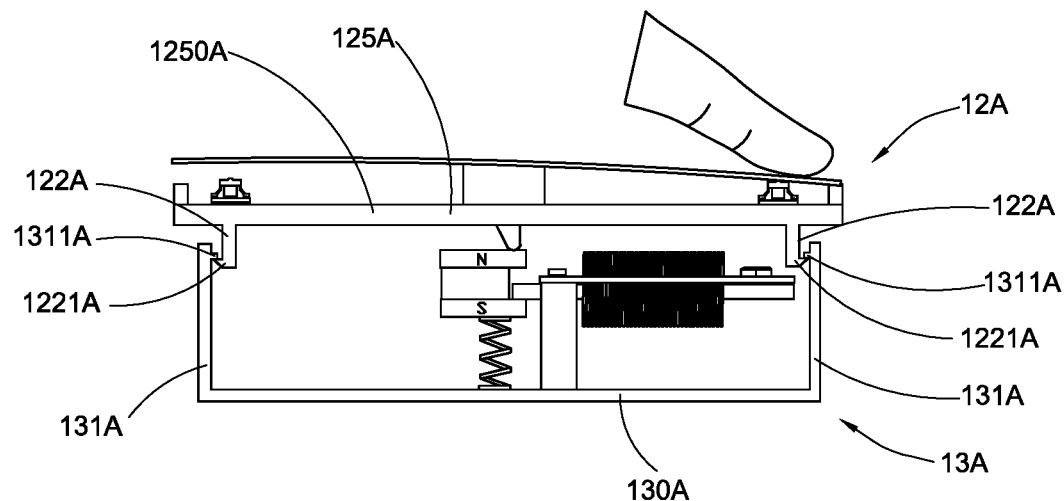
FIG. 36 illustrates an alternative mode of the switch panel movably coupled on the supporting panel in floating manner according to above third embodiment of the present invention.

FIG. 36 illustrates another alternative mode of the switch panel 12A, wherein the base panel 125A of the switch panel 12A is movably mounted on the blocking portion of the supporting panel 13A. In particular, the supporting panel 13A can be embodied as a bottom housing, wherein the bottom housing comprises a bottom panel body and the blocking portion transversely extended from the bottom panel body, and the blocking portion further has a blocking protrusion 1311A protrudedly extended from the inner wall thereof. The base panel 125A comprises a base panel 125A body 1250A and an engaging portion 122A transversely extended from the base panel 125A body 1250A, and the engaging portion 122A further comprises an elongated hooking member 1221A protruded outwardly. As shown in the example of FIG. 36, the hooking member 1221A of the engaging portion 122A is engaged with the blocking protrusion 1311A of the blocking portion so as to prevent the base panel 125A being detached from the supporting panel 13A. Similarly, a pusher arm 121A is defined on a midportion 1412A of the base panel 125A body 1250A of the base panel 125A for activating the micro generator 14A.

Therefore, when the base panel 125A of the switch panel 12A is depressed, the base panel 125A is adapted to slide at the inner side of the blocking portion of the supporting panel 13A along the inner wall thereof. In the above embodiment, the base panel 125A is adapted to slide at the outer side of the blocking portion of the supporting panel 13A along the outer wall thereof.

Figure 37:
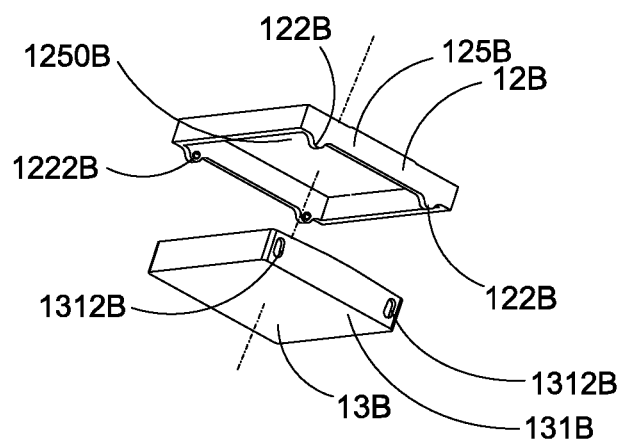
FIG. 37 is a perspective view of the self-powered wireless switch according to a fourth embodiment of the present invention.

FIG. 37 illustrates an alternative mode of the switch panel 12B movably coupled with The supporting panel 13B in a suspending manner. The base panel 125B of the switch panel 12B has an engaging portion 122B extended from the bottom side of the base panel body 1250B and a plurality of positioning protrusions 1222B, such as four positioning protrusions 122B, protruded from the inner side of the engaging portion 122B. The supporting panel 13B can be embodied as a bottom housing which comprises a bottom housing body 130B and a blocking portion 131B extended from the upper side of the bottom housing body 130B. A plurality of positioning holes 1312B are formed on the blocking portion 131B, such as four positioning holes 1312B, wherein the positioning holes 1312B can be through holes penetrating through the blocking portion 131B, or can be slots which is not completely penetrating through the blocking portion 131B. The positioning protrusions 1222B are extended into the positioning holes 1312B in a movable manner, so as to movably mount the base panel 125B on The supporting panel 13B. When the base panel 125B is depressed, the positioning protrusions 1222B are moved within the positioning holes 1312B so as to activate the micro generator via the base panel 125B.

It is appreciated that the positioning holes 1312B can be elongated holes which have a length along the moving direction of the base panel 125B. As shown in FIG. 36, the length is defined in the longitudinal direction, such that the positioning protrusions 1222B can move longitudinally within the positioning holes 1312B. Of course, the elongated holes in longitudinal direction is just an example, wherein when the self-powered switch is used as a wall switch and being installed on the wall, the switch panel 12B can be depressed in a substantially horizontal direction. In addition, those skilled in the art would easily understand that the positioning protrusions 1222B can be formed on the blocking portion 131B of The supporting panel 13B while the positioning holes 1312B can be formed on the engaging portion 122B of the base panel 125B.

Figure 38:
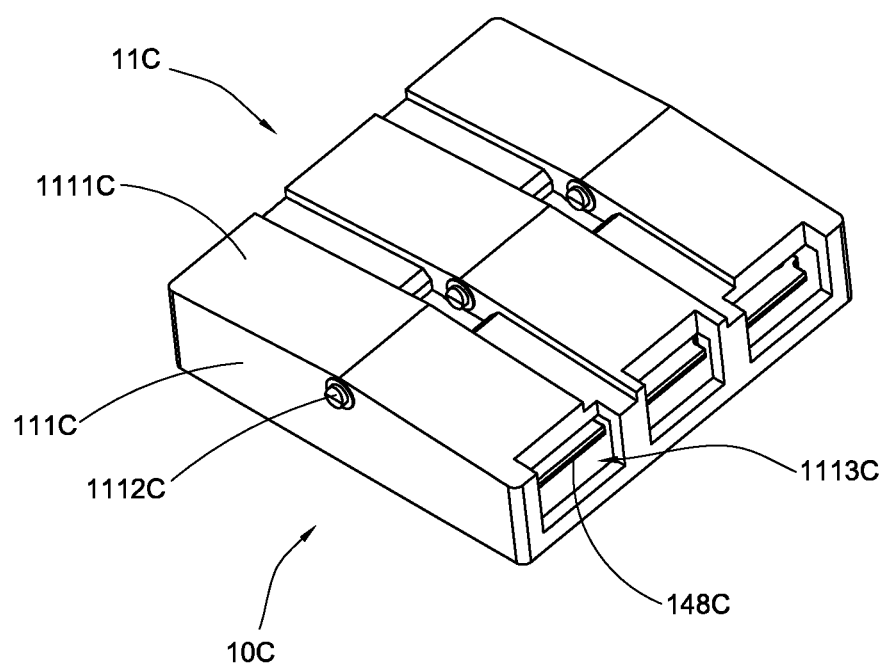
FIG. 38 is a perspective view of the self-powered wireless switch module assembly according to a fourth embodiment of the present invention.
Figure 48A:
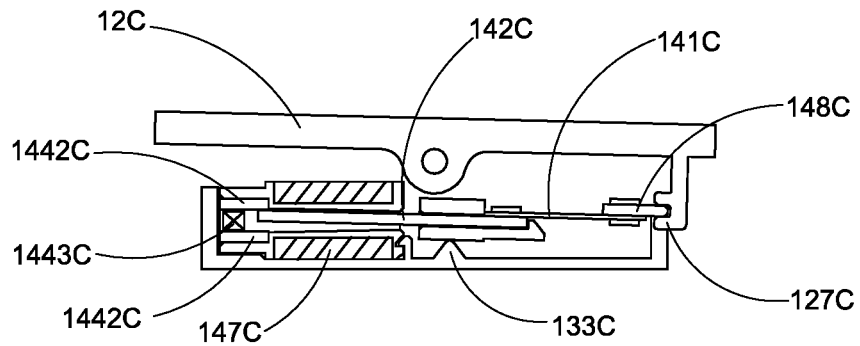
FIGS. 48A to 48C illustrate the operation of the self-powered wireless switch according to above fourth embodiment of the present invention.
Figure 48B:
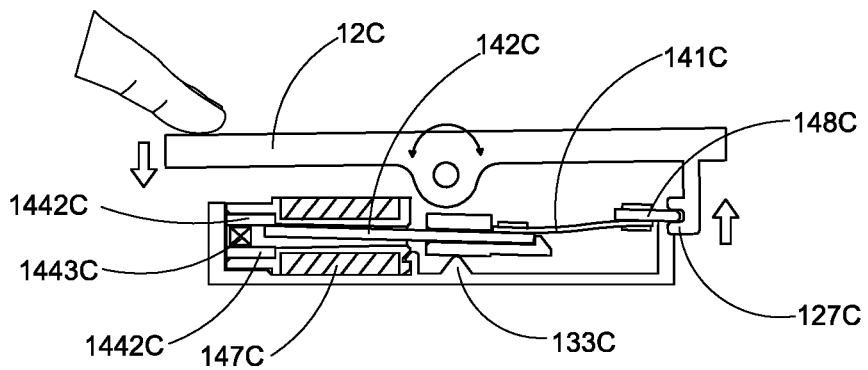
Figure 48C:
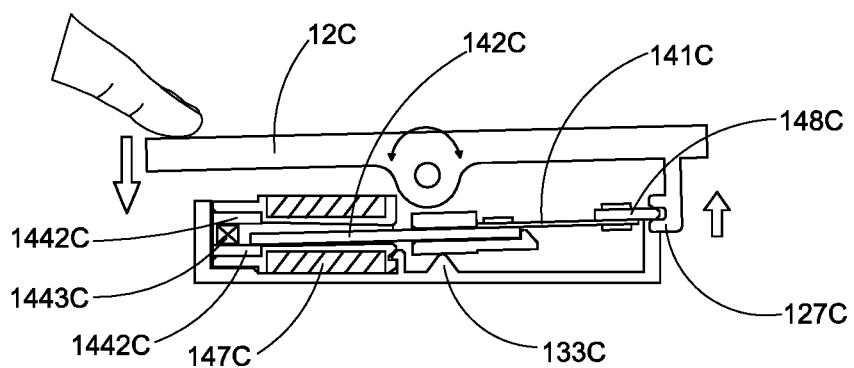

As shown in FIGS. 38 and 48C of the drawings, a self-powered wireless switch according to a fourth preferred embodiment is illustrated, wherein the power generation of the self-powered wireless switch is implemented in the principle of leverage. In particular, the self-powered wireless switch comprises a self-powered switch module assembly 10C, which is adapted for incorporating with different outer casing or actuators to develop a variety of special self-powered wireless products. In other words, the self-powered wireless switch module assembly 10C has a modular structure integrating the functions of power generation and wireless communication, such that the self-powered wireless switch module assembly 10C is suitable for the downstream manufacturers to conduct further secondary development according to actual needs or preferences, while the downstream manufacturers do not need to understand the power generation and wireless communication principles of the self-powered wireless switch module assembly 10C. The size and shape of the self-powered wireless switch manufactured with the self-powered wireless module assembly can be the same with the conventional wire-type switch, such that the conventional wire-type switch can be replaced thereby.

In particular, as shown in FIGS. 38 to 47, the self-powered switch module assembly 10C comprises a module cover 11C, a module supporting panel 13C, and a micro generator 14C and a control panel 15C, wherein the cover 11C and the supporting panel 13C are incorporated to form module housing for receiving the micro generator 14C and the control panel 15C operatively linked with the micro generator 14C. Similarly, the micro generator 14C can perform power generation to transform mechanical energy into electrical energy so as to power the control panel 15C. The structure of the control panel 15C is similar to the structure of the control panel 15C in the above embodiments and comprises the above power storage 152A, rectifier 153A, micro generator 14C, and wireless signal generator 151A, such that the control panel 15C, after being powered, could send control signal to control the pre-programmed operations of the corresponding electronic device.

In the embodiment of the present invention, in particular, the cover 11C further comprises one or more interconnected cover members 111C, wherein the cover member 111C comprises a cover body 1111C formed by a plurality of inter-coupled side panels and a retaining shaft 1112C protrudedly extended from the cover body 1111C at the two sides thereof. An opening 1113C is formed on one end of the cover body 1111C, as shown in FIGS. 38, 39, 40 and 45.

The self-powered wireless switch module assembly 10C of the present invention is adapted for being incorporated with one or more switch panels 12C, wherein the switch panels 12C are embodied as pressing panels. Each switch panel comprises a base panel 125C, an engaging portion 122C extended from the base panel 125C at the bottom side of an end portion thereof and a positioning portion 127C inwardly extended from the engaging portion 122C. The positioning portion 127C further comprises two positioning members 1271C and positioning groove 1271C formed therebetween. Each switch panel 12C at the two sides thereof further comprises a mounting portion 128C extended from the bottom side of the base panel 125C at a mid portion thereof. A mounting hole 1281C is formed at the mounting portion 128C, wherein the mounting hole 1281C can be a through-hole penetrating through the mounting portion 128C or be a groove which is not penetrating through the mounting portion 128C.

The switch panels 12C are coupled with the cover members 111C respectively via alignedly engaging the two retaining shaft 1112C with the two mounting holes 1281C correspondingly in such a manner that the switch panel 12C is adapted to be rotated around the retaining shaft 1112C. Those skilled in the art would understand that the mounting holes 1281C can be formed on the cover members 111C while the retaining shaft 1112C can be formed on the switch panels 12C. Such engaging means is easy to assembly and enables the switch panel 12C to move in relation to the cover members 111C.

Figure 39:
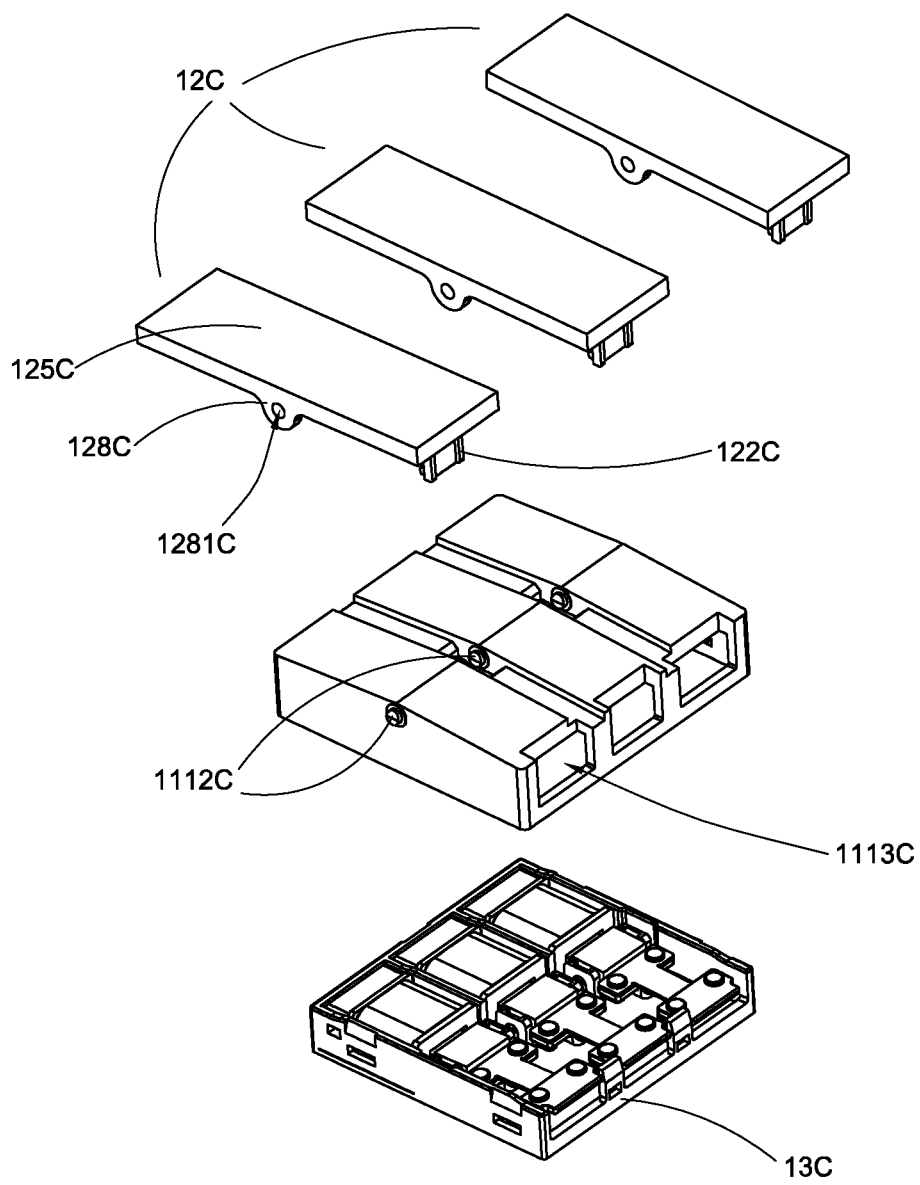
FIG. 39 is an exploded perspective view of the self-powered wireless switch according to the above fourth embodiment of the present invention.
Figure 40:
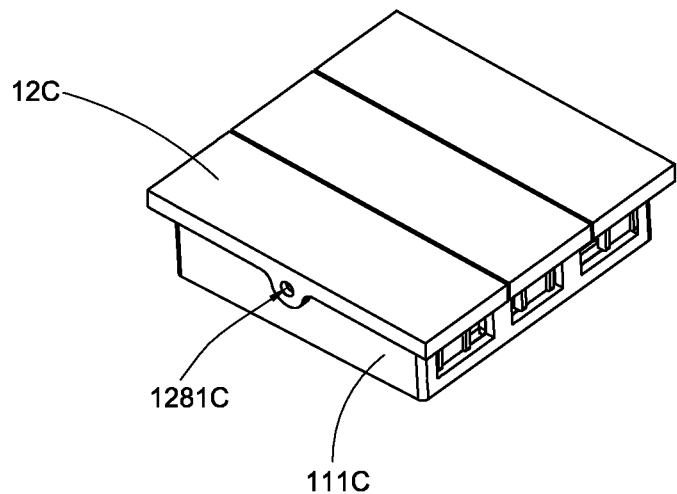
FIG. 40 illustrates the self-powered wireless switch module assembly incorporated with the pressing panel of the self-powered wireless switch according to a fourth preferred embodiment.

As shown in FIGS. 38 to 40, in this preferred embodiment, the switch panel 12C comprises three independent base panels 125C, that is, three pressing panels, and three independent micro generator 14Cs configured corresponding to the three base panels 125C respectively. In other words, three independent switches are provided, wherein each switch could function independently. It is worth mentioning that the embodiment with three independent switches is just an example and one, two, or more switches maybe required according to the actual needs.

As shown in FIGS. 41 to 47, each micro generator 14C comprises a magnet assembly 144C, a coil core 142C, a magnetic coil 147C, a resilient member 141C, and a swinging arm 148C. In particular, the magnet assembly 144C comprises a permanent magnet 1443C, two magnet conductive panels 1442C symmetrically located at the opposite poles, i.e. an N pole and an S pole, of the permanent magnet 1443C at the two sides thereof, and an outer supportive frame 1441C, wherein the outer supportive frame 1441C has a interior cavity 1444C for receiving the permanent magnet 1443C and the two magnet conductive panels 1442C. The two magnet conductive panels 1442C, a first magnet conductive panel 1442C and a second magnet conductive panel 1442C, have opposite poles, i.e. the first magnet conductive panel 1442C has the N-pole and the second magnet conductive panel 1442C has the S-pole or the first magnet conductive panel 1442C has the S-pole and the second magnet conductive panel 1442C has the N-pole. Similarly, the length of each magnet conductive panel 1442C is longer than the length of the permanent magnet 1443C to form a magnetic cavity 1446C between the protrusion portions of the two magnet conductive panels 1442C, wherein the outer supportive frame 1441C encloses the permanent magnet 1443C and the two magnet conductive panels 1442C while exposing the magnetic cavity 1446C to the exterior. It is worth mentioning that in this preferred embodiment of the present invention, the magnet assembly 144C can be affixed to the supporting panel 13C, i.e. by affixing the outer supportive frame 1441C to the supporting panel 13C via a proper fastening means such as screw and nut. In other words, unlike the above-mentioned embodiments that the magnet assembly 144C is mounted on a resilient member 141C, the resilient member 141C is not required in this embodiment to provide the restoring function.

The coil core 142C comprises a core arm 1421C and an engaging arm 1422C transversely extended from the core arm 1421C at the proximate end thereof, such that in this preferred embodiment, the coil core 142C has a T-shape. The magnetic coil 147C is wound around the core arm 1421C of the coil core 142C, while the distal end of the coil core 142C is not wound by the magnetic coil 147C and extended to the magnetic cavity 1446C of the magnet assembly 144C. It is worth mentioning that, in this preferred embodiment, a coil supportive frame 1447C is coupled with the outer supportive frame 1441C of the magnet assembly 144C, wherein the coil supportive frame 1447C, preferably, has a one-piece structure, and encloses the core arm 1421C, while the magnetic coil 147C is wound around the coil supportive frame 1447C.

The resilient member 141C is coupled to the coil core 142C. In particular, the resilient member 141C is affixed to coil core 142C at the engaging arms 1442C thereof to form an elongated structure. In other words, unlike the overlapped structure of the resilient member 141C and the coil core 142C described in the third preferred embodiment. The resilient member 141C and the coil core 142C are interconnected to form the elongated structure, such that the length of the whole structure is lengthened after the resilient member 141C coupling to the coil core 142C. In this preferred embodiment, the resilient member 141C can be embodied as resilient sheet made of restorable material. It is easily to be understood that similarly, the resilient member 141C, in other embodiments, can be coupled with the coil core 142C in an overlapped manner.

In particular, in this preferred embodiment of the present invention, the resilient member 141C comprises a resilient arm 1413C at a mid-portion thereof, and a mounting arm 1414C integrally extended from the resilient arm 1413C at the two ends thereof to from a substantially H-shape structure. The mounting arms 1414C at one end thereof are overlappedly affixed to the engaging arms 1442C of the coil core 142C via one or more fastening members, such as screws or rivets. Accordingly, a plurality of first mounting holes 1281C for mounting the fastening members are provided on the engaging arms 1442C of the coil core 142C and mounting arms 1414C respectively.

The swinging arm 148C is further coupled to the opposite end of the resilient member 141C, such that the coil core 142C, the resilient member 141C, and the swinging arm 148C are orderly interconnected to form an elongated structure. In particular, in this preferred embodiment, one end of the swinging arm 148C is coupled to the mounting arm 1414C at the other end of the resilient member 141C via one or more second fastening members, such as screws or rivets. Accordingly, a plurality of second mounting holes 1281C for mounting the second fastening members are provided on the mounting arms 1414C and one end of the swinging arm 148C respectively.

The other end of the swinging arm 148C are extended to penetrate through the opening 1113C of the cover member 111C, such that the positioning portion 127C extended from the engaging portion 122C of the switch panel 12C is adapted for being coupled with the other end of the swinging arm 148C. In particular, the other end of the swinging arm 148C is alignedly located at the positioning groove 1271C of the positioning portion 127C, such that when the switch panel 12C is pressed, the micro generator 14C is actuated by the positioning portion 127C to perform power generation, which will be further described in the followings. Those skilled in the art would understand that the other end of the swinging arm 148C can be embodied to have the same structure with the positioning portion 127C, that is, the swinging arm 148C has the positioning groove 1271C and the positioning portion 127C can be a protrusion extended from the engaging portion 122C for positioning the positioning groove 1271C of the swinging arm 148C. Surely, the engaging portion 122C of the switch panel 12C and the swinging arm 148C can be detachably coupled with each other by other detachable engaging means. It is worth mentioning that the detachable engaging means for interconnecting the engaging portion 122C of the switch panel 12C and the swinging arm 148C enables the self-powered wireless switch module assembly 10C can be adapted for incorporating with different self-designed switch during secondary development, and when no second development is needed, the swinging arm 148C can be integrally coupled with the engaging portion 122C.

In addition, the coil core 142C further comprises a core cover 1448C, wherein the core cover 1448C has a retention shaft 1449C. The core cover 1448C is sleeved onto core arm 1421C of the coil core 142C at a position adjacent to the coil frame 1447C and selectively coupled with the coil frame 1447C. It is important to mention that the core cover 1448C and the coil frame 1447C can be integrally formed.

Figure 41:
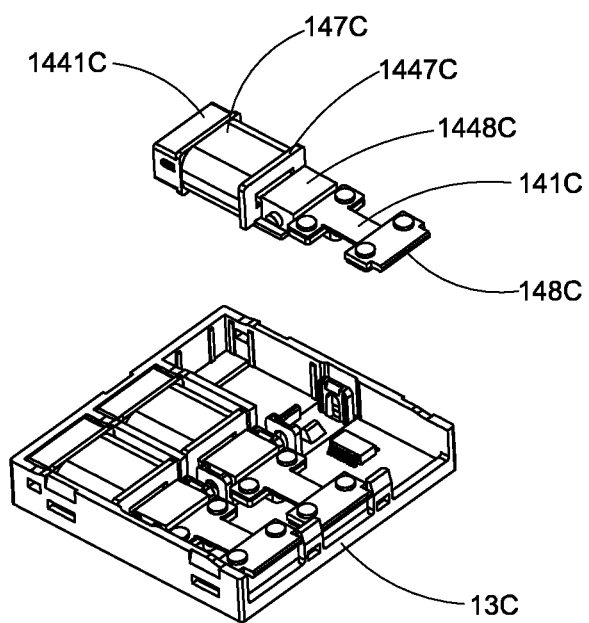
FIG. 41 is a perspective view of the inner structure of the self-powered wireless switch module assembly of the self-powered wireless switch according to the above fourth preferred embodiment of the present invention.
Figure 42:
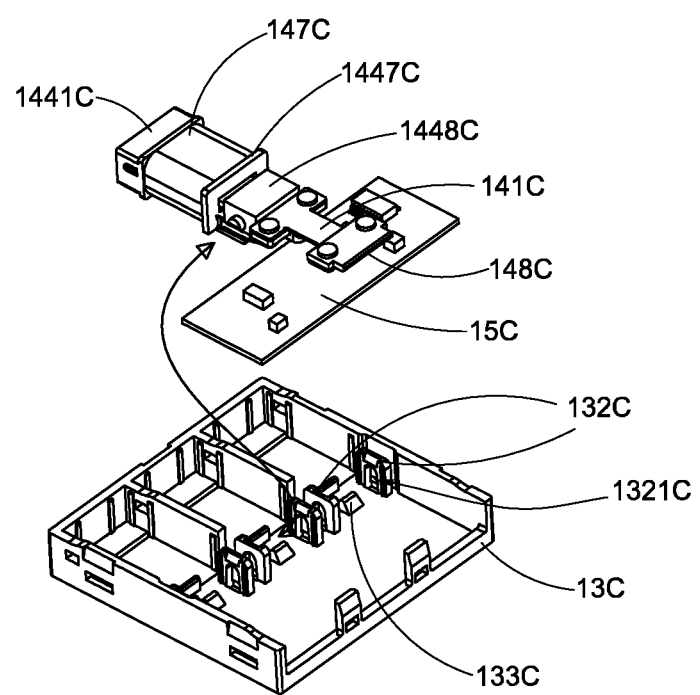
FIG. 42 illustrates the micro generator of the self-powered wireless switch incorporated with the supporting panel according to the above fourth preferred embodiment of the present invention.
Figure 43:
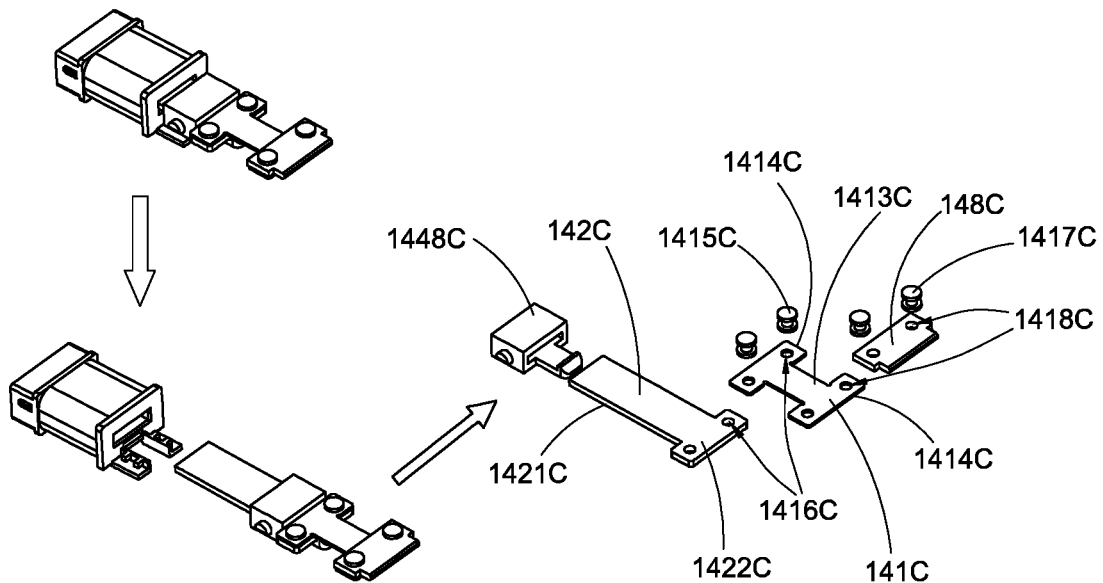
FIG. 43 is an exploded perspective view of the micro generator of the self-powered wireless switch according to the above fourth preferred embodiment of the present invention.
Figure 44:
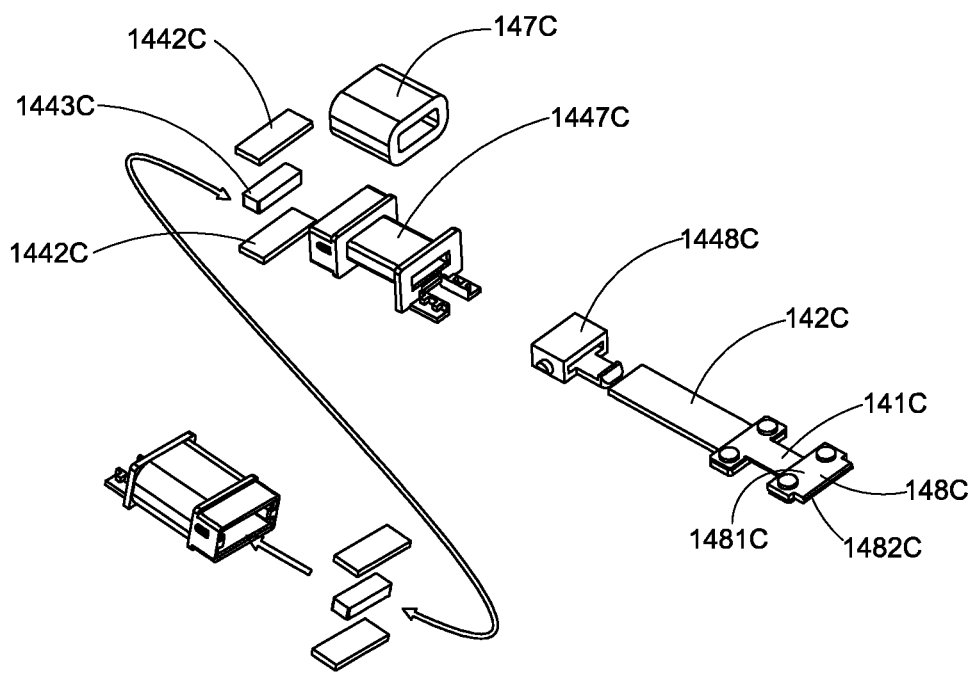
FIG. 44 is a perspective view of the magnet assembly of the micro generator of the self-powered wireless switch according to the above fourth preferred embodiment of the present invention.
Figure 45:
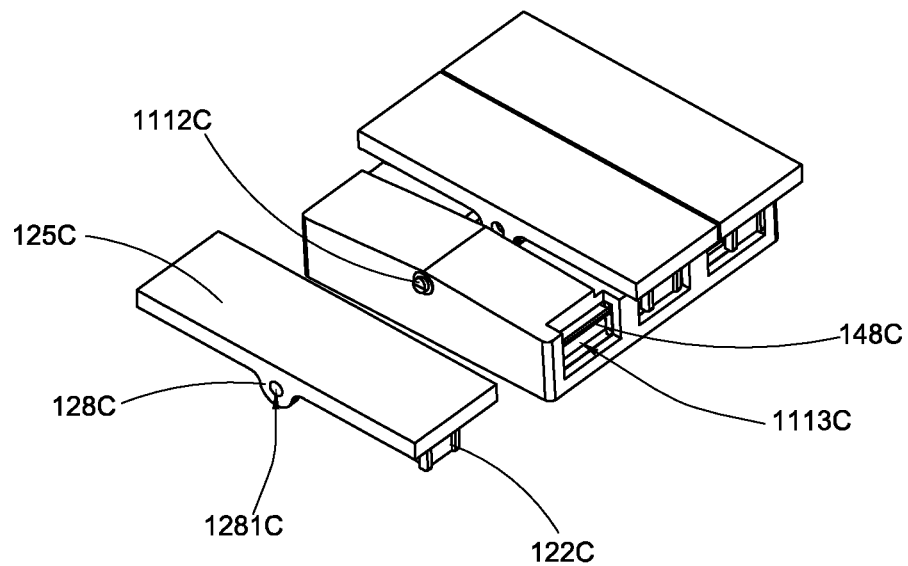
FIG. 45 illustrates the process of assembling the pressing panel with the self-powered wireless switch module assembly of the self-powered wireless switch of the above fourth preferred embodiment.
Figure 46:
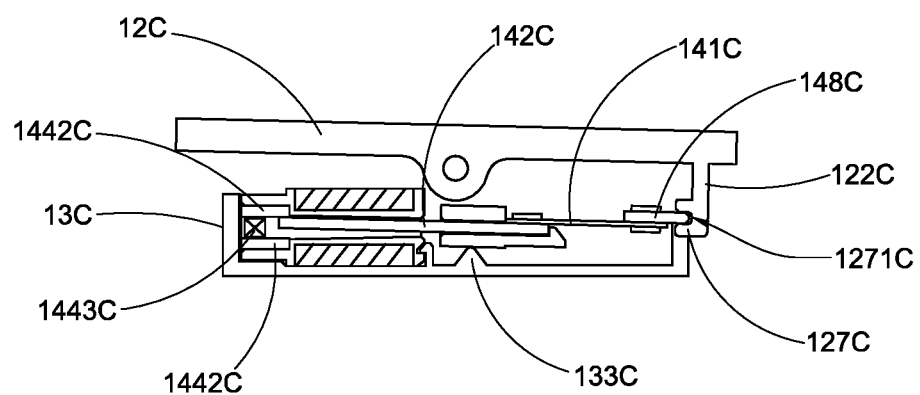
FIG. 46 is an amplified sectional view of the structure of the self-powered wireless switch when the pressing panel is incorporated with the self-powered wireless switch module assembly, according to the fourth embodiment of the present invention.
Figure 47:
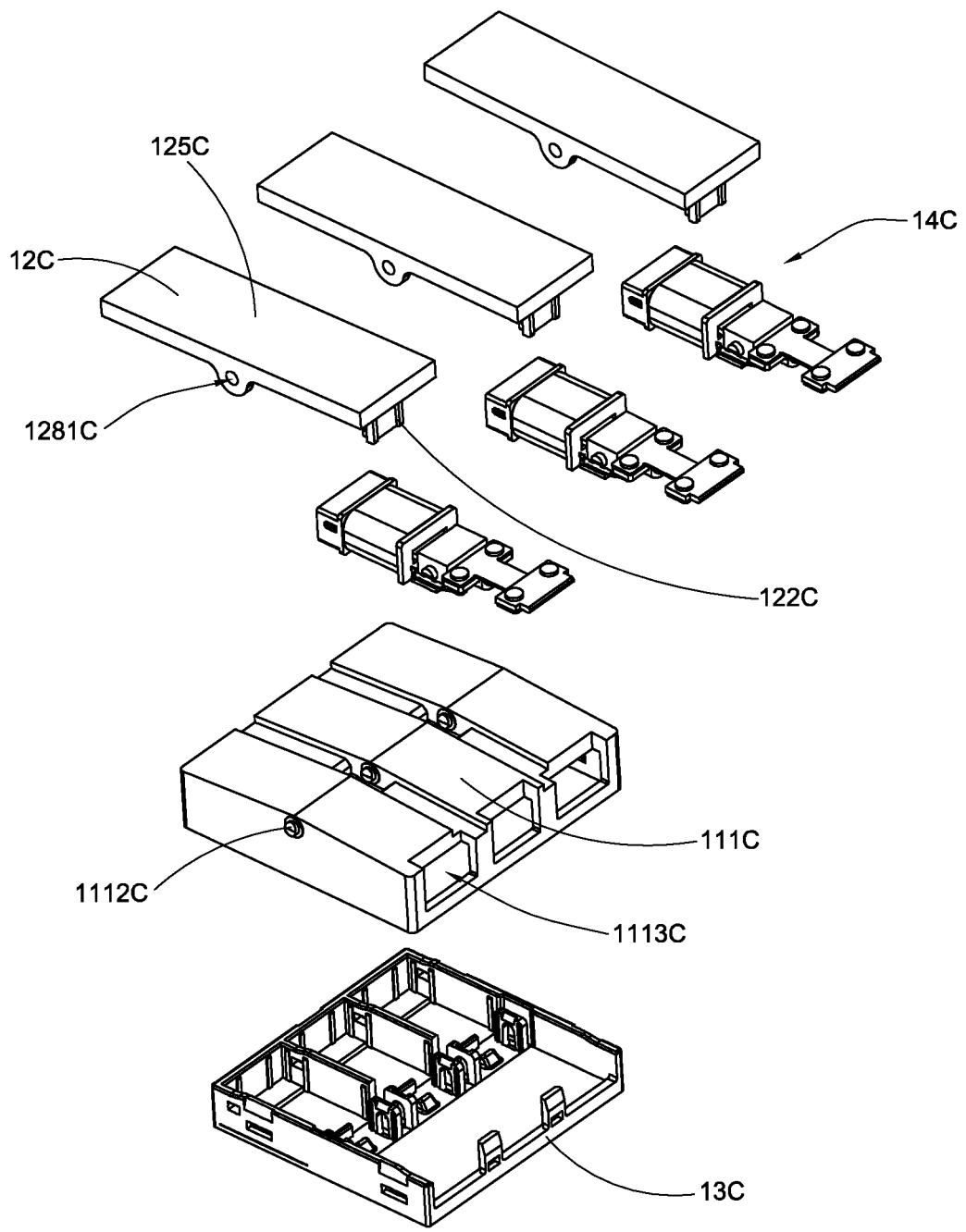
FIG. 47 is a perspective view of the self-powered wireless switch with a plurality of sets of independent micro generators.

As shown in FIGS. 41 and 42, the supporting panel 13C comprises a plurality of posts 132C extended from the upper side of the bottom panel body 130C, wherein each post 132C forms a retention slot 1321C and a pivot portion 133C, protrudedly extended from the bottom panel body 130C, is formed between each two adjacent posts 132C. As such, the core cover 1448C is incorporated with the posts 132C to slidably mount the retention shaft 1449C at the two sides thereof into the corresponding two retention slots 1321C of the posts 132C, so as to sandwich an independent micro generator 14C between the two corresponding posts 132C, wherein the micro generator 14C is further supported on the pivot portion 133C. The movement of the coil core 142C is limited by the length of the retention slots 1321C of the posts 132C.

The core cover 1448C is arranged to be supported on the pivot portion 133C, instead of directly contacting with the bottom panel body 130C of the supporting panel 13C. Preferably, the pivot portion 133C has a conical structure, that is, the size thereof is gradually decreased from the bottom side to the top side. The pivot portion 133C forms a lever fulcrum for allowing the coil core 142C to rotate therearound.

As shown in FIGS. 48A to 48C, the operation method of the self-powered wireless switch is described as follows. At a non-operation state, the distal end of the core arm 1421C of the coil core 142C is located between the two magnet conductive panels 1442C and contacted with the upper first magnet conductive panel 1442C. When the base panel 125C of the switch panel 12C is pressed by the user at a left side thereof, the base panel 125C of the switch panel 12C is rotated around the retaining shaft 1112C of the cover member 111C of the self-powered wireless switch module assembly 10C to tilt the right side of the base panel 125C so as to pull the engaging portion 122C, such that the swinging arm 148C is actuated to move and the resilient member 141C is deformed to generate a resilient force acting on the proximate end of the coil core 142C enabling the coil core 142C to rotate with respect to the pivot portion 133C as a level fulcrum and the distal end of the core arm 1421C to move away from the upper first conducive panel to contact with the lower second magnet conductive panel 1442C. Therefore, the magnetic induction line penetrating through the coil core 142C is oppositely changed, such that an induced current is generated thereby to finish the power generation for powering the control panel 15C. The control panel 15C further sends out a control signal to control the operations of the corresponding electronic device.

Figure 49A:
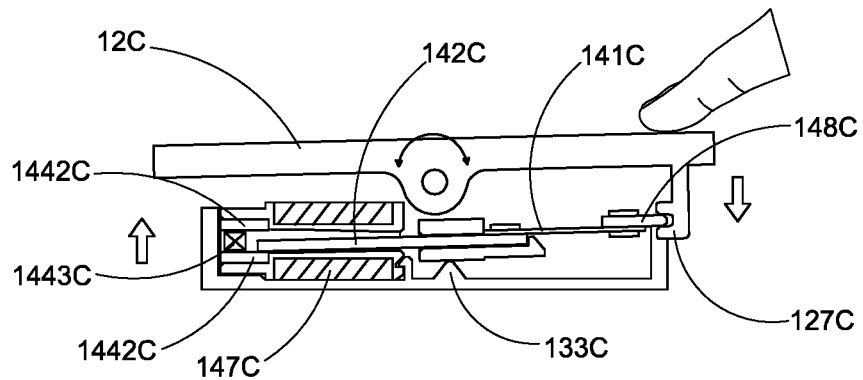
FIGS. 49A to 49C illustrate another operation of the self-powered wireless switch according to above fourth embodiment of the present invention.
Figure 49B:
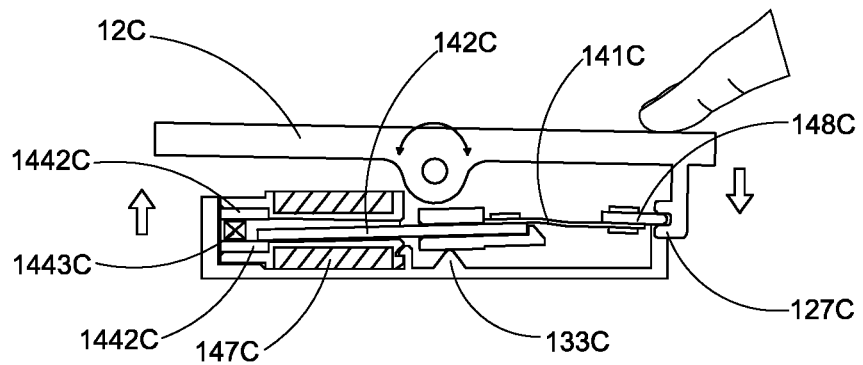
Figure 49C:
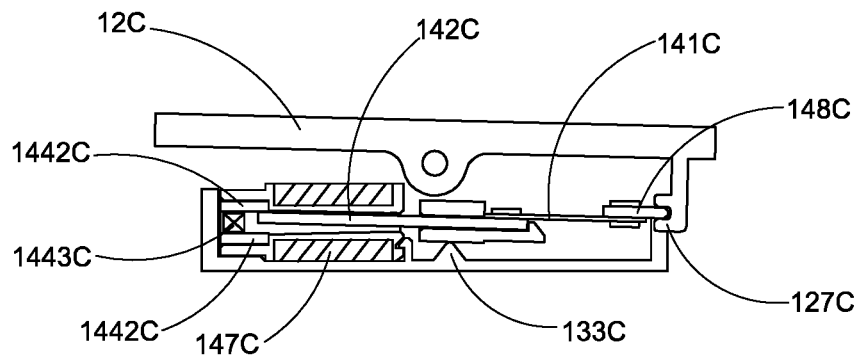

As shown in FIG. 49A to FIG. 49C, in the non-operational state as shown in FIG. 49A, the distal end of the core arm 1421C of the coil core 142C is located between the two magnet conductive panels 1442C and contacted with the lower second magnet conductive panel 1442C. When the base panel 125C of the switch panel 12C is pressed by the user at a right side thereof, the base panel 125C of the switch panel 12C is rotated around the retaining shaft 1112C of the cover member 111C of the self-powered wireless switch module assembly 10C to tilt the left side of the base panel 125C so as to move the engaging portion 122C, such that the swinging arm 148C is actuated to move and the resilient member 141C is deformed to generate a resilient force acting on the proximate end of the coil core 142C enabling the coil core 142C to rotate with respect to the pivot portion 133C as a level fulcrum and the distal end of the core arm 1421C to move away from the lower second magnet conductive panel 1442C to contact with the upper first magnet conductive panel 1442C. Therefore, the magnetic induction line penetrating through the coil core 142C is opposite changed, such that an induced current is generated thereby to finish the power generation for powering the control panel 15C. The control panel 15C further sends out a control signal to control the operations of the corresponding electronic device.

It is worth mentioning that the operation process as shown in FIGS. 48A to 48C and FIGS. 49A to 49C can be opposite commands for controlling the electronic device, i.e. corresponding to the on-and-off operations thereof. The movement illustrated in the drawings is just an example, which is not a limitation in the present invention. In the actual application, the self-powered wireless switch can be straightly installed in the wall, such that the user is able to press the switch panel 12C horizontally.

It is worth mentioning that in this preferred embodiment, a plurality of independent micro generators 14C can operatively linked to a same control panel 15C or can be linked to an individual control panel 15C respectively. A plurality of independent switch assemblies is respectively formed by the independent micro generators 14C and the switch panels 12C, wherein each of switch assemblies is adapted for generating different control signals for controlling one electronic device or controlling different electronic device according to actual needs.

Accordingly, an assembling method for the self-powered wireless switch according to the fourth embodiment is illustrated, wherein the method further comprises the steps of assembling the self-powered wireless switch module assembly 10C for performing the operations of power generation and wireless communication, and assembling the switch panel 12C, designed according to the self-powered wireless switch module assembly 10C, with the self-powered wireless switch module assembly 10C. The step of assembling the self-powered wireless module assembly further comprises the steps of assembling the control panel 15C for regulating the electrical energy and sending out wireless control signal, and assembling the micro generator 14C for performing the power generation.

In particular, in the steps of assembling the control panel 15C for sending out wireless control signal, the structure of the control panel 15C is similar to that of the control panel 15C of the third preferred embodiment, such that the steps further comprise the steps of operatively linking the signal generator 151A to the MCU, operatively linking the power storage 152A with the rectifier 153A and further operatively linking the rectifier 153A with the MCU.

The steps of assembling the micro generator 14C for performing the power generation further comprise the steps of assembling the magnet assembly 144C. In particular, the step of assembling the magnet assembly 144C further comprises the steps of providing two magnet conductive panels 1442C at the opposite sides of the permanent respectively, such that the two magnet conductive panels 1442C have different magnetic poles, and disposing the permanent magnet 1443C and the magnet conductive panels 1442C within the outer supportive frame 1441C of an one-piece frame to form the magnet assembly 144C. Each of the two magnet conductive panel 1442C have a protrusion portion extended out of the permanent magnet 1443C so as to from a magnetic cavity 1446C between the two protrusion portions. The outer supportive frame 1441C can be embodied as a plastic cover enclosing the exterior of the permanent magnet 1443C and the magnet conductive panels 1442C and having an opening 1113C to expose the magnetic cavity 1446C. The one-piece frame comprises the outer supportive frame 1441C for receiving the permanent magnet 1443C and the magnet conductive panels 1442C and a coil frame 1447C. The outer supportive frame 1441C further can be affixed on the supporting panel 13C for prevent unwanted movement.

The steps of assembling the micro generator 14C further comprise the steps of assembling the coil assembly. In particular, the step of assembling the coil assembly further comprises the steps of coupling one end of the swinging arm 148C to the mounting arms 1414C of the H-shaped resilient member 141C via fastening members respectively, coupling the mounting arms 1414C of the resilient member 141C at the opposite side thereof to the engaging arms 1442C of the T-shaped coil core 142C, sleeving the core cover 1448C at the core arm 1421C of the T-shaped coil core 142C, winding the magnetic coil 147C around the one-piece frame at the coil frame 1447C thereof, winding the magnetic coil 147C around the core arm 1421C of the coil core 142C to a position adjacent to the core cover 1448C; extending the core arm 1421C of the T-shaped coil core 142C to distal end of the core arm 1421C, such that the core arm 1421C is disposed within the magnetic cavity 1446C to contact with the upper first magnet conductive panel 1442C, locating the positing shaft of the core cover 1448C at the two sided thereof at the retention slot 1321Cs of each two post 132C at a position that the core cover 1448C is supported on the pivot portion 133C. The magnetic coil 147C is further linked to the power storage 152A of the control panel 15C for generate electrical energy to power the control panel 15C thereby. It is worth mentioning that a difference is existed between this preferred embodiment and the third preferred embodiment that when the self-powered switch is at non-operational state, the distal end of the core arm 1421C is disposed within the magnetic cavity 1446C and contacted with the lower magnet conductive panel 1442C in the third embodiment, while in this preferred embodiment, the distal end of the core arm 1421C is disposed within the magnetic cavity 1446C and contacted with the upper magnet conductive panel 1442C.

Further, assembly the module cover 11C on the supporting panel 13C, such that the micro generator 14C is received in the housing formed by the module cover 11C and the supporting panel 13C and the other end of the swinging arm 148C is extended out of the cover member 111C from the opening 1113C thereof. As such, a self-powered wireless switch module assembly 10C able to perform the operations of power generation and wireless communication is formed.

In the step of assembling the switch panel 12C, the mounting holes 1281C at the two sides of the base panel 125C of the switch panel 12C is engaged with the retaining shaft 1112C at the two sides of the cover member 111C respectively, such that the base panel 125C is movably mounted on the cover member 111C and the positioning portion 127C defined on engaging portion 122C at one side of the base panel 125C is affixed to the other end of the swing arm. The size and shape of the retention slot 1321C of the positioning portion 127C is adapted for being engaged with the other end of the swinging arm 148C, i.e. via an interference fitting manner. In this preferred embodiment, the base panels 125C of the three switch panels 12C are respectively coupled with the three independent micro generators 14C.

It is easily to be understood that the self-powered wireless switch module assembly 10C of the self-powered switch and the assembling method of the switch panel 12C are just examples, which would not limit the scope of the present invention. The above-described assembling method is mainly for illustrating the structure of the wireless switch of the preferred embodiment in detail and the structure of the self-powered wireless switch is just an example, wherein the order of some steps in the assembling method can be changed accordingly. In addition, the assembling of the switch panel 12C can be executed by downstream manufactures.

Accordingly, a method for controlling the electronic device via a self-powered wireless switch is illustrated, wherein the self-powered wireless switch comprises the self-powered wireless switch module assembly 10C and one or more switch panels 12C. The self-powered wireless switch module assembly 10C comprises a micro generator 14C which comprises a magnet assembly 144C and coil assembly. The magnet assembly 144C comprises a permanent magnet 1443C and a first and second magnet conductive panel 1442C, having opposite magnetic poles, located at the two sides of the permanent magnet 1443C. The coil assembly comprises a coil core 142C, a magnetic coil 147C wound around the periphery of the core arm 1421C of coil core 142C, a resilient member 141C affixed to the coil core 142C, and a swinging arm 148C affixed to the resilient member 141C, wherein the switch panel 12C comprises a positioning portion 127C coupled with the swinging arm 148C. The controlling method comprises the following steps of.

(A) In responsive to the pressing action on the top surface of the base panel 125C of the switch panel 12C at a position away from the positioning portion 127C, the movement of the positioning portion 127C drives the swinging arm 148C to move, such that the resilient element is deformed to generate a rebounding force.

(B) When the rebounding force is greater than the magnetic attraction force between the upper first magnet conductive panel 1442C and the coil core 142C, the resilient member 141C restores to its original form and actuate the coil core 142C to detach from the first magnet conductive panel 1442C and to contact with the lower second magnet conductive panel 1442C, such that the magnetic induction line penetrating through the coil core 142C is oppositely changed and the magnetic coil 147C generates an induced current correspondingly.

(C) Transmit a control signal by the wireless signal generator 151A of the control panel 15C powered by the induced current after being stored and regulated, to further control the pre-programmed operation of the electronic device.

Accordingly, the above method further comprises the following steps.

(D) In responsive to the pressing action on the top surface of the base panel 125C of the switch panel 12C at a position adjacent to the positioning portion 127C thereof, the movement of the positioning portion 127C drive the swinging arm 148C to move, such that the resilient element is bent to generate another rebounding force.

(E) When the another rebounding force is greater than the magnetic attraction force between the lower second magnet conductive panel 1442C and the coil core 142C, the resilient member 141C restores to its original form and actuate the coil core 142C to detach from the second magnet conductive panel 1442C and to contact with the upper first magnet conductive panel 1442C, such that the magnetic induction line penetrating through the coil core 142C is oppositely changed and the magnetic coil 147C generates an induced current correspondingly; and (F) Transmit a control signal by the wireless signal generator 151A of the control panel 15C powered by the induced current after being stored and regulated, to further control another pre-programmed operation of the electronic device.

Accordingly, in one preferred embodiment, the steps from step A to step C and step D to step E can control the on-and-off of the electronic device respectively.

In this preferred embodiment of the present invention, at the initial non-operational state, the distal end of the core arm 1421C of the coil core 142C is contacted with the upper first magnet conductive panel 1442C. In the step B, when the resilient member 141C is restored to its initial form from the state of being deformed towards the bottom side thereof, the distal end of the core arm 1421C of the coil core 142C is contacted with the lower second magnet conductive panel 1442C, such that the magnetic induction line penetrating through the coil core 142C is oppositely changed. In the step E, when the resilient member 141C is restored to its initial form from the state of being deformed towards the upper side thereof, the distal end of the core arm 1421C of the coil core 142C is contacted with the upper first magnet conductive panel 1442C, such that the magnetic induction line penetrating through the coil core 142C is oppositely changed.

It is worth mentioning that in the process of the selectively contacting the resilient member 141C with the magnet conductive panels 1442C, the coil core 142C is rotated with respect to the bottom panel protruded extended from the supporting panel 13C at the pivot portion 133C thereof, so as to rapidly and alternatively contact with the opposite-poled magnet conductive panels 1442C in a leverage manner, such that the magnetic coil 147C could generate the induced current in a short period of time.

In addition, the method further comprise a step of, in responsive to the pressing operation to the base panel 125C of the switch panel 12C, rotating the base panel 125C of the switch panel 12C with respect to the cover member 111C of the self-powered wireless switch module assembly 10C at the retaining shaft 1112C at the two sides thereof, so as to drive the positioning portion 127C tile and lower reciprocatingly.

In addition, similarly, the control panel 15C can directly send control signal to the corresponding electronic device via the wireless signal generator 151A or can send the control signal to a smart central processing unit (CPU) so as to control the pre-programmed operation of the electronic device via the smart CPU, such as the operations of switching on and off of the electronic device or adjusting the levels thereof. The electronic device can be smart furniture such as smart doors and smart windows, or smart appliances such as lights, air conditioners, electric fans, electronic display devices, sound effects devices, or office appliances.

As shown in FIGS. 38 and 48C of the drawings, a self-powered wireless switch according to a fourth preferred embodiment is illustrated, wherein the power generation of the self-powered wireless switch is implemented in the principle of leverage. In particular, the self-powered wireless switch comprises a self-powered switch module assembly 10C, which is adapted for incorporating with different outer casing or actuators to develop a variety of special self-powered wireless products. In other words, the self-powered wireless switch module assembly 10C has a modular structure integrating the functions of power generation and wireless communication, such that the self-powered wireless switch module assembly 10C is suitable for the downstream manufacturers to conduct further secondary development according to actual needs or preferences, while the downstream manufacturers do not need to understand the power generation and wireless communication principles of the self-powered wireless switch module assembly 10C. The size and shape of the self-powered wireless switch manufactured with the self-powered wireless module assembly can be the same with the conventional wire-type switch, such that the conventional wire-type switch can be replaced thereby.

In particular, as shown in FIGS. 38 to 47, the self-powered switch module assembly 10C comprises a module cover 11C, a module supporting panel 13C, and a micro generator 14C and a control panel 15C, wherein the cover 11C and the supporting panel 13C are incorporated to form module housing for receiving the micro generator 14C and the control panel 15C operatively linked with the micro generator 14C. Similarly, the micro generator 14C can perform power generation to transform mechanical energy into electrical energy so as to power the control panel 15C. The structure of the control panel 15C is similar to the structure of the control panel 15C in the above embodiments and comprises the above power storage 152A, rectifier 153A, micro generator 14C, and wireless signal generator 151A, such that the control panel 15C, after being powered, could send control signal to control the pre-programmed operations of the corresponding electronic device.

In the embodiment of the present invention, in particular, the cover 11C further comprises one or more interconnected cover members 111C, wherein the cover member 111C comprises a cover body 1111C formed by a plurality of inter-coupled side panels and a retaining shaft 1112C protrudedly extended from the cover body 1111C at the two sides thereof. An opening 1113C is formed on one end of the cover body 1111C, as shown in FIGS. 38, 39, 40 and 45.

The self-powered wireless switch module assembly 10C of the present invention is adapted for being incorporated with one or more switch panels 12C, wherein the switch panels 12C are embodied as pressing panels. Each switch panel comprises a base panel 125C, an engaging portion 122C extended from the base panel 125C at the bottom side of an end portion thereof and a positioning portion 127C inwardly extended from the engaging portion 122C. The positioning portion 127C further comprises two positioning members and a positioning groove 1271C formed therebetween. Each switch panel 12C at the two sides thereof further comprises a mounting portion 128C extended from the bottom side of the base panel 125C at a mid portion thereof. A mounting hole 1281C is formed at the mounting portion 128C, wherein the mounting hole 1281C can be a through-hole penetrating through the mounting portion 128C or be a groove which is not penetrating through the mounting portion 128C.

The switch panels 12C are coupled with the cover members 111C respectively via alignedly engaging the two retaining shaft 1112C with the two mounting holes 1281C correspondingly in such a manner that the switch panel 12C is adapted to be rotated around the retaining shaft 1112C. Those skilled in the art would understand that the mounting holes 1281C can be formed in the cover members 111C while the retaining shaft 1112C can be formed on the switch panels 12C. Such engaging means is easy to assembly and enables the switch panel 12C to move in relation to the cover members 111C.

As shown in FIGS. 38 to 40, in this preferred embodiment, the switch panel 12C comprises three independent base panels 125C, that is, three pressing panels, and three independent micro generators 14C configured corresponding to the three base panels 125C respectively. In other words, three independent switches are provided, wherein each switch could function independently. It is worth mentioning that the embodiment with three independent switches is just an example and one, two, or more switches maybe required according to the actual needs.

As shown in FIGS. 41 to 47, each micro generator 14C comprises a magnet assembly 144C, a coil core 142C, a magnetic coil 147C, a resilient member 141C, and a swinging arm 148C. In particular, the magnet assembly 144C comprises a permanent magnet 1443C, two magnet conductive panels 1442C symmetrically located at the opposite poles, i.e. an N pole and an S pole, of the permanent magnet 1443C at the two sides thereof, and an outer supportive frame 1441C, wherein the outer supportive frame 1441C has a interior cavity 1444C for receiving the permanent magnet 1443C and the two magnet conductive panels 1442C. The two magnet conductive panels 1442C, a first magnet conductive panel 1442C and a second magnet conductive panel 1442C, have opposite poles, i.e. the first magnet conductive panel 1442C has the N-pole and the second magnet conductive panel 1442C has the S-pole or the first magnet conductive panel 1442C has the S-pole and the second magnet conductive panel 1442C has the N-pole. Similarly, the length of each magnet conductive panel 1442C is longer than the length of the permanent magnet 1443C to form a magnetic cavity 1446C between the protrusion portions of the two magnet conductive panels 1442C, wherein the outer supportive frame 1441C encloses the permanent magnet 1443C and the two magnet conductive panels 1442C while exposing the magnetic cavity 1446C to the exterior. It is worth mentioning that in this preferred embodiment of the present invention, the magnet assembly 144C can be affixed to the supporting panel 13C, i.e. by affixing the outer supportive frame 1441C to the supporting panel 13C via a proper fastening means such as screw and nut. In other words, unlike the above-mentioned embodiments that the magnet assembly 144C is mounted on a resilient member 141C, the resilient member 141C is not required in this embodiment to provide the restoring function.

The coil core 142C comprises a core arm 1421C and an engaging arm 1422C transversely extended from the core arm 1421C at the proximate end thereof, such that in this preferred embodiment, the coil core 142C has a T-shape. The magnetic coil 147C is wound around the core arm 1421C of the coil core 142C, while the distal end of the coil core 142C is not wound by the magnetic coil 147C and extended to the magnetic cavity 1446C of the magnet assembly 144C. It is worth mentioning that, in this preferred embodiment, a coil supportive frame 1447C is coupled with the outer supportive frame 1441C of the magnet assembly 144C, wherein the coil supportive frame 1447C, preferably, has a one-piece structure, and encloses the core arm 1421C, while the magnetic coil 147C is wound around the coil supportive frame 1447C.

The resilient member 141C is coupled to the coil core 142C. In particular, the resilient member 141C is affixed to coil core 142C at the engaging arms 1442C thereof to form an elongated structure. In other words, unlike the overlapped structure of the resilient member 141C and the coil core 142C described in the third preferred embodiment. The resilient member 141C and the coil core 142C are interconnected to form the elongated structure, such that the length of the whole structure is lengthened after the resilient member 141C is coupled to the coil core 142C. In this preferred embodiment, the resilient member 141C can be embodied as a resilient sheet made of restorable material. It is easily to be understood that similarly, the resilient member 141C, in other embodiments, can be coupled with the coil core 142C in an overlapped manner.

In particular, in this preferred embodiment of the present invention, the resilient member 141C comprises a resilient arm 1413C at a mid-portion thereof, and a mounting arm 1414C integrally extended from the resilient arm 1413C at the two ends thereof to from a substantially H-shape structure. The mounting arm 1414Cs at one end thereof are overlappedly affixed to the engaging arms 1442C of the coil core 142C via one or more fastening members, such as screw or rivet. Accordingly, a plurality of first mounting holes 1281C for mounting the fastening members is respectively provided on the engaging arms 1442C of the coil core 142C and mounting arms 1414C.

The swinging arm 148C is further coupled to the opposite end of the resilient member 141C, such that the coil core 142C, the resilient member 141C, and the swinging arm 148C are orderly interconnected to form an elongated structure. In particular, in this preferred embodiment, one end of the swinging arm 148C is coupled to the mounting arm 1414C at the other end of the resilient member 141C via one or more second fastening members, such as screws or rivets. Accordingly, a plurality of second mounting holes 1281C for mounting the second fastening members is respectively provided on the mounting arms 1414C and one end of the swinging arm 148C.

The other end of the swinging arm 148C are extended to penetrate through the opening 1113C of the cover member 111C, such that the positioning portion 127C extended from the engaging portion 122C of the switch panel 12C is adapted for being coupled with the other end of the swinging arm 148C. In particular, the other end of the swinging arm 148C is alignedly located at the positioning groove 1271C of the positioning portion 127C, such that when the switch panel 12C is pressed, the micro generator 14C is actuated by the positioning portion 127C to perform power generation, which will be further described in the followings. Those skilled in the art would understand that the other end of the swinging arm 148C can be embodied to have the same structure with the positioning portion 127C, that is, the swinging arm 148C has the positioning groove 1271C and the positioning portion 127C can be a protrusion extended from the engaging portion 122C for positioning the positioning groove 1271C of the swinging arm 148C. Surely, the engaging portion 122C of the switch panel 12C and the swinging arm 148C can be detachably coupled with each other by other detachable engaging means. It is worth mentioning that the detachable engaging means for interconnecting the engaging portion 122C of the switch panel 12C and the swinging arm 148C enables the self-powered wireless switch module assembly 10C can be adapted for incorporating with different self-designed switch during secondary development, and when no second development is needed, the swinging arm 148C can be integrally coupled with the engaging portion 122C.

In addition, the coil core 142C further comprises a core cover 1448C, wherein the core cover 1448C has a retention shaft 1449C. The core cover 1448C is sleeved onto the core arm 1421C of the coil core 142C at a position adjacent to the coil frame 1447C and selectively coupled with the coil frame 1447C. It is important to mention that the core cover 1448C and the coil frame 1447C can be integrally formed.

As shown in FIGS. 41 and 42, the supporting panel 13C comprises a plurality of posts 132C extended from the upper side of the bottom panel body 130C, wherein each post 132C forms a retention slot 1321C and a pivot portion 133C, protrudedly extended from the bottom panel body 130C, is formed between each two adjacent posts 132C. As such, the core cover 1448C is incorporated with the posts 132C to slidably mount the retention shaft 1449C at the two sides thereof into the corresponding two retention slots 1321C of the posts 132C, so as to sandwich an independent micro generator 14C between the two corresponding posts 132C, wherein the micro generator 14C is further supported on the pivot portion 133C. The movement of the coil core 142C is limited by the length of the retention slots 1321C of the posts 132C.

The core cover 1448C is arranged to be supported on the pivot portion 133C, instead of directly contacting with the bottom panel body 130C of the supporting panel 13C. Preferably, the pivot portion 133C has a conical structure, that is, the size thereof is gradually decreased from the bottom side to the top side. The pivot portion 133C forms a lever fulcrum for allowing the coil core 142C to rotate therearound.

As shown in FIGS. 48A to 48C, the operation method of the self-powered wireless switch is described as follows. At a non-operation state, the distal end of the core arm 1421C of the coil core 142C is located between the two magnet conductive panels 1442C and contacted with the upper first magnet conductive panel 1442C. When the base panel 125C of the switch panel 12C is pressed by the user at a left side thereof, the base panel 125C of the switch panel 12C is rotated around the retaining shaft 1112C of the cover member 111C of the self-powered wireless switch module assembly 10C to tilt the right side of the base panel 125C so as to pull the engaging portion 122C, such that the swinging arm 148C is actuated to move and the resilient member 141C is deformed to generate a resilient force acting on the proximate end of the coil core 142C enabling the coil core 142C to rotate with respect to the pivot portion 133C as a level fulcrum and the distal end of the core arm 1421C to move away from the upper first conducive panel to contact with the lower second magnet conductive panel 1442C. Therefore, the magnetic induction line penetrating through the coil core 142C is oppositely changed, such that an induced current is generated thereby to finish the power generation for powering the control panel 15C. The control panel 15C further sends out a control signal to control the operations of the corresponding electronic device.

As shown in FIG. 49A to FIG. 49C, in the non-operational state as shown in FIG. 49A, the distal end of the core arm 1421C of the coil core 142C is located between the two magnet conductive panels 1442C and contacted with the lower second magnet conductive panel 1442C. When the base panel 125C of the switch panel 12C is pressed by the user at a right side thereof, the base panel 125C of the switch panel 12C is rotated around the retaining shaft 1112C of the cover member 111C of the self-powered wireless switch module assembly 10C to tilt the left side of the base panel 125C so as to move the engaging portion 122C, such that the swinging arm 148C is actuated to move and the resilient member 141C is deformed to generate a resilient force acting on the proximate end of the coil core 142C enabling the coil core 142C to rotate with respect to the pivot portion 133C as a level fulcrum and the distal end of the core arm 1421C to move away from the lower second magnet conductive panel 1442C to contact with the upper first magnet conductive panel 1442C. Therefore, the magnetic induction line penetrating through the coil core 142C is opposite changed, such that an induced current is generated thereby to finish the power generation for powering the control panel 15C. The control panel 15C further sends out a control signal to control the operations of the corresponding electronic device.

It is worth mentioning that the operation process as shown in FIGS. 48A to 48C and FIGS. 49A to 49C can be opposite commands for controlling the electronic device, i.e. corresponding to the on-and-off operations thereof. The movement illustrated in the drawings is just an example, which is not a limitation in the present invention. In the actual application, the self-powered wireless switch can be straightly installed in the wall, such that the user is able to press the switch panel 12C horizontally.

It is worth mentioning that in this preferred embodiment, a plurality of independent micro generators 14C can operatively linked to a same control panel 15C or can be respectively linked to an individual control panel 15C. A plurality of independent switch assemblies are formed by the independent micro generators 14C and the switch panels 12C, wherein each of switch assemblies is adapted for generating different control signals for controlling one electronic device or controlling different electronic device according to actual needs.

Accordingly, an assembling method for the self-powered wireless switch according to the fourth embodiment is illustrated, wherein the method further comprises the steps of assembling the self-powered wireless switch module assembly 10C for performing the operations of power generation and wireless communication, and assembling the switch panel 12C, designed according to the self-powered wireless switch module assembly 10C, with the self-powered wireless switch module assembly 10C. The step of assembling the self-powered wireless module assembly further comprises the steps of assembling the control panel 15C for regulating the electrical energy and sending out wireless control signal, and assembling the micro generator 14C for performing the power generation.

In particular, in the step of assembling the control panel 15C for sending out wireless control signal, the structure of the control panel 15C is similar to that of the control panel 15C of the third preferred embodiment, such that the step further comprises the steps of operatively linking the signal generator 151A to the MCU, operatively linking the power storage 152A with the rectifier 153A and further operatively linking the rectifier 153A with the MCU.

The step of assembling the micro generator 14C for performing the power generation further comprises a step of assembling the magnet assembly 144C. In particular, the step of assembling the magnet assembly 144C further comprises the steps of providing two magnet conductive panels 1442C at the opposite sides of the permanent respectively, such that the two magnet conductive panels 1442C have different magnetic poles, and disposing the permanent magnet 1443C and the magnet conductive panels 1442C within the outer supportive frame 1441C of an one-piece frame to form the magnet assembly 144C. Each of the two magnet conductive panel 1442C have a protrusion portion extended out of the permanent magnet 1443C so as to from a magnetic cavity 1446C between the two protrusion portions. The outer supportive frame 1441C can be embodied as a plastic cover enclosing the exterior of the permanent magnet 1443C and the magnet conductive panels 1442C and having an opening 1113C to expose the magnetic cavity 1446C. The one-piece frame comprises the outer supportive frame 1441C for receiving the permanent magnet 1443C and the magnet conductive panels 1442C and a coil frame 1447C. The outer supportive frame 1441C further can be affixed on the supporting panel 13C for prevent unwanted movement.

The step of assembling the micro generator 14C further comprises a step of assembling the coil assembly. In particular, the step of assembling the coil assembly further comprises the steps of coupling one end of the swinging arm 148C to the mounting arms 1414C of the H-shaped resilient member 141C via a fastening member, coupling the mounting arms 1414C of the resilient member 141C at the opposite side thereof to the engaging arms 1422C of the T-shaped coil core 142C, sleeving the core cover 1448C at the core arm 1421C of the T-shaped coil core 142C, winding the magnetic coil 147C around the one-piece frame at the coil frame 1447C thereof, winding the magnetic coil 147C around the core arm 1421C of the coil core 142C to a position adjacent to the core cover 1448C; extending the core arm 1421C of the T-shaped coil core 142C to distal end of the core arm 1421C, such that the core arm 1421C is disposed within the magnetic cavity 1446C to contact with the upper first magnet conductive panel 1442C, locating the positing shaft of the core cover 1448C at the two sides thereof at the retention slots 1321C of each two post 132C at a position that the core cover 1448C is supported on the pivot portion 133C. The magnetic coil 147C is further linked to the power storage 152A of the control panel 15C for generate electrical energy to power the control panel 15C. It is worth mentioning that a difference is existed between this preferred embodiment and the third preferred embodiment that when the self-powered switch is at non-operational state, the distal end of the core arm 1421C is disposed within the magnetic cavity 1446C and contacted with the lower magnet conductive panel 1442C in the third embodiment, while in this preferred embodiment, the distal end of the core arm 1421C is disposed within the magnetic cavity 1446C and contacted with the upper magnet conductive panel 1442C.

Further, assembly the module cover 11C on the supporting panel 13C, such that the micro generator 14C is received in the housing formed by the module cover 11C and the supporting panel 13C and the other end of the swinging arm 148C is extended out of the cover member 111C from the opening 1113C thereof. As such, a self-powered wireless switch module assembly 10C able to perform the operations of power generation and wireless communication is formed.

In the step of assembling the switch panel 12C, the mounting holes 1281C at the two sides of the base panel 125C of the switch panel 12C is engaged with the retaining shaft 1112C at the two sides of the cover member 111C respectively, such that the base panel 125C is movably mounted on the cover member 111C and the positioning portion 127C defined on engaging portion 122C at one side of the base panel 125C is affixed to the other end of the swing arm. The size and shape of each retention slot 1321C of the positioning portion 127C is adapted for being engaged with the other end of the swinging arm 148C, i.e. via an interference fitting manner. In this preferred embodiment, the base panels 125C of the three switch panels 12C are respectively coupled with the three independent micro generators 14Cy.

It is easily to be understood that the self-powered wireless switch module assembly 10C of the self-powered switch and the assembling method of the switch panel 12C are just examples, which would not limit the scope of the present invention. The above-described assembling method is mainly for illustrating the structure of the wireless switch of the preferred embodiment in detail and the structure of the self-powered wireless switch is just an example, wherein the order of some steps in the assembling method can be changed accordingly. In addition, the assembling of the switch panel 12C can be executed by downstream manufactures.

Accordingly, a method for controlling the electronic device via a self-powered wireless switch is illustrated, wherein the self-powered wireless switch comprises the self-powered wireless switch module assembly 10C and one or more switch panels 12C. The self-powered wireless switch module assembly 10C comprises a micro generator 14C which comprises a magnet assembly 144C and a coil assembly. The magnet assembly 144C comprises a permanent magnet 1443C and a first and second magnet conductive panel 1442C, having opposite magnetic poles, located at the two sides of the permanent magnet 1443C. The coil assembly comprises a coil core 142C, a magnetic coil 147C wound around the periphery of the core arm 1421C of coil core 142C, a resilient member 141C affixed to the coil core 142C, and a swinging arm 148C affixed to the resilient member 141C, wherein the switch panel 12C comprises a positioning portion 127C coupled with the swinging arm 148C. The controlling method comprises the following steps.

(A) In responsive to the pressing action on the top surface of the base panel 125C of the switch panel 12C at a position away from the positioning portion 127C, the movement of the positioning portion 127C drives the swinging arm 148C to move, such that the resilient element is deformed to generate a rebounding force.

(B) When the rebounding force is greater than the magnetic attraction force between the upper first magnet conductive panel 1442C and the coil core 142C, the resilient member 141C restores to its original form and actuate the coil core 142C to detach from the first magnet conductive panel 1442C and to contact with the lower second magnet conductive panel 1442C, such that the magnetic induction line penetrating through the coil core 142C is oppositely changed and the magnetic coil 147C generates an induced current correspondingly.

(C) Transmit a control signal by the wireless signal generator 151A of the control panel 15C powered by the induced current after being stored and regulated, to further control the pre-programmed operation of the electronic device.

Accordingly, the above method further comprises the following steps.

(D) In responsive to the pressing action on the top surface of the base panel 125C of the switch panel 12C at a position adjacent to the positioning portion 127C thereof, the movement of the positioning portion 127C drives the swinging arm 148C to move, such that the resilient element is bent to generate another rebounding force.

(E) When another rebounding force is greater than the magnetic attraction force between the lower second magnet conductive panel 1442C and the coil core 142C, the resilient member 141C restores to its original form and actuate the coil core 142C to detach from the second magnet conductive panel 1442C and to contact with the upper first magnet conductive panel 1442C, such that the magnetic induction line penetrating through the coil core 142C is oppositely changed and the magnetic coil 147C generates an induced current correspondingly; and (F) Transmit a control signal by the wireless signal generator 151A of the control panel 15C powered by the induced current after being stored and regulated, to further control another pre-programmed operation of the electronic device.

Accordingly, in one preferred embodiment, the steps from step A to step C and step D to step E can control the on-and-off of the electronic device respectively.

In this preferred embodiment of the present invention, at the initial non-operational state, the distal end of the core arm 1421C of the coil core 142C is contacted with the upper first magnet conductive panel 1442C. In the step B, when the resilient member 141C is restored to its initial form from the state of being deformed towards the bottom side thereof, the distal end of the core arm 1421C of the coil core 142C is contacted with the lower second magnet conductive panel 1442C, such that the magnetic induction line penetrating through the coil core 142C is oppositely changed. In the step E, when the resilient member 141C is restored to its initial form from the state of being deformed towards the upper side thereof, the distal end of the core arm 1421C of the coil core 142C is contacted with the upper first magnet conductive panel 1442C, such that the magnetic induction line penetrating through the coil core 142C is oppositely changed.

It is worth mentioning that in the process of the selectively contacting the resilient member 141C with the magnet conductive panels 1442C, the coil core 142C is rotated with respect to the bottom panel protruded extended from the supporting panel 13C at the pivot portion 133C thereof, so as to rapidly and alternatively contact with the opposite-poled magnet conductive panels 1442C in a leverage manner, such that the magnetic coil 147C could generate the induced current in a short period of time.

In addition, the method further comprise a step of rotating the base panel 125C of the switch panel 12C with respect to the cover member 111C of the self-powered wireless switch module assembly 10C at the retaining shaft 1112C at the two sides thereof, so as to drive the positioning portion 127C tile and lower reciprocatingly, in responsive to the pressing operation to the base panel 125C of the switch panel 12C.

In addition, similarly, the control panel 15C can directly send the control signal to the corresponding electronic device via the wireless signal generator 151A or can send the control signal to a smart central processing unit (CPU) so as to control the pre-programmed operation of the electronic device via the smart CPU, such as the operations of switching on and off of the electronic device or adjusting the levels thereof. The electronic device can be smart furniture such as smart doors and smart windows, or smart appliances such as lights, air conditioners, electric fans, electronic display devices, sound effects devices, or office appliances.

Figure 50:
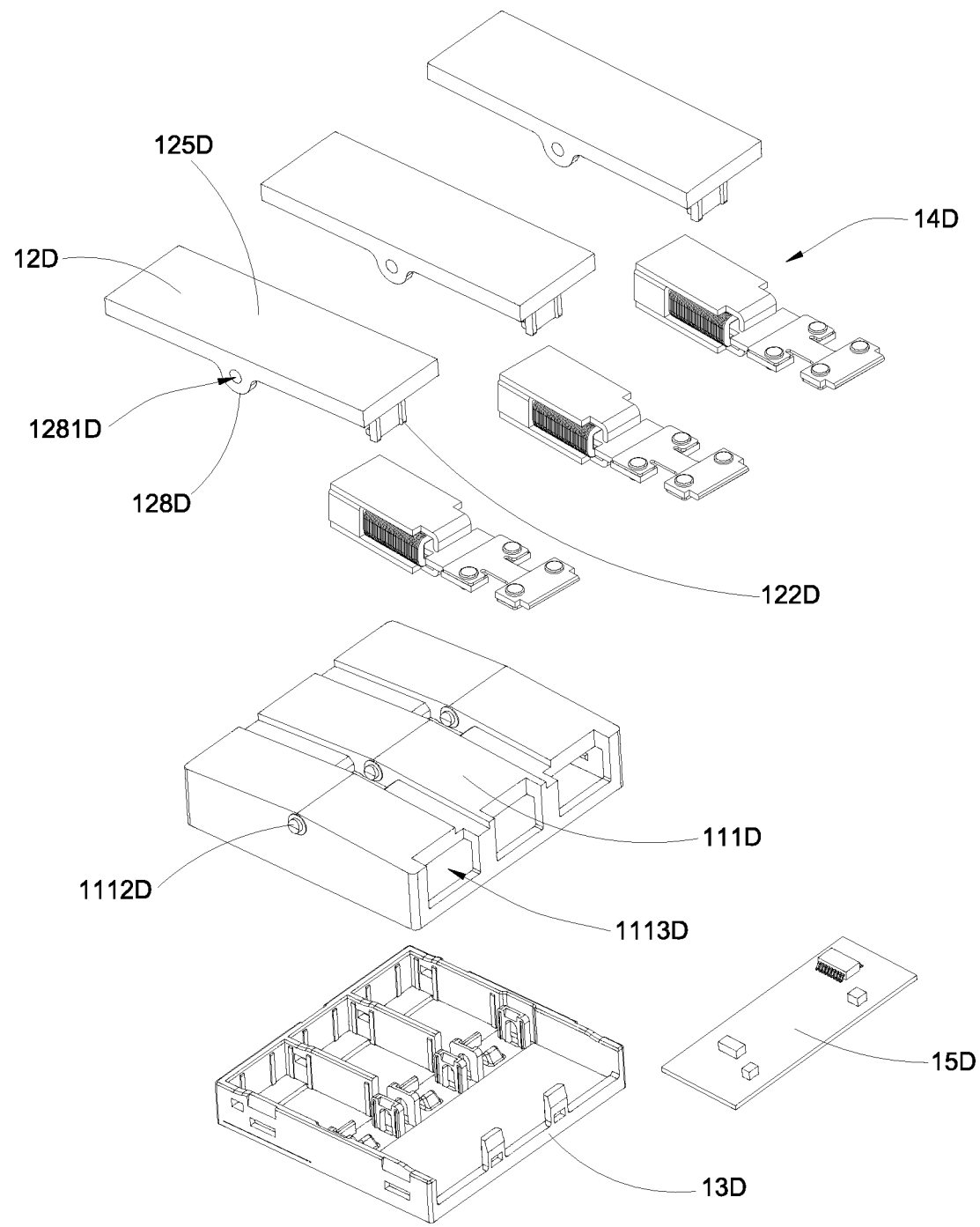
FIG. 50 is an exploded perspective view of a self-powered wireless switch according to a fifth preferred embodiment of the present invention.
Figure 53A:
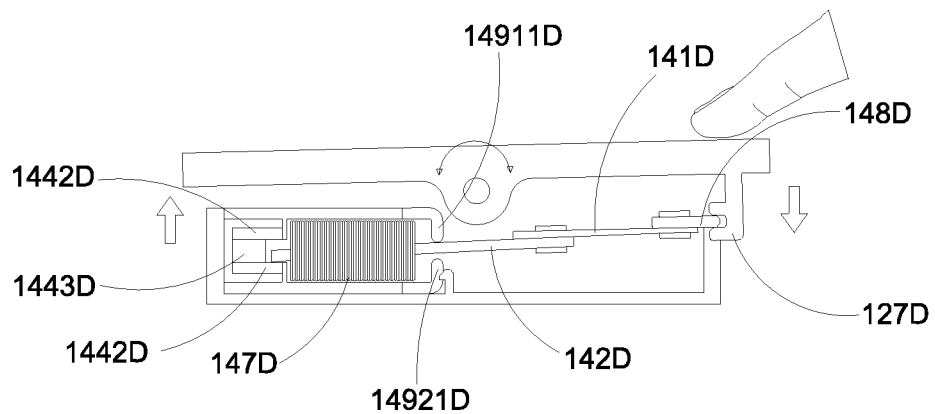
FIGS. 53A to 53C illustrate another operation of the self-powered wireless switch according to above fifth preferred embodiment of the present invention.
Figure 53B:
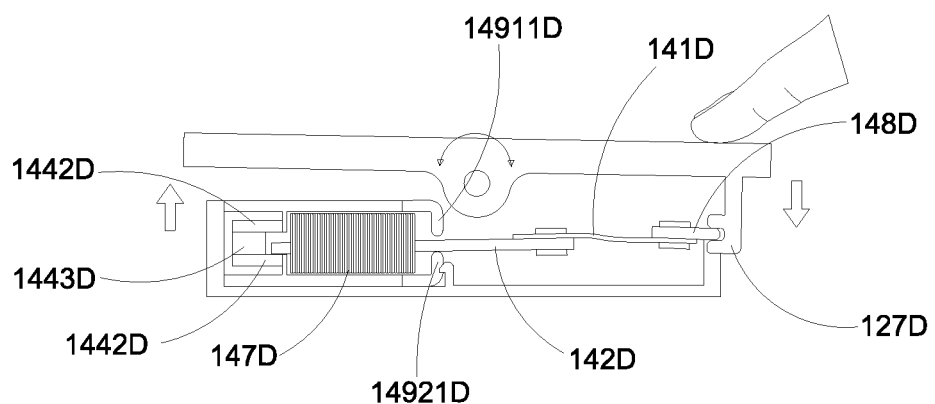
Figure 53C:
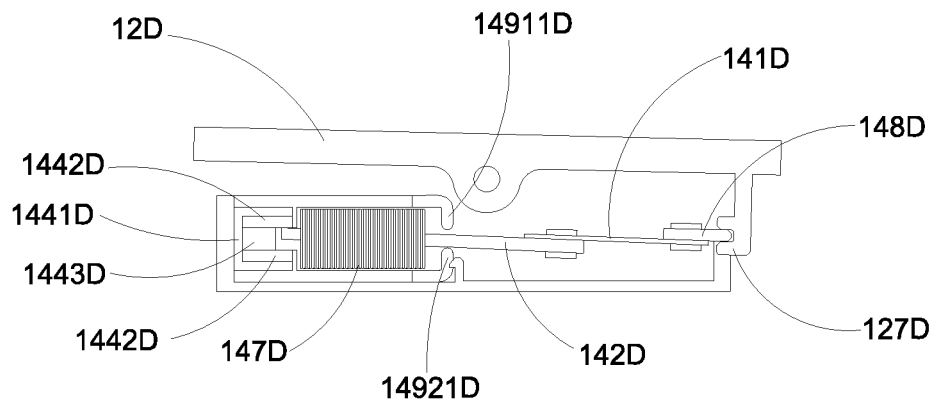
Figure 54:
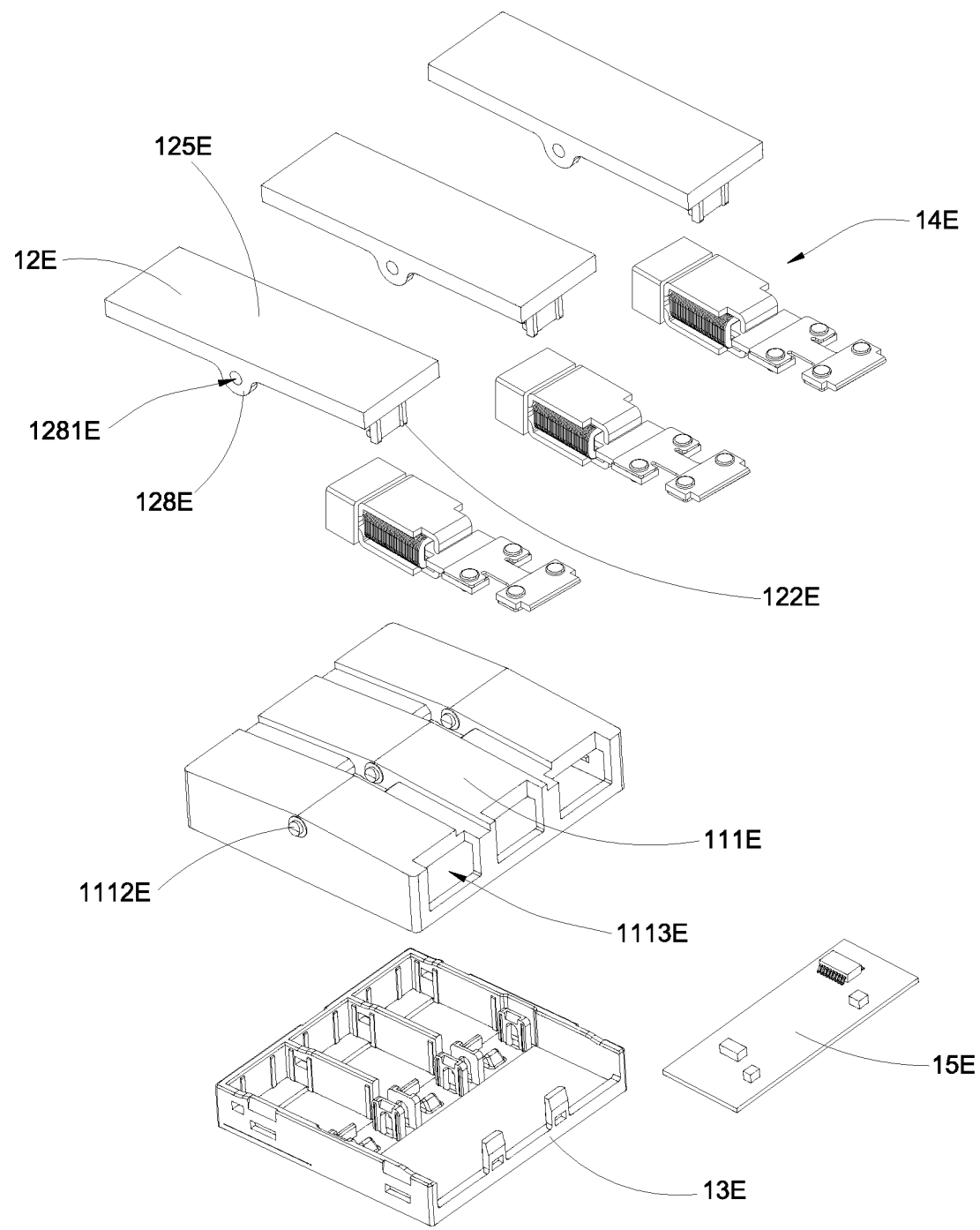
FIG. 54 illustrates an alternative mode of the self-powered wireless switch according to the above fifth preferred embodiment.
Figure 55:
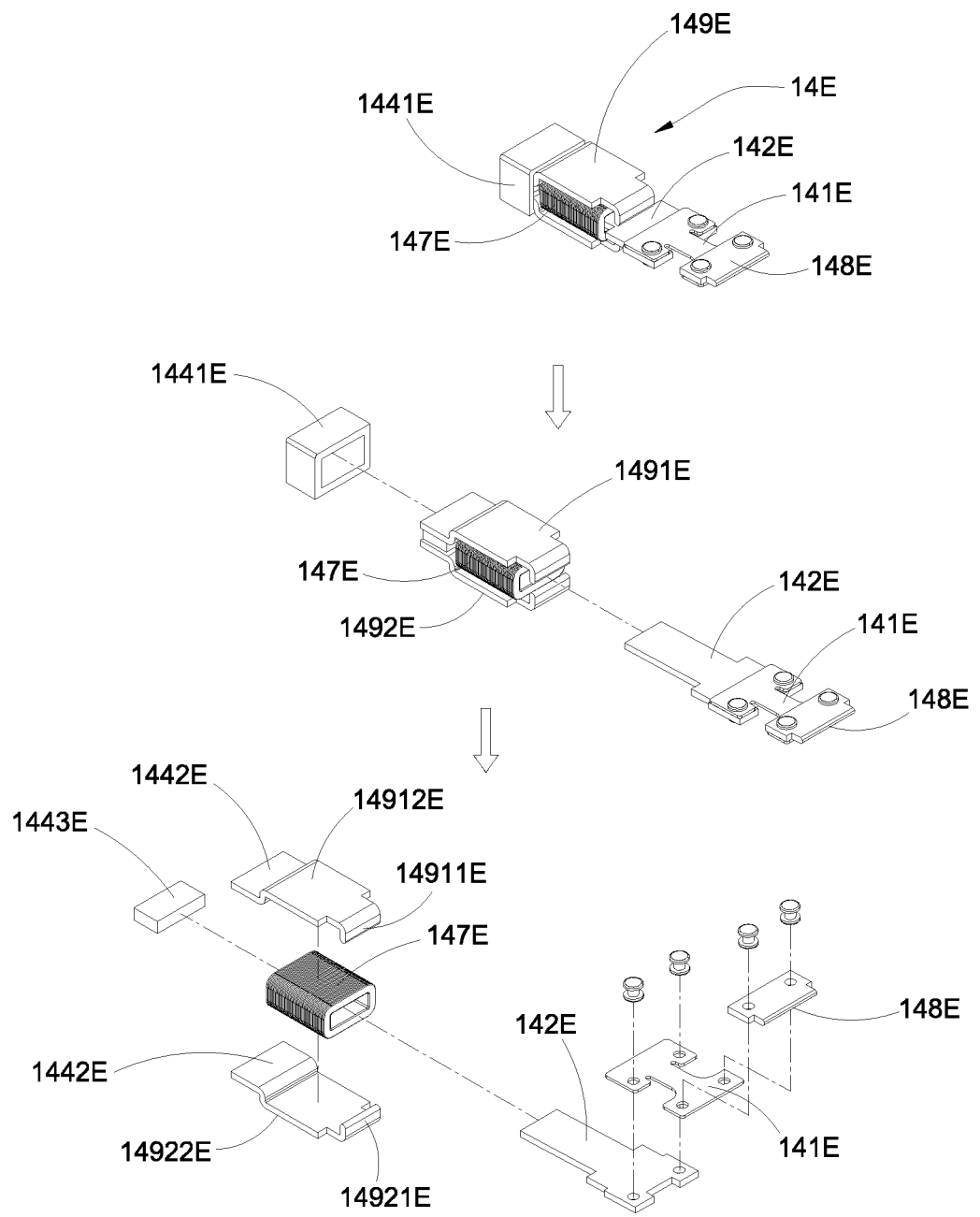
FIG. 55 is a perspective view of the micro generator of the self-powered wireless switch according to the above alternative mode of the fifth preferred embodiment of the present invention.
Figure 56A:
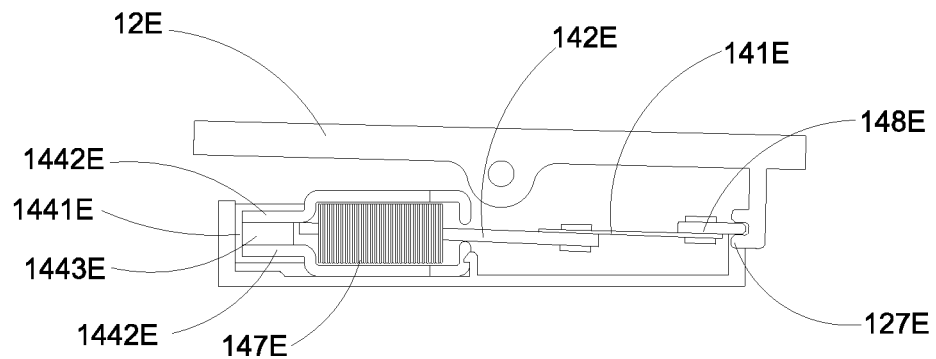
FIGS. 56A to 56C illustrate the operation of the self-powered wireless switch according to above alternative mode of the fifth preferred embodiment of the present invention.
Figure 56B:
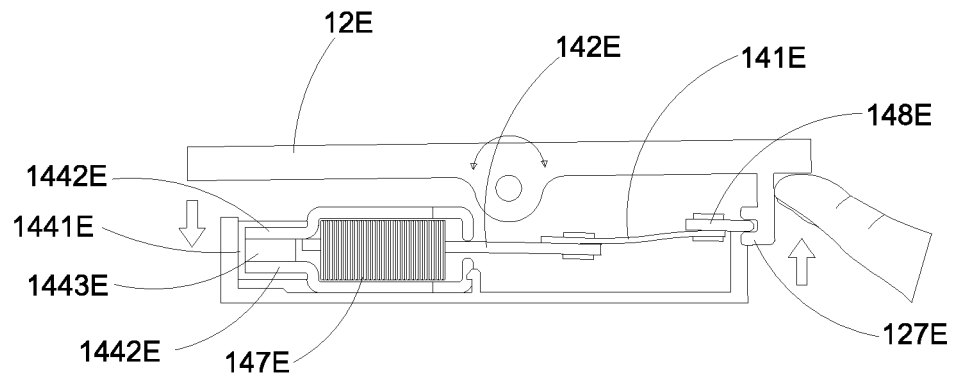
Figure 56C:
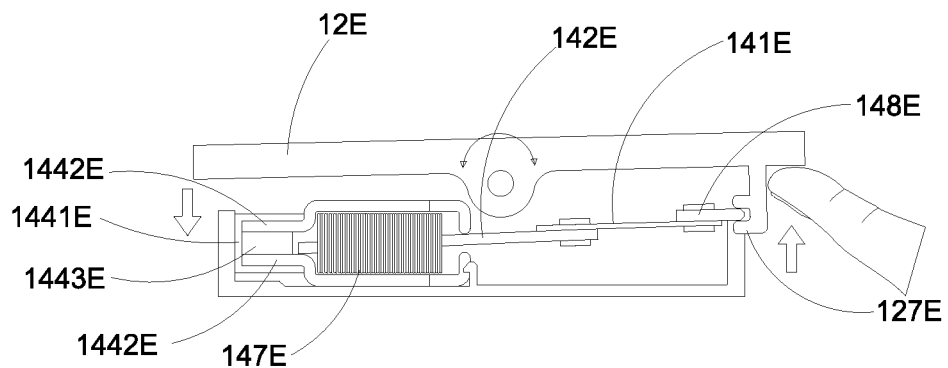
Figure 57A:
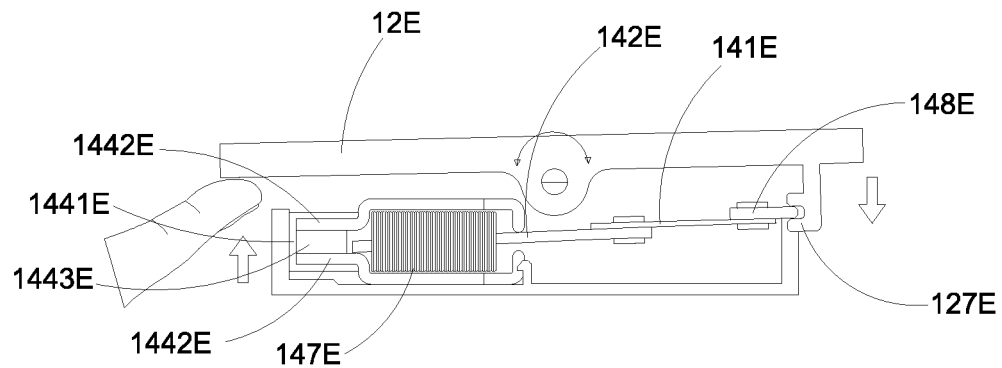
FIGS. 57A to 57C illustrate another operation of the self-powered wireless switch according to above alternative mode of the fifth preferred embodiment of the present invention.
Figure 57B:
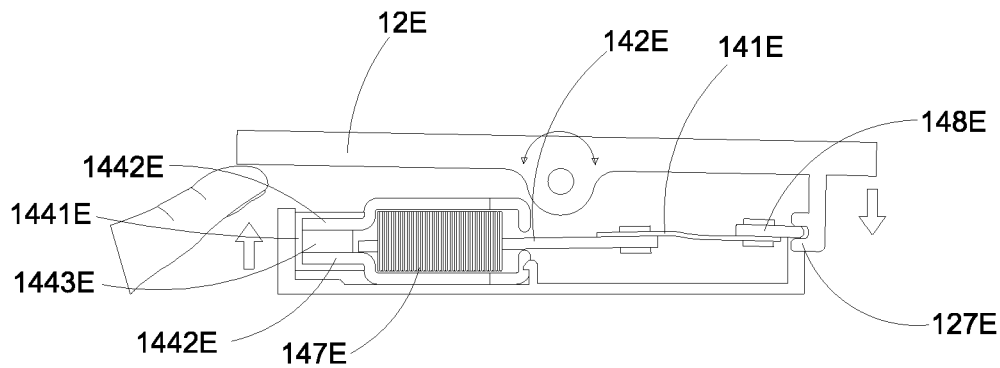
Figure 57C:
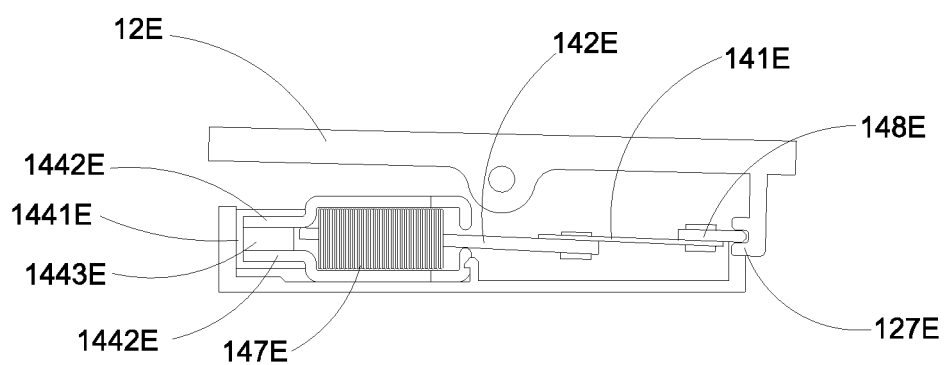

As shown in FIGS. 50 and 53C of the drawings, a self-powered wireless switch according to a fifth preferred embodiment is illustrated, wherein similarly the power generation of the self-powered wireless switch is implemented in the principle of leverage. In particular, the self-powered wireless switch comprises a self-powered switch module assembly 10D, which is adapted for incorporating with different outer casing or actuators to develop a variety of special self-powered wireless products. In other words, the self-powered wireless switch module assembly 10D has a modular structure integrating the functions of power generation and wireless communication, such that the self-powered wireless switch module assembly 10D is suitable for the downstream manufacturers to conduct further secondary development according to actual needs or preferences, while the downstream manufacturers do not need to understand the power generation and wireless communication principles of the self-powered wireless switch module assembly 10D. The size and shape of the self-powered wireless switch manufactured with the self-powered wireless module assembly can be the same with the conventional wire-type switch, such that the conventional wire-type switch can be replaced thereby.

Figure 51:
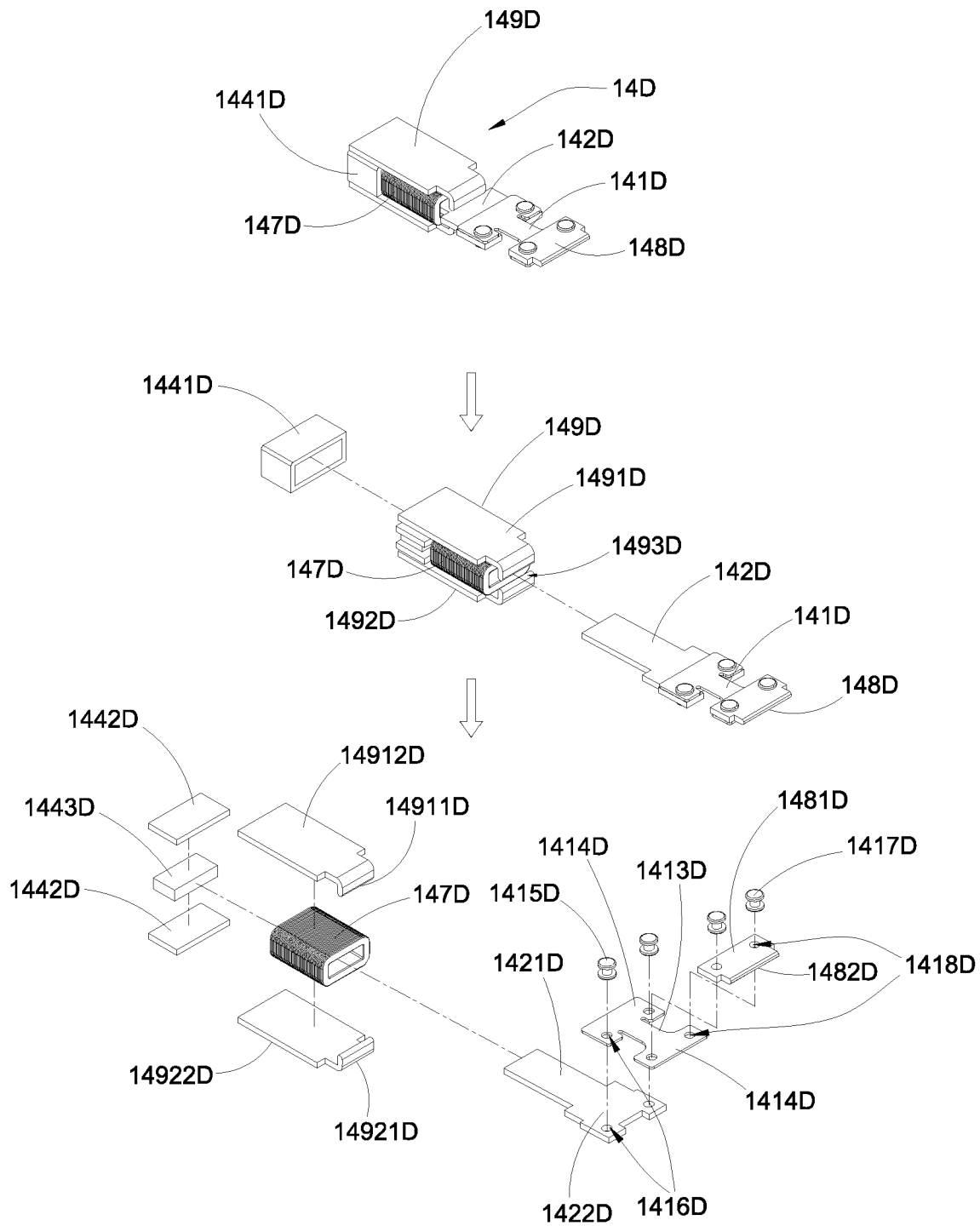
FIG. 51 is a perspective view of the micro generator of the self-powered wireless switch according to the above fifth preferred embodiment of the present invention.
Figure 52A:
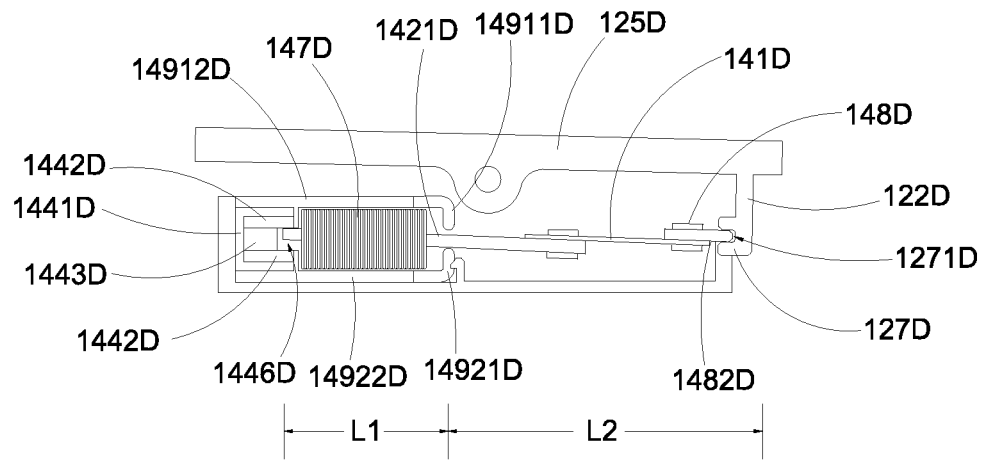
FIGS. 52A to 52C illustrate the operation of the self-powered wireless switch according to above fifth preferred embodiment of the present invention.
Figure 52B:
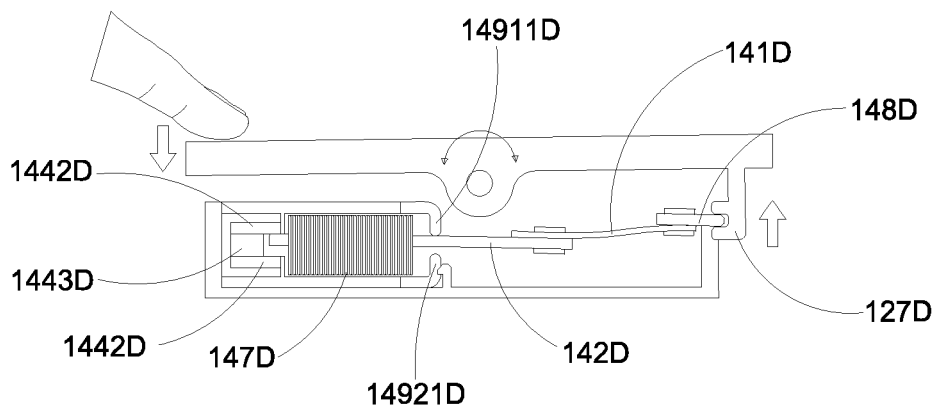
Figure 52C:
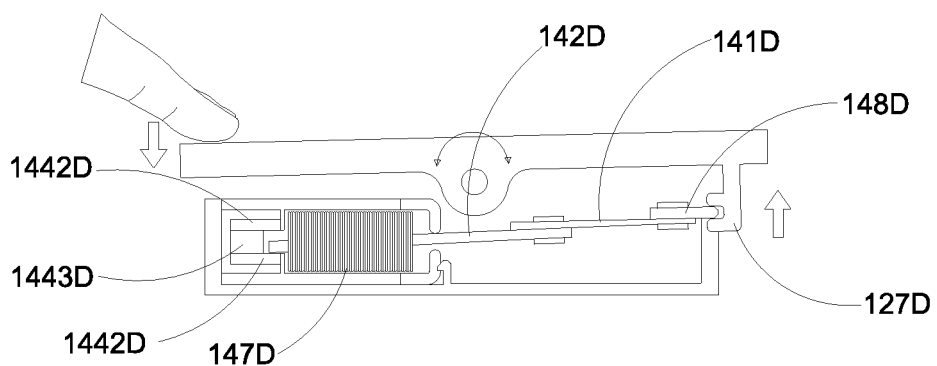

In particular, as shown in FIGS. 50 to 51, the self-powered switch module assembly 10D comprises a module top cover 11D, a module supporting panel 13D, a micro generator 14D and a control panel 15D, wherein the top cover 11D and the supporting panel 13D are incorporated to form module housing for receiving the micro generator 14D and the control panel 15D operatively linked with the micro generator 14D. Similarly, the micro generator 14D can perform power generation to transform mechanical energy into electrical energy so as to power the control panel 15D. The structure of the control panel 15D is similar to the structure of the control panel 15D in the above embodiments and comprises the above power storage 152D, rectifier 153D, micro generator 14D, and wireless signal generator 151D, such that the control panel 15D, after being powered, could send control signal to control the pre-programmed operations of the corresponding electronic device.

In the embodiment of the present invention, in particular, the top cover 11D further comprises one or more interconnected cover members 111D, wherein the cover member comprises a cover body 1111D formed by a plurality of inter-coupled side panels, a retaining shaft 1112D protrudedly extended from the cover body 1111D at the two sides thereof and an opening 1113D is formed on one end of the cover body 1111D.

The self-powered wireless switch module of the present invention is adapted for being incorporated with one or more switch panels 12D, wherein the switch panels 12D are embodied as pressing cover panels. Each switch panel 12D comprises a base panel 125D, an engaging portion 122D extended from the base panel 125D at the bottom side of an end portion thereof and a positioning portion 127D inwardly extended from the engaging portion 122D. The positioning portion 127D further comprises two positioning members 1271D and positioning groove 1271D formed therebetween. Each switch panel 12D at the two sides thereof further comprises a mounting portion 128D extended from the bottom side of the base panel 125D at a mid portion thereof. A mounting hole 1281D is formed at the mounting portion 128D, wherein the mounting hole 1281D can be a through-hole penetrating through the mounting portion 128D or be a groove which is not penetrating through the mounting portion 128D.

The switch panels 12D are coupled with the cover members 111D respectively via alignedly engaging the two retaining shaft 1112D with the two mounting holes 1281D correspondingly in such a manner that the switch panel 12D is adapted to be rotated around the retaining shaft 1112D. Those skilled in the art would understand that the mounting holes 1281D can be formed in the cover members 111D while the retaining shaft 1112D can be formed on the switch panels 12D. Such engaging means is easy to assembly and enables the switch panel 12D to move in relation to the cover members 111D.

Similarly, in this preferred embodiment, the switch panel 12D comprises three independent base panels 125D, that is, three pressing panels, and three independent micro generators 14D configured corresponding to the three base panels 125D respectively. In other words, three independent switches are provided, wherein each switch could function independently. It is worth mentioning that the embodiment with three independent switches is just an example and one, two, or more switches maybe required according to the actual needs.

Each micro generator 14D comprises a magnet assembly 144D, a coil core 142D, a magnetic coil 147D, a resilient member 141D, and a swinging arm 148D and a pivot arrangement 149D. In particular, the magnet assembly 144D comprises a permanent magnet 1443D, two magnet conductive panels 1441D, 1442D symmetrically located at the opposite poles, i.e. an N pole and an S pole, of the permanent magnet 1443D at the two sides thereof, and an outer supportive frame 1441D, wherein the outer supportive frame 1441D has an interior cavity 1444D for receiving the permanent magnet 1443D and the two magnet conductive panels 1441D, 1442D. The two magnet conductive panels 1441D, 1442D, a first magnet conductive panel 1442D and a second magnet conductive panel 1442D, have opposite poles, i.e. the first magnet conductive panel 1442D has the N-pole and the second magnet conductive panel 1442D has the S-pole or the first magnet conductive panel 1442D has the S-pole and the second magnet conductive panel 1442D has the N-pole. Similarly, the length of each magnet conductive panel 1442D is longer than the length of the permanent magnet 1443D to form a magnetic cavity 1446D between the protrusion portions of the two magnet conductive panels 1441D, 1442D, wherein the outer supportive frame 1441D encloses the permanent magnet 1443D and the two magnet conductive panels 1441D, 1442D while exposing the magnetic cavity 1446D to the exterior. It is worth mentioning that in this preferred embodiment of the present invention, the magnet assembly 144D can be affixed to the supporting panel 13D or the top cover 11D, i.e. by affixing the outer supportive frame 1441D to the supporting panel 13D via a proper fastening means such as screw and nut. The outer supportive frame 1441D can be made of a variety of proper materials, such as elastic plastic material.

The coil core 142D comprises a core arm 1421D and an engaging arm 1422D transversely extended from the core arm 1421D at the proximate end thereof, such that in this preferred embodiment, the coil core 142D has a T-shape. The magnetic coil 147D is wound around the core arm 1421D of the coil core 142D, while the distal end of the coil core 142D is not wound by the magnetic coil 147D and extended to the magnetic cavity 1446D of the magnet assembly 144D. It is worth mentioning that, in this preferred embodiment, a coil supportive frame 142D is coupled with the outer supportive frame 1441D of the magnet assembly 144D, wherein the coil supportive frame 142D, preferably, has a one-piece structure, and encloses the core arm 1421D, while the magnetic coil 147D is wound around the coil supportive frame 142D.

The resilient member 141D is coupled to the coil core 142D. In particular, the resilient member 141D is affixed to coil core 142D at the engaging arms 1422D thereof to form an elongated structure. In this preferred embodiment, the resilient member 141D can be embodied as resilient piece made of restorable material. It is easily to be understood that the resilient member 141D, in other embodiments, can be coupled with the coil core 142D in an overlapped manner.

In particular, in this preferred embodiment of the present invention, the resilient member 141D comprises a resilient arm 1413D at a mid-portion thereof, and a mounting arm 1414D integrally extended from the resilient arm 1413D at the two ends thereof to from a substantially H-shape structure. The mounting arms 1414D at one end thereof are overlappedly affixed to the engaging arms 1422D of the coil core 142D via one or more fastening members, such as screw or rivet. Accordingly, a plurality of first mounting holes 1281D for mounting the fastening members is respectively provided on the engaging arms 1422D of the coil core 142D and mounting arms 1414D.

The swinging arm 148D is further coupled to the opposite end of the resilient member 141D, such that the coil core 142D, the resilient member 141D, and the swinging arm 148D are orderly interconnected to form an elongated structure. In particular, in this preferred embodiment, one end of the swinging arm 148D is coupled to the mounting arm 1414D at the other end of the resilient member 141D via one or more second fastening members, such as screws or rivets. Accordingly, a plurality of second mounting holes 1281D for mounting the second fastening members is respectively provided on the mounting arms 1414D and one end of the swinging arm 148D.

The other end of the swinging arm 148D are extended to penetrate through the opening 1113D of the cover member, such that the positioning portion 127D extended from the engaging portion 122D of the switch panel 12D is adapted for being coupled with the other end of the swinging arm 148D. In particular, the other end of the swinging arm 148D is alignedly located at the positioning groove 1271D of the positioning portion 127D, such that when the switch panel 12D is pressed, the micro generator 14D is actuated by the positioning portion 127D to perform power generation, which will be further described in the followings. Those skilled in the art would understand that the other end of the swinging arm 148D can be embodied to have the same structure with the positioning portion 127D, that is, the swinging arm 148D has the positioning groove 1271D and the positioning portion 127D can be a protrusion extended from the engaging portion 122D for positioning the positioning groove 1271D of the swinging arm 148D. Surely, the engaging portion 122D of the switch panel 12D and the swinging arm 148D can be detachably coupled with each other by other detachable engaging means. It is worth mentioning that the detachable engaging means for interconnecting the engaging portion 122D of the switch panel 12D and the swinging arm 148D enables the self-powered wireless switch module assembly 10D can be adapted for incorporating with different self-designed switch during secondary development, and when no second development is needed, the swinging arm 148D can be integrally coupled with the engaging portion 122D. In addition, the positioning portion 127D may penetrate through the opening 1113D and couple with the swinging arm 148D in some embodiments.

The pivot arrangement 149D in this preferred embodiment is adapted for providing two swinging pivot point, such that the core arm 1421D of the coil core 142D can be moved in a leverage manner in relation to the two swinging pivot point to contact with the opposite-poled magnet conductive panels 1441D, 1442D alternatingly. In particular, in this preferred embodiment, the pivot arrangement 149D comprises a first pivot unit 1491D and a second pivot unit 1492D, and an opening 1113D formed therebetween, wherein the core arm 1421D is extended to penetrate through the opening 1493D, such that a distal end thereof is disposed within the magnetic cavity 1446D.

It is worth mentioning that the structure of the pivot arrangement 149D can be formed in different ways. For example, the pivot arrangement 149D can be extended from the protrusions of the supporting panel 13D and the top cover 11D as the swinging pivot point of the pivot arrangement 149D. Alternatively, the pivot arrangement 149D can be mounted on the supporting panel 13D and the top cover 11D at a pivot member thereat. Or, the pivot arrangement 149D can be integrally extended from the supporting panel 13D and the top cover 11D and the opening 1113D is formed between the supporting panel 13D and the top cover 11D.

In this embodiment of the present invention, the first pivot unit 1491D comprises a first pivot member 14911D and a first magnet conductive arm 14912D transversely extended from the first pivot member 14911D. The second pivot unit 1492D comprises a second pivot member 14921D and a second magnet conductive arm 14922D transversely extended from the second pivot member 14921D. The first pivot member 14911D and the second pivot member 14921D provide two swinging pivot points, i.e. the swinging pivot points for the upper side and lower side of the core arm 1421D, such that the core arm 1421D can be moved in a leverage manner with respective to the swinging pivot points respectively. The additional first and second magnet conductive arm 14911, 14922D can provide the function of magnet induction. It is easy to be understood that in this preferred embodiment, in case that the pivot members and the corresponding magnet conductive arms can be made of same material and be integrally formed, and the size of the opening 1113D is slightly larger than the thickness of the core arm 1421D, the core arm 1421D is only contacted with one of the first and second pivot member 14921Ds, such that the magnetic induction line penetrating through the core arm 1421D is changed, when the core arm 1421D is actuated to move with respective to the swinging pivot points provided by the first and second pivot member 14921Ds respectively. It will be easy to be understood that when the first and second pivot member 14921D of the first and the second pivot unit 1492Ds are made of non-magnet conductive material or be coated with non-magnet conductive material, the core arm 1421D can be contacted with both of the first and second pivot members 14921D at the same time.

In this preferred embodiment of the present invention, the magnet assembly 144D is further located between the magnet conductive arms of the two pivot units and the magnetic coil 147D is located between eh magnet conductive arms of the two pivot units as well. In addition, the elongated structure formed by the coil core 142D, the resilient member 141D and the swinging arm 148D is divided into a resisting arm L1 L1 and a pressing arm L2 via the two pivot members. Furthermore, the resisting arm L1 is defined by a portion of the core arm 1421D extended between the magnet conductive arms and the left portion of the elongated structure defined by the coil core 142D, the resilient member 141D and the swinging arm 148D defines the pressing arm. It is worth mentioning that the length of the pressing arm can be adjusted according to a specific need of the user so as to adjust the required pressing force applied by the user. In other words, the structure of this preferred embodiment of the invention is effortless to operate.

In addition, the first and second pivot units 1491D, 1492D can be individual components or have an integrated structure, to form the opening 1113D therebetween for allowing the core arm 1421D to pass through. More preferably, in this preferred embodiment, the first and second pivot units 1491D, 1492D are individual components and spacedly arranged with each other. The first and the second pivot member 14921Ds are spacedly arranged with each other to form the opening 1113D therebetween, and the first and second magnet conductive arms 14911, 14922D are spacedly arranged with each other to form a receiving cavity to receive the magnet assembly 144D, the magnetic coil 147D and the core arm 1421D so as to form part of the resisting arm L1.

It is worth mentioning that the first and second magnet conductive arms 14911, 14922D are further affixed to the module housing formed by the top cover 11D and the supporting panel 13D via an engaging mechanism or a plastic cover provided at the first and second magnet conductive arms 14911, 14922D. Therefore, in this preferred embodiment, the magnet assembly 144D, the magnetic coil 147D and the pivot arranged can be fixed, while the swinging arm 148D is actuated to move the coil core 142D to contact with the two magnet conductive panels 1441D, 1442D in an alternating manner, such that the magnetic induction line penetrating through the coil core 142D is changed and an induced current is generated in the magnetic coil 147D. In addition, the turns of the magnetic coil 147D can be 150-2000 turns, and the coil wire diameter is 0.08 mm to 0.3 mm. The above-specific parameters for the magnetic coil 147D are just an example, which is not limited in the present invention.

In addition, it is worth mentioning that, in this preferred embodiment of the present invention, the first and second pivot units 1491D, 1492D are made of iron core respectively so as to form a first and second sub-cores.

As shown in FIGS. 52A to 52C and FIGS. 53A to 53C, the operation method of the self-powered wireless switch is described as follows. At the non-operation state, the distal end of the core arm 1421D of the coil core 142D is located between the two magnet conductive panels 1441D, 1442D and contacted with the upper first magnet conductive panel 1442D and the coil core 142D can be supported on the second pivot member 14921D. When the base panel 125D of the switch panel 12D is pressed by the user at a left side thereof, the base panel 125D of the switch panel 12D is rotated around the retaining shaft 1112D of the cover member of the self-powered wireless switch module assembly 10D to tilt the right side of the base panel 125D so as to pull the engaging portion 122D to tilt, such that the swinging arm 148D is actuated to move and the resilient member 141D is bent downwardly to move the coil core 142D away from the second pivot member 14921D. When the user keeps pressing, the resilient force generated by the deformation of the resilient member 141D acts on the proximate end of the coil core 142D to pivotally move the core arm 1421D with respect to the fulcrum point of the upper first pivot member 14911D, such that the distal end of the core arm 1421D is moved away from the first magnetic conductive panel and to contact with the lower second magnet conductive panel 1442D. Therefore, the magnetic induction line penetrating through the coil core 142D is oppositely changed, such that an induced current is generated thereby to finish the power generation for powering the control panel 15D. The control panel 15D further sends out a control signal to control the operations of the corresponding electronic device.

Furthermore, when the distal end of the core arm 1421D of the coil core 142D is located between the two magnet conductive panels 1441D, 1442D and contacted with the lower second magnet conductive panel 1442D. When the base panel 125D of the switch panel 12D is pressed by the user at a right side thereof, the base panel 125D of the switch panel 12D is rotated around the retaining shaft 1112D of the cover member of the self-powered wireless switch module assembly 10D to tilt the left side of the base panel 125D so as to move the engaging portion 122D, such that the swinging arm 148D is actuated to move and the resilient member 141D is deformed to move the core arm 1421D away from first pivot member 14911D. When the user keeps pressing, the resilient force generated by the deformation of the resilient member 141D acts on the proximate end of the coil core 142D enabling the coil core 142D to pivotally move with respect to lower second pivot member 14921D as a level fulcrum to move the distal end of the core arm 1421D away from the second magnet conductive panel 1442D and to contact with the upper first magnet conductive panel 1442D, such that the magnetic induction line penetrating through the coil core 142D is opposite changed and an induced current is generated thereby to perform the power generation. Similarly, the electrical energy generated by the inducted current is adapted for powering the control panel 15D, such that the control panel 15D would further send out a control signal to control the operations of the corresponding electronic device.

It is worth mentioning that similarly, the above-described operation process can be opposite commands for controlling the electronic device, i.e. corresponding to the on-and-off operations thereof. The movement illustrated in the drawings is just an example, which is not a limitation in the present invention. In the actual application, the self-powered wireless switch can be straightly installed in the wall, such that the user is able to press the switch panel 12D horizontally. At non-operational state, the coil core 142D can be selectively contacted with one of the magnet conductive panels 1441D, 1442D and the coil core 142D is actuated to contact with the other magnet conductive panel 1442D so as to contact with the magnet conductive panels 1441D, 1442D in an alternating manner at the operation state.

It is worth mentioning that in this preferred embodiment, a plurality of independent micro generators 14D can operatively linked to a same control panel 15D or can be linked to an individual control panel 15Ds respectively. A plurality of independent switch assemblies are formed by the independent micro generators 14D and the switch panels 12D, wherein each of switch assemblies is adapted for generating different control signals for controlling one electronic device or controlling different electronic device according to actual needs.

Accordingly, an assembling method for the self-powered wireless switch according to the fifth embodiment is illustrated, wherein the method further comprises the steps of assembling the self-powered wireless switch module assembly 10D for performing the operations of power generation and wireless communication, and assembling the switch panel 12D, designed according to the self-powered wireless switch module assembly 10D, with the self-powered wireless switch module assembly 10D. The step of assembling the self-powered wireless module assembly further comprises the steps of assembling the control panel 15D for regulating the electrical energy and sending out wireless control signal, and assembling the micro generator 14D for performing the power generation.

In particular, in the step of assembling the control panel 15D for sending out wireless control signal, the structure of the control panel 15D is similar to that of the control panel 15D of the third preferred embodiment, such that the step further comprises the steps of operatively linking the signal generator 151D to the MCU, operatively linking the power storage 152D with the rectifier 153D and further operatively linking the rectifier 153D with the MCU.

According to the preferred embodiment of the present invention, the step of assembling the micro generator 14D for performing the power generation further comprises the following steps. Those skilled in the art would understand that the steps and the related structures therein are only an example, which are not limited in the present invention.

The steps of assembling the magnet assembly 144D further comprise a step of providing two magnet conductive panels 1441D, 1442D at the opposite sides of the permanent respectively, such that the two magnet conductive panels 1441D, 1442D have different magnetic poles and disposing the permanent magnet 1443D and the magnet conductive panels 1441D, 1442D within the outer supportive frame 1441D of an one-piece frame to form the magnet assembly 144D. Each of the two magnet conductive panel 1442D has a protrusion portion extended out of the permanent magnet 1443D so as to from a magnetic cavity 1446D between the two protrusion portions. The outer supportive frame 1441D can be embodied as a plastic cover enclosing the exterior of the permanent magnet 1443D and the magnet conductive panels 1441D, 1442D and having an opening 1113D to expose the magnetic cavity 1446D. The one-piece frame comprises the outer supportive frame 1441D for receiving the permanent magnet 1443D and the magnet conductive panels 1441D, 1442D and a coil frame 142D. The outer supportive frame 1441D further can be affixed on the supporting panel 13D or the top cover 11D for prevent unwanted movement thereof.

The step of assembling the coil assembly further comprises the steps of coupling one end of the swinging arm 148D to the mounting arms 1414D of the H-shaped resilient member 141D via a fastening member, coupling the mounting arms 1414D of the resilient member 141D at the opposite side thereof to the engaging arms 1422D of the T-shaped coil core 142D, winding the magnetic coil 147D around the one-piece frame at the coil frame 142D thereof, winding the magnetic coil 147D around the core arm 1421D of the coil core 142D; extending the core arm 1421D through the opening 1113D formed between the first and second pivot member 14921D of the pivot arrangement 149D, properly adjusting the relative position between the core arm 1421D and the pivot arrangement 149D to adjust the length distribution of the resisting arm L1 and pushing arm L2. Moreover, the core arm 1421D of the T-shaped coil core 142D is disposed within the magnetic cavity 1446D and contacted with the upper first magnet conductive panel 1442D. The first and second pivot units 1491D, 1492D of the pivot arrangement 149D are being coupled to the top cover 11D and the supporting panel 13D in the following steps. The magnetic coil 147D is further linked to the power storage 152D of the control panel 15D for generate electrical energy to power the control panel 15D thereby. It is worth mentioning that at non-operational state, the distal end of the core arm 1421D is disposed within the magnetic cavity 1446D and selectively contacted with the upper magnet conductive panels 1441D, 1442D in this preferred embodiment.

Further, assembly the module cover on the supporting panel 13D, such that the micro generator 14D is received in the housing formed by the module cover and the supporting panel 13D and the other end of the swinging arm 148D is extended out of the cover member from the opening 1113D thereof. In other embodiments of the present invention, the positioning portion 127D of the switch panel 12D is extended into the opening 1113D to engage with the swinging arm 148D. As such, a self-powered wireless switch module assembly 10D able to perform the operations of power generation and wireless communication is formed.

In the step of assembling the switch panel 12D, the mounting holes 1281D at the two sides of the base panel 125D of the switch panel 12D is engaged with the retaining shaft 1112Ds at the two sides of the cover member respectively, such that the base panel 125D is movably mounted on the cover member and the positioning portion 127D defined on engaging portion 122D at one side of the base panel 125D is affixed to the other end of the swing arm. The size and shape of the retention slots of the positioning portion 127D is adapted for being engaged with the other end of the swinging arm 148D, i.e. via an interference fitting manner. In this preferred embodiment, the base panels 125D of the three switch panels 12D are coupled with the three independent micro generators 14D respectively.

It is easy to be understood that the self-powered wireless switch module assembly 10D of the self-powered switch and the assembling method of the switch panel 12D are just examples, which would not limit the scope of the present invention. The above-described assembling method is mainly for illustrating the structure of the wireless switch of the preferred embodiment in detail and the structure of the self-powered wireless switch is just an example, wherein the order of some steps in the assembling method can be changed accordingly. In addition, the assembling of the switch panel 12D can be executed by downstream manufactures.

Accordingly, a method for controlling the electronic device via the self-powered wireless switch is illustrated, wherein the self-powered wireless switch comprises the self-powered wireless switch module assembly 10D and one or more switch panels 12D. The self-powered wireless switch module assembly 10D comprises a micro generator 14D which comprises a magnet assembly 144D and coil assembly. The magnet assembly 144D comprises a permanent magnet 1443D and a first and a second magnet conductive panels 1442D, having opposite magnetic poles, located at the two sides of the permanent magnet 1443D. The coil assembly comprises a coil core 142D, a magnetic coil 147D wound around the periphery of the core arm 1421D of coil core 142D, a resilient member 141D affixed to the coil core 142D, a swinging arm 148D affixed to the resilient member 141D, and a pivot arrangement 149D arranged around the magnet assembly 144D and the magnetic coil 147D, wherein the core arm 1421D penetrates the opening 1113D formed between the first and second pivot member 14921Ds spacedly arranged with each other. The switch panel 12D comprises a positioning portion 127D coupled with the swinging arm 148D. The controlling method comprises the following steps.

($\alpha$) In responsive to the pressing action on the top surface of the base panel 125D of the switch panel 12D at a position away from the positioning portion 127D, the movement of the positioning portion 127D drives the swinging arm 148D to move, such that the resilient element is deformed to generate a rebounding force.

($\beta$) When the rebounding force is greater than the magnetic attraction force between the upper first magnet conductive panel 1442D and the coil core 142D, the resilient member 141D restores to its original form and actuate the coil core 142D to pivotally move with respective to first pivot member 14911D as the swinging pivot thereof in a leverage manner, such that the coil core 142D is detached from the first magnet conductive panel 1442D and to contact with the lower second magnet conductive panel 1442D. Therefore, the magnetic induction line penetrating through the coil core 142D is oppositely changed and the magnetic coil 147D generates an induced current correspondingly.

($\gamma$) Transmit a control signal by the wireless signal generator 151D of the control panel 15D powered by the induced current after being stored and regulated, to further control the pre-programmed operation of the electronic device.

Accordingly, the above method further comprises the following steps.

($\delta$) In responsive to the pressing action on the top surface of the base panel 125D of the switch panel 12D at a position adjacent to the positioning portion 127D thereof, the movement of the positioning portion 127D drive the swinging arm 148D to move, such that the resilient element is bent to generate another rebounding force.

When the another rebounding force is greater than the magnetic attraction force between the lower second magnet conductive panel 1442D and the coil core 142D, the resilient member 141D restores to its original form and actuates the coil core 142D to pivotally move with respective to second pivot member 14921D as the swinging pivot thereof in a leverage manner, such that the coil core 142D is detached from the second magnet conductive panel 1442D to contact with the upper first magnet conductive panel 1442D. Therefore, the magnetic induction line penetrating through the coil core 142D is oppositely changed and the magnetic coil 147D generates an induced current correspondingly.

($\zeta$) Transmit a control signal by the wireless signal generator 151D of the control panel 15D powered by the induced current after being stored and regulated, to further control another pre-programmed operation of the electronic device.

Accordingly, in one preferred embodiment, the steps from step ($\alpha$) to step ($\gamma$) and step ($\delta$) to step ($\zeta$) can control the on-and-off of the electronic device respectively.

In this preferred embodiment of the present invention, at the initial non-operational state, the distal end of the core arm 1421D of the coil core 142D is contacted with the upper first magnet conductive panel 1442D. In the step ($\beta$), when the resilient member 141D is restored to its initial form from the state of being deformed towards the bottom side thereof, the distal end of the core arm 1421D of the coil core 142D is contacted with the lower second magnet conductive panel 1442D, such that the magnetic induction line penetrating through the coil core 142D is oppositely changed. In the step ($\epsilon$), when the resilient member 141D is restored to its initial form from the state of being deformed towards the upper side thereof, the distal end of the core arm 1421D of the coil core 142D is contacted with the upper first magnet conductive panel 1442D, such that the magnetic induction line penetrating through the coil core 142D is oppositely changed.

It is worth mentioning that in the process of the selectively contacting the resilient member 141D with the magnet conductive panels 1441D, 1442D, the coil core 142D is rotated with respect to the first and second pivot members 14921D of the pivot arrangement 149D, so as to rapidly and alternatively contact with the opposite-poled magnet conductive panels 1441D, 1442D in a leverage manner, such that the magnetic coil 147D could generate the induced current in a short period of time.

In addition, the method further comprise the steps of rotating the base panel 125D of the switch panel 12D with respect to the cover member of the self-powered wireless switch module assembly 10D at the retaining shaft 1112D at the two sides thereof, so as to drive the positioning portion 127D tile and lower reciprocatingly, in responsive to the pressing operation to the base panel 125D of the switch panel 12D.

In addition, similarly, the control panel 15D can directly send control signal to the corresponding electronic device via the wireless signal generator 151D or can send the control signal to a smart central processing unit (CPU) so as to control the pre-programmed operation of the electronic device via the smart CPU, such as the operations of switching on and off of the electronic device or adjusting the levels thereof. The electronic device can be smart furniture such as smart doors and smart windows, or smart appliances such as lights, air conditioners, electric fans, electronic display devices, sound effects devices, or office appliances.

As shown in Figures, an alternative mode of the fifth preferred embodiment of the present invention is illustrated, wherein the structural configuration thereof is same with the structure of the fifth preferred embodiment, except that in this embodiment, the first and second magnet conductive panels 1442E of the magnet assembly 144E is integrally formed with the first and second magnet conductive arms 14912E, 14922E of the pivot arrangement 149E respectively. The first and second magnet conductive panels 1442E and the first and second magnet conductive arms 14912E, 14922E of the pivot arrangement 149E are made of same material, such as the iron core material or other suitable alloy material, such that the integrally formed structure of the first and second magnet conductive panels 1442E and the first and second magnet conductive arms 1442E, 14922E is able to provide a better magnet conduction effect.

According to the preferred embodiments, the present invention provides the following advantages:

(1) The structural configuration is simple and reliable.

(2) The micro generators are independently operated by the corresponding switch panel to simplify the overall structure for mass production.

(3) The service life of the present invention is prolonged and the maintenance cost thereof is minimized.

(4) The present invention is a battery-less self-powered unit, such that the present invention does not require any battery replacement to minimize the pollution from the battery.

(5) The present invention does not require any wall wiring structure or wire protective sleeve to minimize the material cost related to the installation.

(6) The present invention can be operated without any moisture or explosion problem.

(7) The operation of the present invention is safer than that of the conventional wire-type switch.

(8) The time for installation of the present invention can be significantly shortened to reduce the installation cost thereof.

(9) The present invention can be selectively installed at any surface and can be changed its location at any time. It is worth mentioning that no wire running groove is required for pre-forming in the wall.

(10) The operation of the present invention is the same as that of the conventional wire-type switch via the switch panel.

(11) The present invention can be used to incorporate with any new electronic device or old electronic device as long as the electronic device can receive the wireless control signal from the present invention. Therefore, the invention is reliable, safe, and convenient with a remote switch, and can be widely used in everyday life.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A self-powered switch, comprising:
a control panel arranged to generate a wireless control signal;
a switch panel arranged to be actuated to generate a mechanical energy;
a micro generator operatively linked to said switch panel, wherein said micro generator comprises a magnet assembly and a coil assembly which are arranged to be moved in relation to each other to transform said mechanical energy into an electrical energy for powering said control panel so as to activate said control panel in a battery-less manner; and
an elastic element, wherein said magnet assembly comprises a permanent magnet and two magnet conductive panels provided at two opposite sides of said permanent magnet to form two opposite magnetic poles thereof, wherein said coil assembly comprise a coil core and a magnetic coil wound around said coil core, wherein said micro generator further comprises a resilient element coupled to said core coil, wherein said core coil is contacted to one of said magnet conductive panels, and said magnetic coil is linked to said control panel, wherein when said switch panel is pressed, said switch panel is arranged to move said magnet assembly and to contact with said another magnet conductive panel via said deformation and restoring of said resilient element, such that an induced current is generated in said magnetic coil for powering and activating said control panel to generate said wireless control signal, wherein said magnet assembly is supported at said elastic element, wherein when said switch panel is pressed, said magnet assembly is biased against said elastic element to deform said elastic element, and said elastic element restores to return said magnet assembly and said switch panel back to initial form, such that said switch panel forms an suspended panel.

2. The self-powered wireless switch, as recited in claim 1, wherein said magnet assembly further comprises a plastic outer supportive frame to receive said permanent magnet and said magnet conductive panels, wherein said elastic element is embodied as a compression spring, and two ends thereof are respectively mounted at said outer supportive frame and said supporting panel.

3. The self-powered wireless switch, as recited in claim 2, wherein said control panel comprises a MCU, operatively linked to a power storage, a rectifier and a signal generator of said control panel, wherein said power storage stores said electrical energy of said induced current generated by said magnetic coil to power said signal generator after being regulated by said rectifier, and said signal generator is arranged to transmit said wireless control signal.

4. A self-powered switch, comprising:
a control panel arranged to generate a wireless control signal;

a switch panel arranged to be actuated to generate a mechanical energy; and a micro generator operatively linked to said switch panel, wherein said micro generator comprises a magnet assembly and a coil assembly which are arranged to be moved in relation to each other to transform said mechanical energy into an electrical energy for powering said control panel so as to activate said control panel in a battery-less manner, wherein said magnet assembly comprises a permanent magnet and two magnet conductive panels provided at two opposite sides of said permanent magnet to form two opposite magnetic poles thereof, wherein said coil assembly further comprises a coil core and a magnetic coil wound around said coil core, wherein said micro generator further comprises a resilient element and a swinging arm, wherein said resilient element is coupled to said coil core, and said swinging arm is coupled to said resilient element; wherein said coil core is contacted with one of said magnet conductive panels and said magnetic coil is electrically linked to said control panel, wherein when said switch panel is pressed, said switch panel is arranged to drive said swinging arm to move and to contact said coil core with another magnet conductive panel via said deformation and restoring of said resilient element, such that an induced current is generated in said magnetic coil for powering said control panel to electrically actuate said control panel to generate said wireless control signal.

5. The self-powered wireless switch, as recited in claim 4, wherein said switch panel comprises one or more base panels, wherein each base panel comprises a base panel body forming said pressing panel and an engaging portion extended from said bottom side of said base panel body, wherein said engaging portion is coupled with said swinging arm.

6. The self-powered wireless switch, as recited in claim 5, wherein said supporting panel further comprises a base panel body and a pivot portion protrudedly extended from said base panel body, wherein said pivot portion is located between each two adjacent posts and arranged to support said core cover, wherein said coil core is pivotally moved with respect to said pivot portion to contact said two magnet conductive panels in an alternating manner.

7. A self-powered switch, comprising:

a control panel arranged to generate a wireless control signal;

a switch panel arranged to be actuated to generate a mechanical energy; and a micro generator operatively linked to said switch panel, wherein said micro generator comprises a magnet assembly and a coil assembly which are arranged to be moved in relation to each other to transform said mechanical energy into an electrical energy for powering said control panel so as to activate said control panel in a battery-less manner, wherein said magnet assembly comprises a permanent magnet and two magnet conductive panels provided at two opposite sides of said permanent magnet to form two opposite magnetic poles thereof, wherein said coil assembly comprises a coil core and a magnetic coil wound around said coil core, wherein said micro generator further comprise a resilient element, a swinging arm and a pivot arrangement, wherein said resilient element is coupled to said coil core and said swinging arm is coupled to said resilient element, wherein an opening is formed at said pivot arrangement for allowing said coil core pass through to contact with one of said magnet conductive panels, wherein said pivot arrangement defines two swinging pivot point for said coil core at two sides of said opening, wherein said coil core is contacted with one of said magnet conductive panels said and said magnetic coil is electrically linked to said control panel, wherein when said switch panel is pressed, said switch panel drives said swinging arm to move and to contact said coil core with another magnet conductive panel via said deformation and restoring of said resilient element, such that an induced current is generated in said magnetic coil for powering said control panel to electrically actuate said control panel to generate said wireless control signal.

8. The self-powered wireless switch, as recited in claim 7, wherein said pivot arrangement comprises a first pivot member and a second pivot member spaced with said first pivot member to form said opening therebetween, wherein said first and second pivot members are located at two opposite sides of said coil core to provide two swinging pivot points.

9. The self-powered wireless switch, as recited in claim 8, wherein said pivot arrangement comprises a first magnet conductive arm and a second magnet conductive arm which are respectively transversely extended from said first and second pivot members, wherein said magnet assembly is located between said first and second magnet conductive arms.

10. The self-powered wireless switch, as recited in claim 8, wherein said pivot arrangement comprises a first magnet conductive arm and a second magnet conductive arm which are respectively transversely extended from said first and second pivot members, wherein said two magnet conductive panels are respectively integrally formed with said first and second magnet conductive arms.

11. The self-powered wireless switch, as recited in claim 10, further comprising a supporting panel and a top cover, wherein said top cover comprises at least a cover member mounted at said supporting panel to form a housing to house said micro generator, wherein an opening is formed at one end of said housing for allowing said switch panel to coupled with said swinging arm via said opening.

12. The self-powered wireless switch as recited in claim 8, wherein each of said two magnet conductive panels of said magnet assembly has a protrusion portion extended out of said permanent magnet to form a magnetic cavity between said two protrusion portion, wherein said coil core comprises a core arm, and a distal end of said core arm is disposed within said magnetic cavity to contact with inner sides of said two magnet conductive panels in an alternating manner.

13. A self-powered switch, comprising:

a control panel arranged to generate a wireless control signal;

a switch panel arranged to be actuated to generate a mechanical energy; and a micro generator operatively linked to said switch panel, wherein said micro generator comprises a magnet assembly and a coil assembly which are arranged to be moved in relation to each other to transform said mechanical energy into an electrical energy for powering said control panel so as to activate said control panel in a battery-less manner, wherein said magnet assembly comprises a permanent magnet and two magnet conductive panels provided at two opposite sides of said permanent magnet to form two opposite magnetic poles thereof, wherein said coil assembly comprise a coil core and a magnetic coil wound around said coil core, wherein said micro generator further comprises a resilient element coupled to said core coil, wherein said core coil is contacted to one of said magnet conductive panels, and said magnetic coil is linked to said control panel, wherein when said switch panel is pressed, said switch panel is arranged to move said magnet assembly and to contact with said another magnet conductive panel via said deformation and restoring of said resilient element, such that an induced current is generated in said magnetic coil for powering and activating said control panel to generate said wireless control signal, wherein at a non-operational position, said coil core is contacted with one of said magnet conductive panels at a bottom side of said magnet assembly, and when said switch panel is pressed, said coil core is driven to move from said lower magnet conductive panel to contact with another magnet conductive panel at a top side of said magnet assembly.

14. A method for controlling an electronic device via a self-powered wireless switch, wherein said self-powered switch comprises a micro generator comprising a magnet assembly and a coil assembly, wherein said magnet assembly comprises a permanent magnet, and a first magnet conductive panel and a second magnet conductive panel, which have opposite magnetic poles, located at two sides of said permanent magnet, wherein said coil assembly comprises a coil core comprising a core arm, a magnetic coil wound at said core arm of said coil core, and a resilient element affixed to said coil core, wherein said method comprises said steps of: in case of a switch panel of said self-powered wireless switch being pressed to actuate said micro generator, contacting said core arm of said micro generator with said first and second magnet conductive panels of said magnet assembly in an alternating manner; and generating electrical energy by said micro generator for powering a control panel of said self-powered wireless switch to control an pre-programmed operation of the electronic device, wherein said method comprises the steps of: (a) in responsive to a pressing action applied on a base panel of said switch panel, actuating said base panel to move said pusher arm, wherein said pusher arm actuates said magnet assembly to move and said coil core is moved by said first magnet conductive panel via said magnetic attraction force formed therebetween, such that said resilient element is bent and deformed to store a resilient potential energy and generate a rebounding force; (b) when said rebounding force is greater than a magnetic attraction force between said first magnet conductive panel and said coil core, restoring said resilient element to its original form to actuate said coil core to detach from said first magnet conductive panel and to contact with said second magnet conductive panel, such that a magnetic induction line penetrating through said coil core is oppositely changed and said magnetic coil generates an induced current correspondingly; and (c) transmitting a control signal to the electronic device by said wireless signal generator of said control panel powered by said induced current after being stored and regulated, to further control said pre-programmed operation of the electronic device, wherein said method further comprises the steps of: (I) in responsive to said pressing action on a top surface of said base panel of said switch panel at a position which is away from a positioning portion, actuating said swinging arm to move via the movement of said positioning portion, such that said resilient element is deformed to generate said rebounding force; (II) when said rebounding force is greater than said magnetic attraction force between said first magnet conductive panel and said coil core, restoring said resilient element to its original form and actuating said coil core to detach from said first magnet conductive panel and to contact with said lower second magnet conductive panel, such that said magnetic induction line penetrating through said coil core is oppositely changed and said magnetic coil generates an induced current correspondingly for perform an actuation of power generation; (III) in responsive to a pressing action on said top surface of said base panel of said switch panel at a position which is adjacent to said positioning portion, actuating said swinging arm to move via the movement of said positioning portion, such that another rebounding force is generated by an elastic element; and (IV) when said another rebounding force is greater than a magnetic attraction force between said second magnet conductive panel and said coil core, actuating said coil core to detach from said second magnet conductive panel and to contact with said first magnet conductive panel, such that said magnetic induction line penetrating through said coil core is oppositely changed and said magnetic coil generates an induced current correspondingly for perform another actuation of power generation.

15. A self-powered switch, comprising:
a control panel arranged to generate a wireless control signal;
a switch panel arranged to be actuated to generate a mechanical energy; and
a micro generator operatively linked to said switch panel, wherein said micro generator comprises a magnet assembly and a coil assembly which are arranged to be moved in relation to each other to transform said mechanical energy into an electrical energy for powering said control panel so as to activate said control panel in a battery-less manner;
wherein said control panel comprises a signal generator arranged for generating a wireless control signal, an energy storage and a rectifier, wherein said energy storage is operatively connected to said micro generator for storing the electrical energy generated therefrom, wherein said rectifier is operatively connected to said energy storage to regulate a voltage of the electrical energy stored in said energy storage for powering said signal generator, such that said signal generator is powered up for generating the wireless control signal, wherein said energy storage comprises a first capacitor and a second capacitor, wherein said rectifier is operated to repeatedly charge and discharge said energy storage through an inductor to prolong an operation time to larger than 6 ms.

16. The self-powered switch, as recited in claim 15, wherein said magnet assembly comprises a permanent magnet and two magnet conductive panels provided at two opposite sides of said permanent magnet to form two opposite magnetic poles thereof, wherein said coil assembly comprise a coil core and a magnetic coil wound around said coil core, wherein said micro generator further comprises a resilient element coupled to said core coil, wherein said core coil is contacted to one of said magnet conductive panels, and said magnetic coil is linked to said control panel, wherein when said switch panel is pressed, said switch panel is arranged to move said magnet assembly and to contact with said another magnet conductive panel via said deformation and restoring of said resilient element, such that an induced current is generated in said magnetic coil for powering and activating said control panel to generate said wireless control signal.

17. The self-powered switch, as recited in claim 16, further comprising an elastic element, wherein said magnet assembly is supported at said elastic element, wherein when said switch panel is pressed, said magnet assembly is biased against said elastic element to deform said elastic element, and said elastic element restores to return said magnet assembly and said switch panel back to initial form, such that said switch panel forms a balanced and suspended panel.

\* \* \* \* \*